US012720823B2

(12) United States Patent
Chuang et al.

(10) Patent No.: US 12,720,823 B2
(45) Date of Patent: Aug. 25, 2026

(54) TRANSISTOR SOURCE/DRAIN REGIONS AND METHODS OF FORMING THE SAME

(71) Applicant: Taiwan Semiconductor Manufacturing Co., Ltd., Hsinchu (TW)

(72) Inventors: Tsung-Han Chuang, Tainan City (TW); Zhi-Chang Lin, Zhubei City (TW); Shih-Cheng Chen, New Taipei City (TW); Jung-Hung Chang, Yuanlin City (TW); Chien Ning Yao, Hsinchu (TW); Kai-Lin Chuang, Chia-Yi City (TW); Kuo-Cheng Chiang, Zhubei City (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 716 days.

(21) Appl. No.: 18/150,524

(22) Filed: Jan. 5, 2023

(65) Prior Publication Data

US 2023/0420520 A1 Dec. 28, 2023

Related U.S. Application Data

(60) Provisional application No. 63/416,271, filed on Oct. 14, 2022, provisional application No. 63/366,785, filed on Jun. 22, 2022.

(51) Int. Cl.

| | |
|---|---|
| *H10D 62/13* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10P 14/20* | (2026.01) |

(52) U.S. Cl.

CPC ......... *H10D 62/151* (2025.01); *H10D 30/014* (2025.01); *H10D 30/43* (2025.01); *H10D 30/6735* (2025.01); *H10D 62/121* (2025.01); *H10P 14/271* (2026.01); *H10P 14/3411* (2026.01)

(58) Field of Classification Search

CPC .... H10D 62/151; H10D 30/014; H10D 30/43; H10D 30/6735; H10D 62/121; H10D 30/6757; H01L 21/02532; H01L 21/02639

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — Jacob Y Choi
*Assistant Examiner* — Aaron Michael Wegner
(74) *Attorney, Agent, or Firm* — Slater Matsil, LLP

(57) ABSTRACT

In an embodiment, a device includes: first nanostructures; a first undoped semiconductor layer contacting a first dummy region of the first nanostructures; a first spacer on the first undoped semiconductor layer; a first source/drain region on the first spacer, the first source/drain region contacting a first channel region of the first nanostructures; and a first gate structure wrapped around the first channel region and the first dummy region of the first nanostructures.

20 Claims, 74 Drawing Sheets

(56) References Cited

U.S. PATENT DOCUMENTS

| | | | |
|---|---|---|---|
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0221638 | A1* | 7/2019 | Reznicek ........... H10D 30/6212 |
| 2019/0221640 | A1* | 7/2019 | Reznicek ........... H10D 30/0323 |
| 2020/0176326 | A1* | 6/2020 | Liao .................. H01L 21/30625 |
| 2020/0303521 | A1* | 9/2020 | Son ...................... H10D 62/121 |
| 2021/0134677 | A1 | 5/2021 | Pan et al. |
| 2021/0296315 | A1 | 9/2021 | Lilak et al. |
| 2022/0108981 | A1 | 4/2022 | Hwang et al. |
| 2022/0131014 | A1 | 4/2022 | Lai et al. |

* cited by examiner

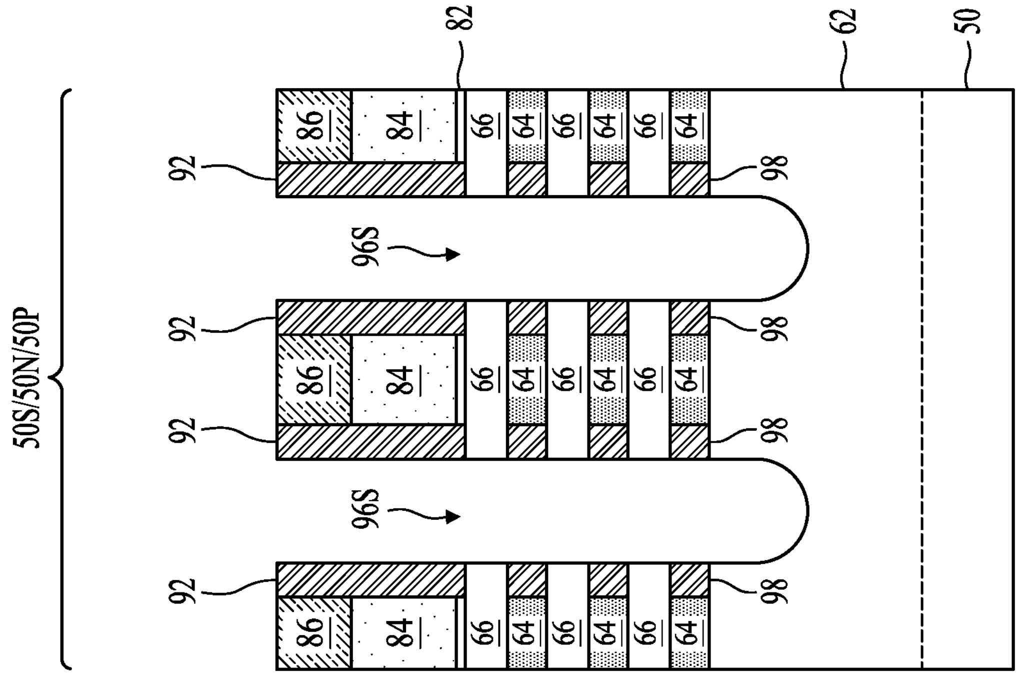
Figure 10A
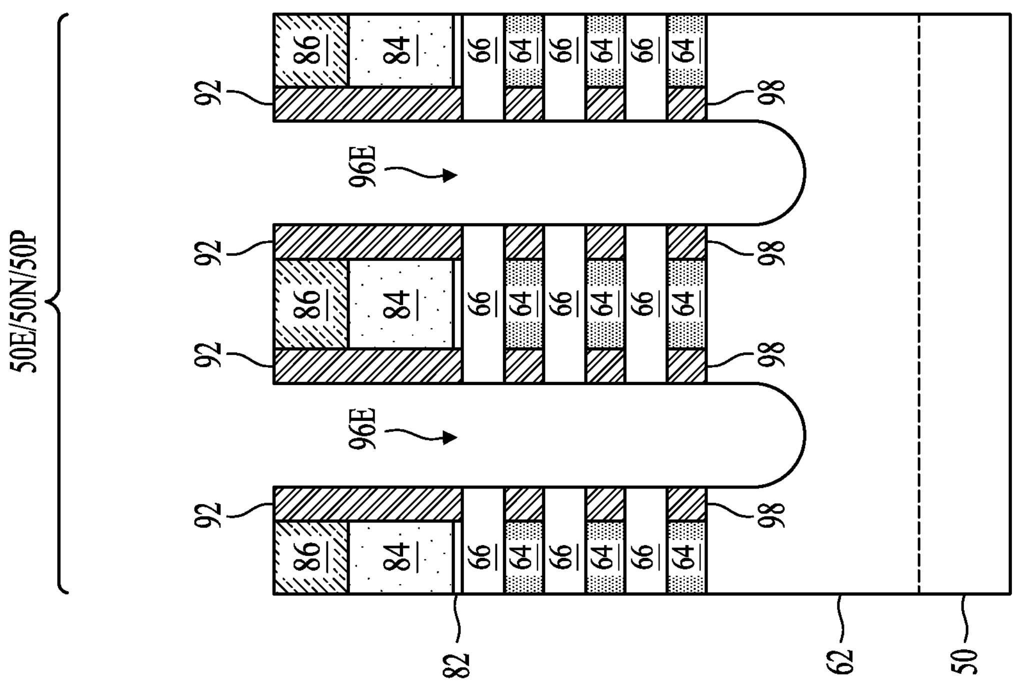

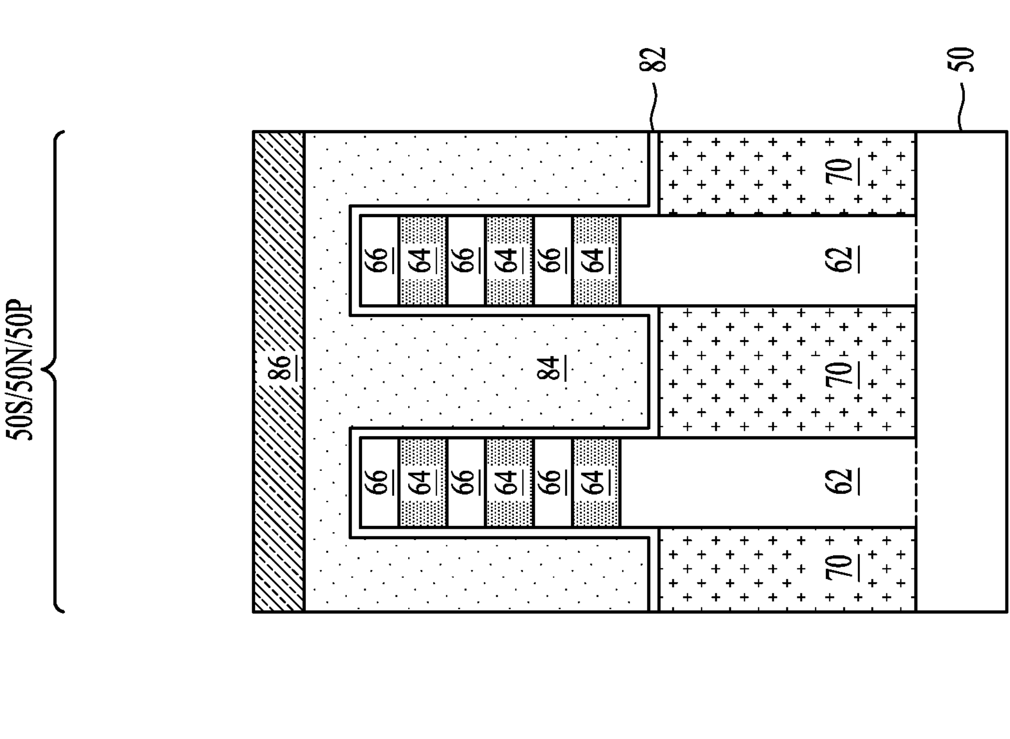
Figure 15C
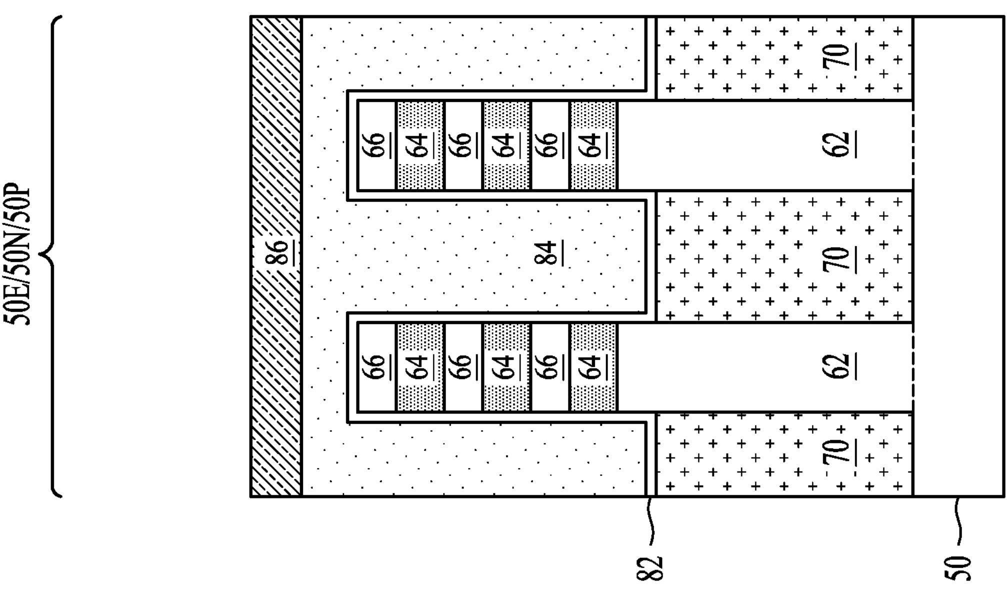

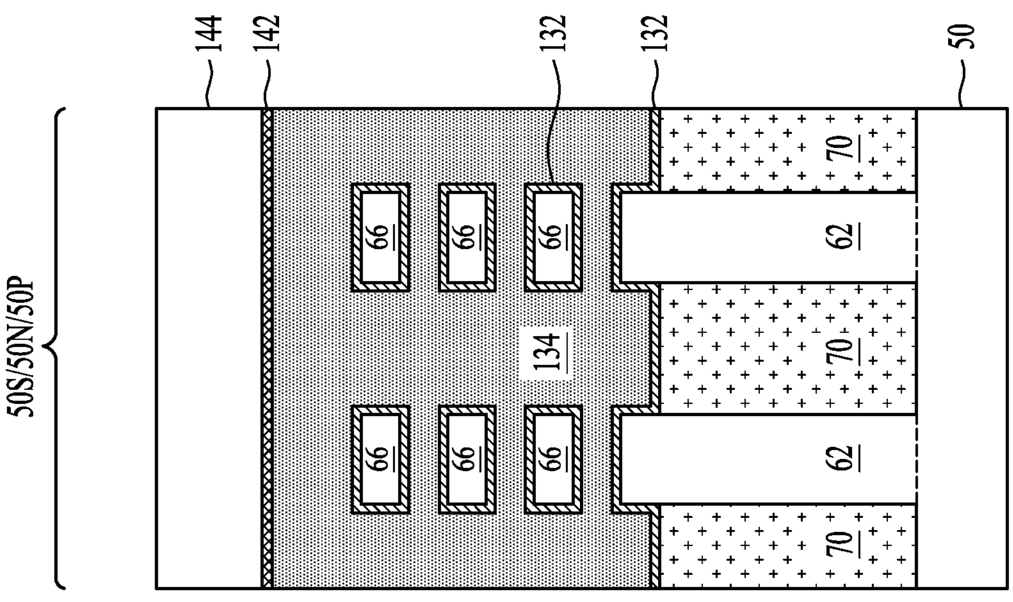
Figure 25C
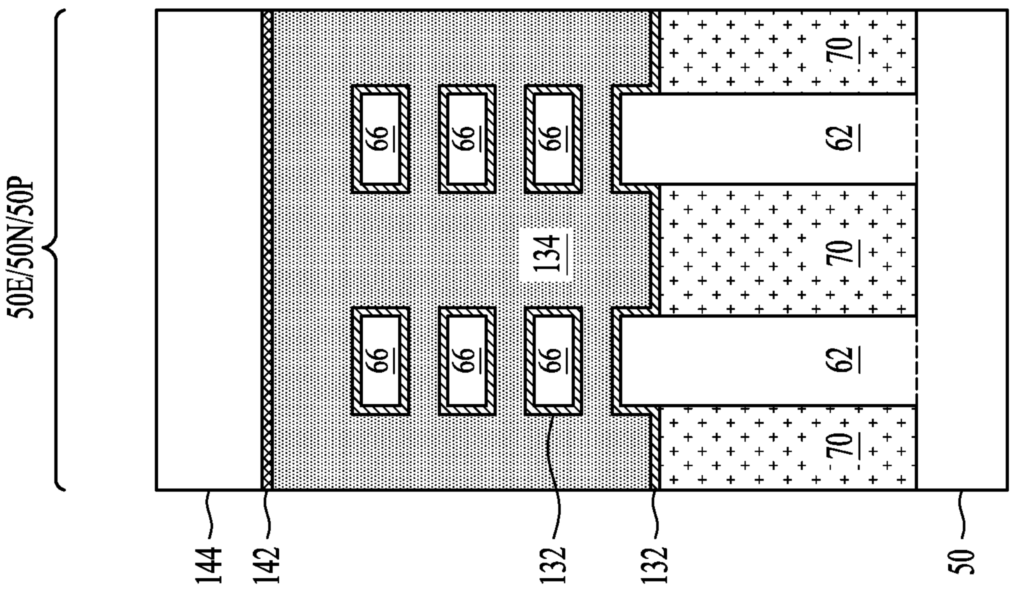

TRANSISTOR SOURCE/DRAIN REGIONS AND METHODS OF FORMING THE SAME

PRIORITY CLAIM AND CROSS-REFERENCE

This application claims the benefit of U.S. Provisional Application No. 63/416,271, filed on Oct. 14, 2022 and U.S. Provisional Application No. 63/366,785, filed on Jun. 22, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
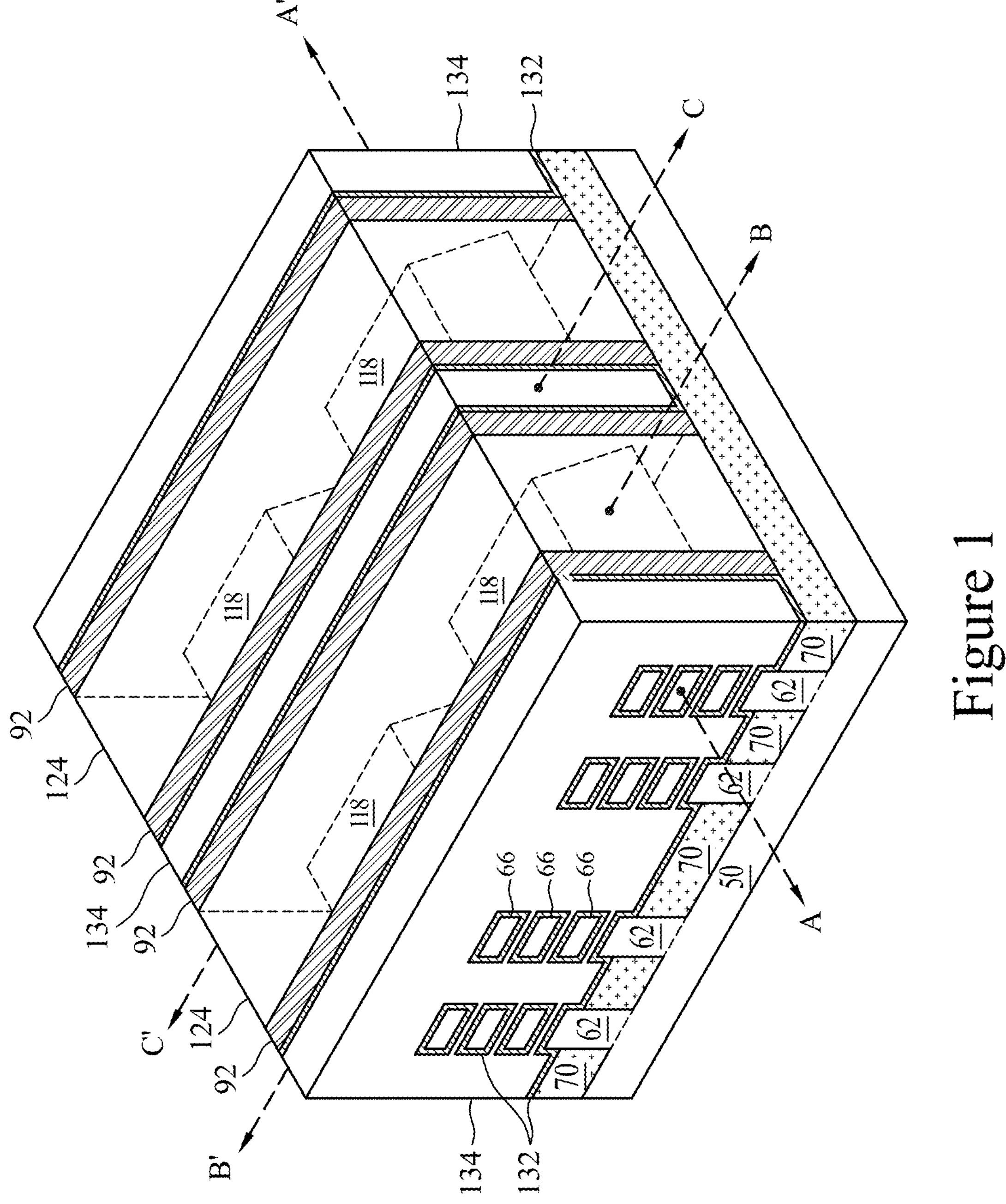
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, nanostructure-FETs include source/drain regions of varying heights. Some of the source/drain regions contact more adjacent nanostructures than others of the source/drain regions. As such, the devices formed in a first region have a different quantity of channel regions than the devices formed in a second region. The devices in the different regions have different effective work functions, which may be advantageous for balancing performance and efficiency. Because the effective work functions of the devices may be controlled based on the height of the source/drain regions, the nanostructures of the devices may have the same dimensions. Accordingly, pattern loading effects may be avoided during processing, which can improve the manufacturing yield of the resulting devices.

FIG. 1 illustrates an example of nanostructure-FETs (e.g., nanowire FETs, nanosheet FETs, multi bridge channel (MBC) FETs, nanoribbon FETs, gate-all-around (GAA) FETs, or the like), in accordance with some embodiments. FIG. 1 is a three-dimensional view, where some features of the nanostructure-FETs are omitted for illustration clarity.

The nanostructure-FETs include nanostructures 66 (e.g., nano sheets, nanowires, or the like) over fins 62 on a substrate 50 (e.g., a semiconductor substrate), with the nanostructures 66 being semiconductor features that act as channel regions for the nanostructure-FETs. Isolation regions 70, such as shallow trench isolation (STI) regions, are disposed between adjacent fins 62, which may protrude above and from between neighboring isolation regions 70. The nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may comprise a single material or a plurality of materials. In this context, the fins 62 refer to the portion extending between the neighboring isolation regions 70.

Gate dielectrics 132 are over top surfaces of the fins 62 and along top surfaces, sidewalls, and bottom surfaces of the nanostructures 66. Gate electrodes 134 are over the gate dielectrics 132. Source/drain regions 118 are disposed on the fins 62 at opposing sides of the gate dielectrics 132 and the gate electrodes 134. Source/drain region(s) 118 may refer to a source or a drain, individually or collectively dependent upon the context. An inter-layer dielectric (ILD) 124 is formed over the source/drain regions 118. Contacts (subsequently described) to the source/drain regions 118 will be formed through the ILD 124. The source/drain regions 118 may be shared between various nanostructures 66. For example, adjacent source/drain regions 118 may be electrically connected, such as through coalescing the source/drain regions 118 by epitaxial growth, or through coupling the source/drain regions 118 with a same contact.

FIG. 1 further illustrates reference cross-sections that are used in later figures. Cross-section A-A' is along a longitudinal axis of a fin 62 of a nanostructure-FET and in a direction of, for example, a current flow between the source/drain regions 118 of the nanostructure-FET. Cross-section B-B' is perpendicular to cross-section A-A' and extends through source/drain regions 118 of the nanostructure-FETs. Cross-section C-C' is parallel to cross-section B-B' and along a longitudinal axis of a gate electrode 134. Subsequent figures refer to these reference cross-sections for clarity.

Some embodiments discussed herein are discussed in the context of nanostructure-FETs formed using a gate-last process. In other embodiments, a gate-first process may be used. Also, some embodiments contemplate aspects used in planar devices, such as planar FETs, or in fin field-effect transistors (FinFETs), in lieu of or in combination with the nanostructure-FETs. For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-26C are views of intermediate stages in the manufacturing of nanostructure-FETs, in accordance with some embodiments. FIGS. 2, 3, 4, 5, 6, and 7 are three-dimensional views showing a similar three-dimensional view as FIG. 1. FIGS. 8A, 9A, 10A, 11A, 12A, 13A, 14A, 15A, 16A, 17A, 20A, 20B, 21A, 22A, 23A, 24A, 25A, and 26A illustrate cross-sectional views along a similar cross-section as reference cross-section A-A' in FIG. 1. FIGS. 8B, 9B, 10B, 11B, 12B, 13B, 14B, 16B, 17B, 18, 19, 21B, 22B, 23B, 24B, 25B, and 26B illustrate cross-sectional views along a similar cross-section as reference cross-section B-B' in FIG. 1. FIGS. 8C, 9C, 10C, 11C, 12C, 13C, 14C, 15C, 16C, 17C, 21C, 22C, 23C, 24C, 25C, and 26C illustrate cross-sectional views along a similar cross-section as reference cross-section C-C' in FIG. 1.

Figure 2:
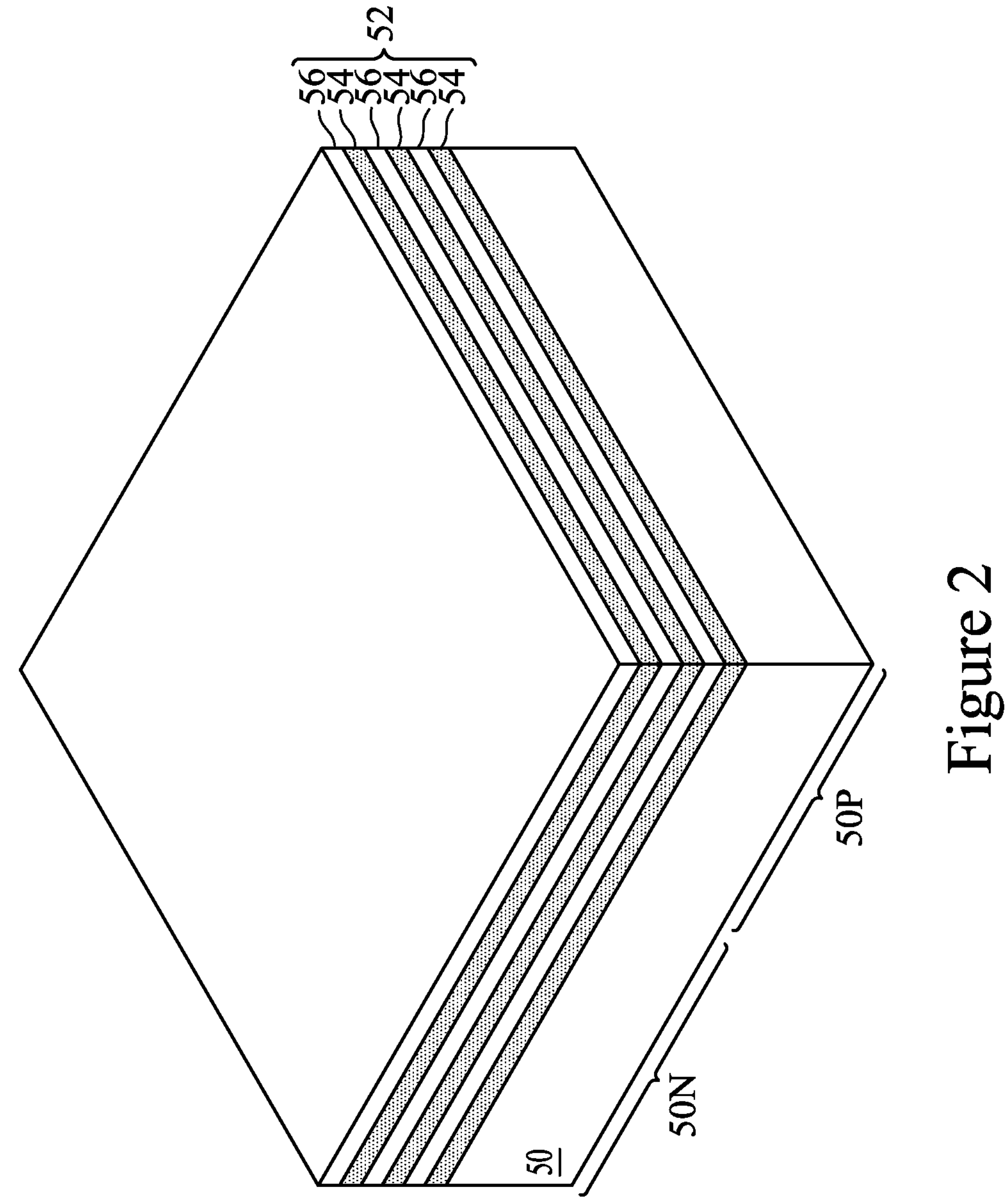
FIGS. 2-26C are views of intermediate stages in the manufacturing of nanostructure-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may (or may not) be physically separated (not separately illustrated) from the p-type region and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50.

In the illustrated embodiment, and as subsequently described in greater detail, the first semiconductor layers 54 will be removed and the second semiconductor layers 56 will patterned to form channel regions for the nanostructure-FETs in both the n-type region 50N and the p-type region 50P. In such embodiments, the channel regions in both the n-type region 50N and the p-type region 50P may have a same material composition (e.g., silicon or another semiconductor material) and be formed simultaneously. The first semiconductor layers 54 are dummy layers that will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure-FETs in one region (e.g., the p-type region 50P), and the second semiconductor layers 56 will be patterned to form channel regions for nanostructure-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without significantly removing the second semiconductor layers 56 in the n-type region 50N, and the second semiconductor layers 56 may be removed without significantly removing the first semiconductor layers 54 in the p-type region 50P.

The multi-layer stack 52 is illustrated as including three of the first semiconductor layers 54 and three of the second semiconductor layers 56. It should be appreciated that the multi-layer stack 52 may include any number of the first semiconductor layers 54 and the second semiconductor layers 56. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. In some embodiments, some layers of the multi-layer stack 52 are formed to be thinner than other layers of the multi-layer stack 52.

Figure 3:
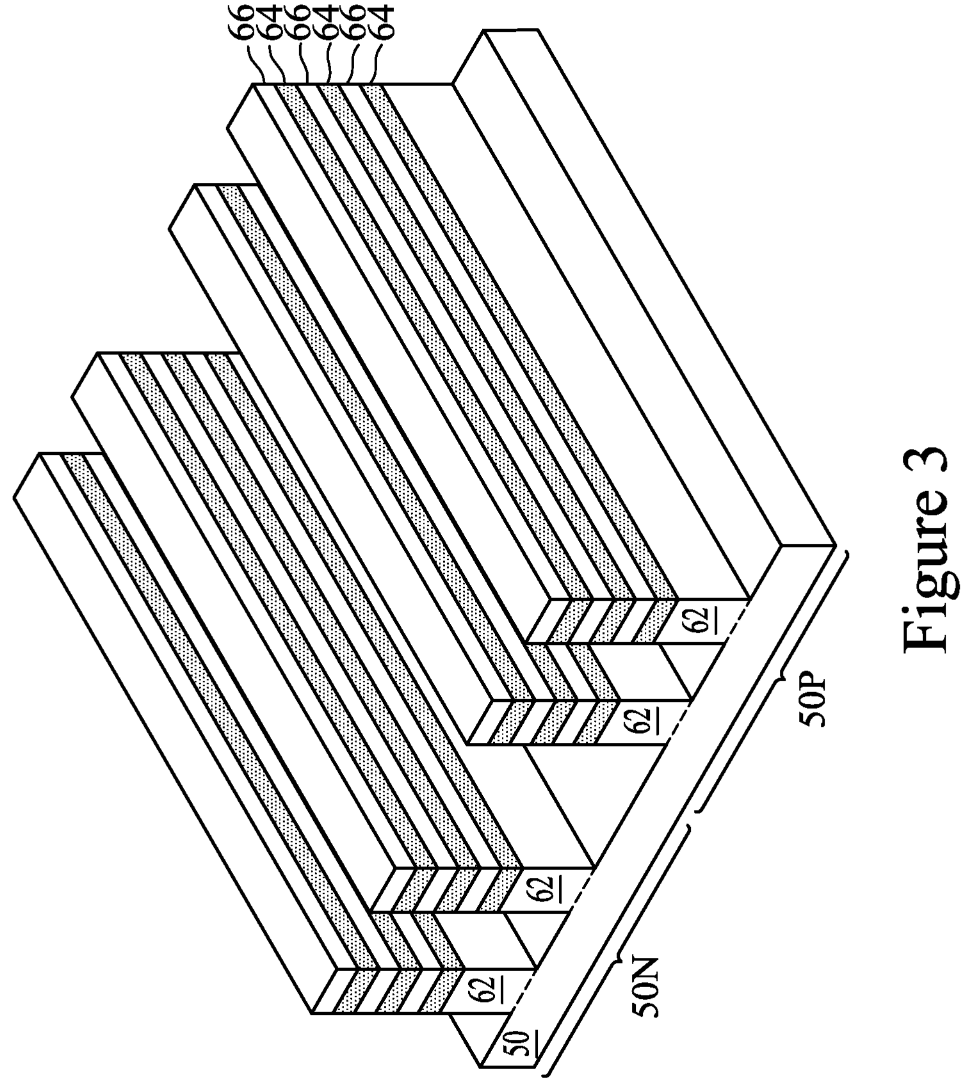

In FIG. 3, fins 62 are formed in the substrate 50 and nanostructures 64, 66 are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may further define first nanostructures 64 from the first semiconductor layers 54 and define second nanostructures 66 from the second semiconductor layers 56.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66.

The fins 62 are illustrated as having substantially equal widths in both the n-type region 50N and the p-type region 50P. In some embodiments, the widths of the fins 62 in the n-type region 50N may be greater or less than the width of the fins 62 in the p-type region 50P. Further, while each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

Figure 4:
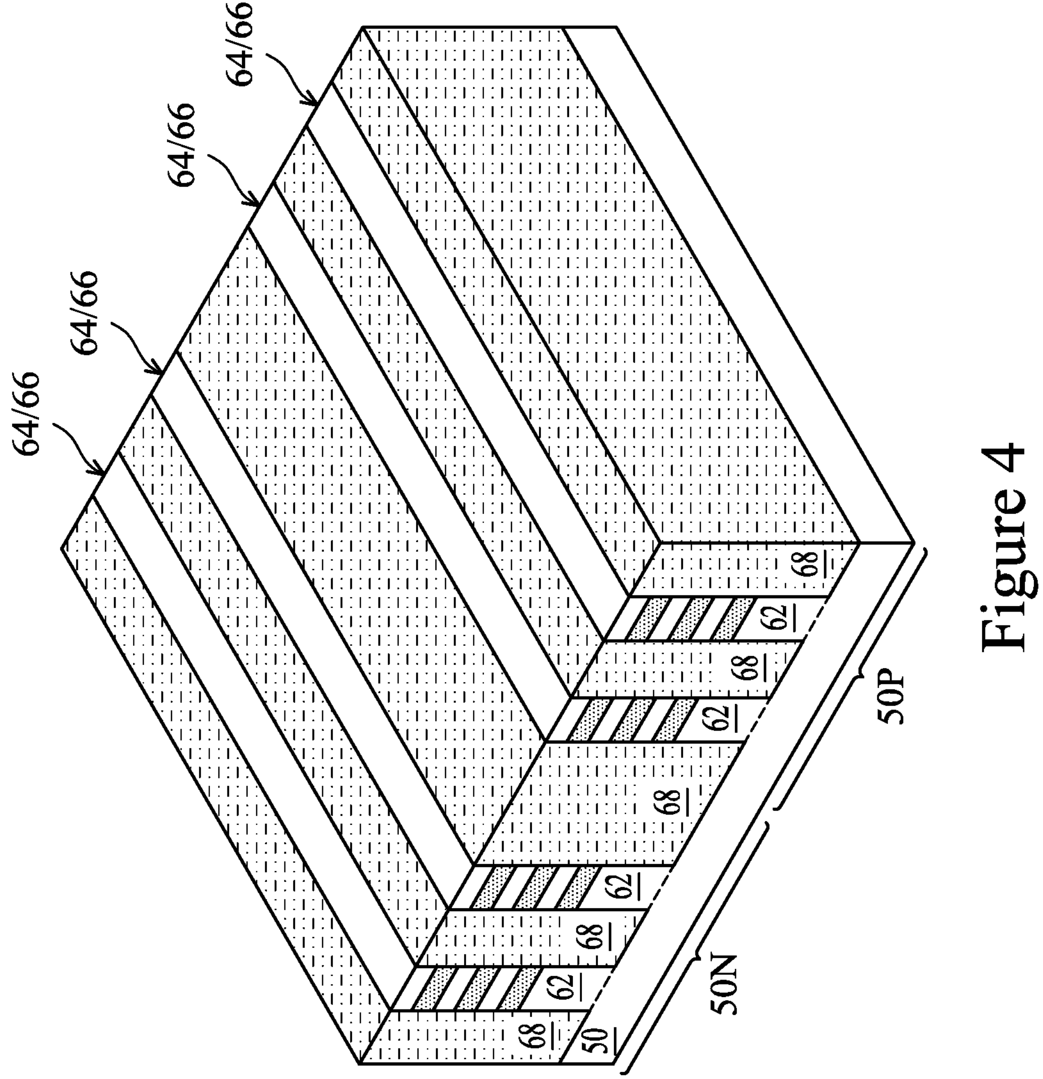

In FIG. 4, an insulation material 68 is formed over the substrate 50 and between adjacent fins 62 and adjacent nanostructures 64, 66. The insulation material 68 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In some embodiments, the insulation material 68 includes silicon oxide formed by an FCVD process. An annealing process may be performed once the insulation material 68 is formed. Although the insulation material 68 is illustrated as a single layer, some embodiments may utilize multiple layers. For example, in some embodiments a liner (not separately illustrated) may first be formed along a surface of the substrate 50, the fins 62, and the nanostructures 64, 66. Thereafter, a fill material, such as one of the previously described insulation materials may be formed over the liner.

The insulation material 68 may be deposited over the fins 62 and nanostructures 64, 66 such that excess insulation material 68 covers the nanostructures 64, 66. A removal process is then applied to the insulation material 68 to remove excess insulation material 68 over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material 68 are level after the planarization process is complete.

Figure 5:
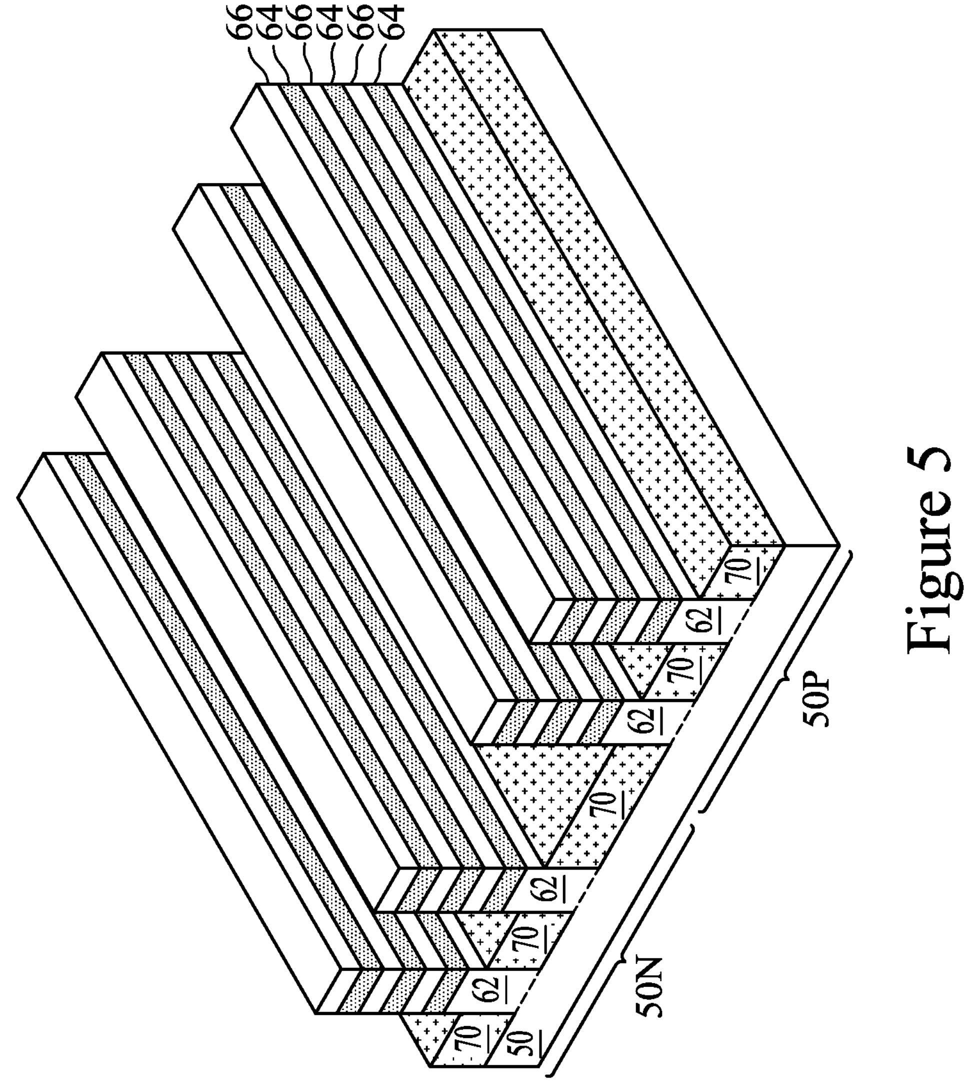

In FIG. 5, the insulation material 68 is recessed to form STI regions 70. The STI regions 70 are adjacent the fins 62. The insulation material 68 is recessed such that upper portions of fins 62 and/or the nanostructures 64, 66 protrude from between neighboring STI regions 70. The upper portions of the fins 62 and/or the nanostructures 64, 66 are above the STI regions 70. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The STI regions 70 may be recessed using an acceptable etching process, such as one that is selective to the material of the insulation material 68 (e.g., etches the material of the insulation material 68 at a faster rate than the materials of the fins 62 and the nanostructures 64, 66). For example, an oxide removal using, for example, dilute hydrofluoric (dHF) acid may be used.

The previously described process is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expo se the underlying substrate Epitaxial structures can be epitaxially grown in the trenches, and the dielectric layer can be recessed such that the epitaxial structures protrude from the dielectric layer to form the fins 62 and/or the nanostructures 64, 66. The epitaxial structures may comprise the previously described alternating semiconductor materials, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the fins 62, the nanostructures 64, 66, and/or the STI regions 70. In embodiments with different well types, different implant steps for the n-type region 50N and the p-type region 50P may be achieved using a photoresist or other mask (not separately illustrated). For example, a photoresist may be formed over the fins 62, the nanostructures 64, 66, and the STI regions 70 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from $10^{13}$ atoms/cm$^3$ to $10^{14}$ atoms/cm$^3$. After the implant, the photoresist is removed, such as by an acceptable ashing process.

Following or prior to the implanting of the p-type region 50P, a photoresist or other mask (not separately illustrated) is formed over the fins 62, the nanostructures 64, 66, and the STI regions 70 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from $10^{13}$ atoms/cm$^3$ to $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 6:
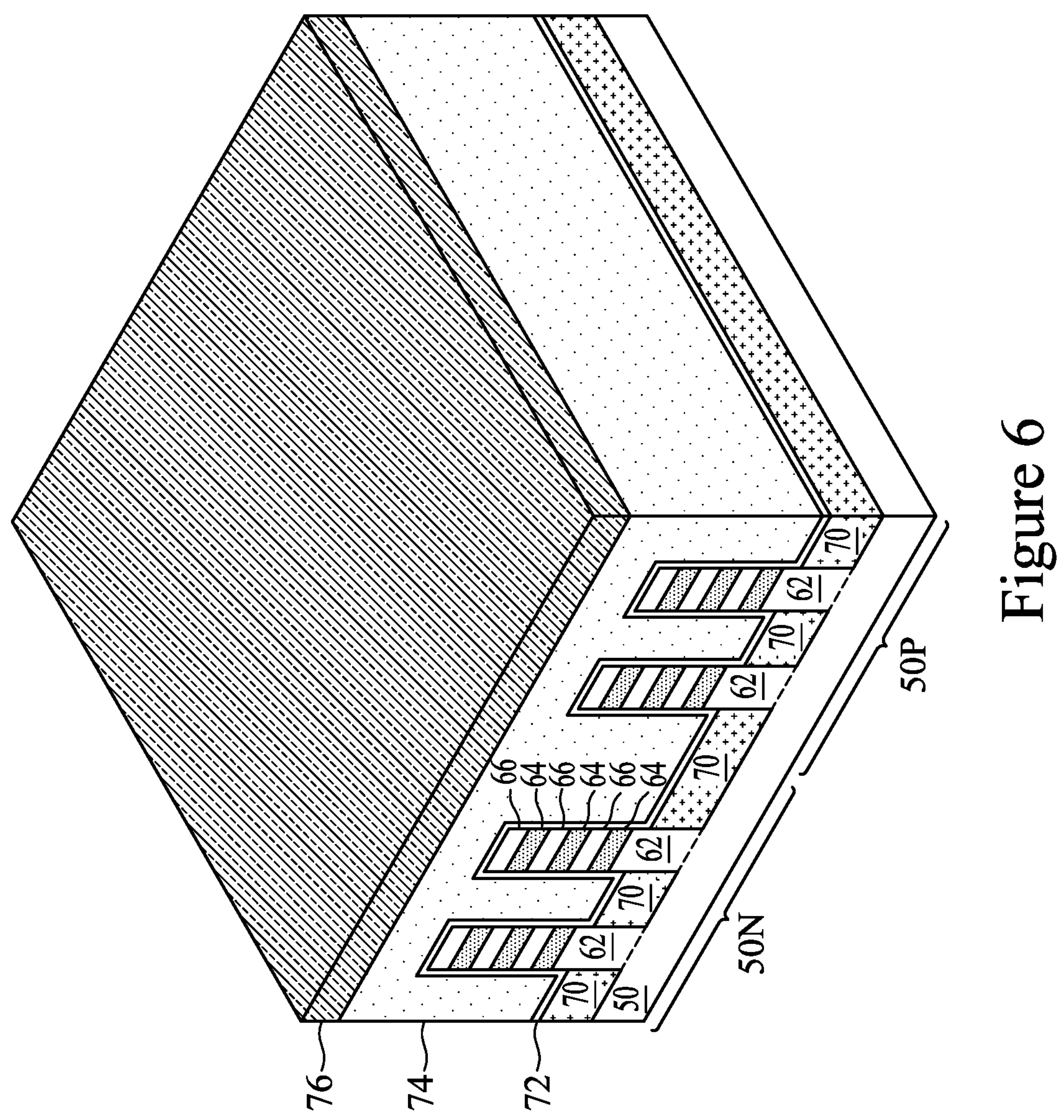

In FIG. 6, a dummy dielectric layer 72 is formed on the fins 62 and/or the nanostructures 64, 66. The dummy dielectric layer 72 may be formed of silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The material of the dummy gate layer 74 may be deposited by CVD, physical vapor deposition (PVD), sputter deposition, or other techniques for depositing the selected material. The dummy gate layer 74 may be formed of other materials that have a high etching selectivity from the etching of insulation materials, e.g., the STI regions and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the STI regions 70, such that the dummy dielectric layer 72 extends between the dummy gate layer 74 and the STI regions 70. In another embodiment, the dummy dielectric layer 72 covers only the fins 62 and/or the nanostructures 64, 66.

Figure 7:
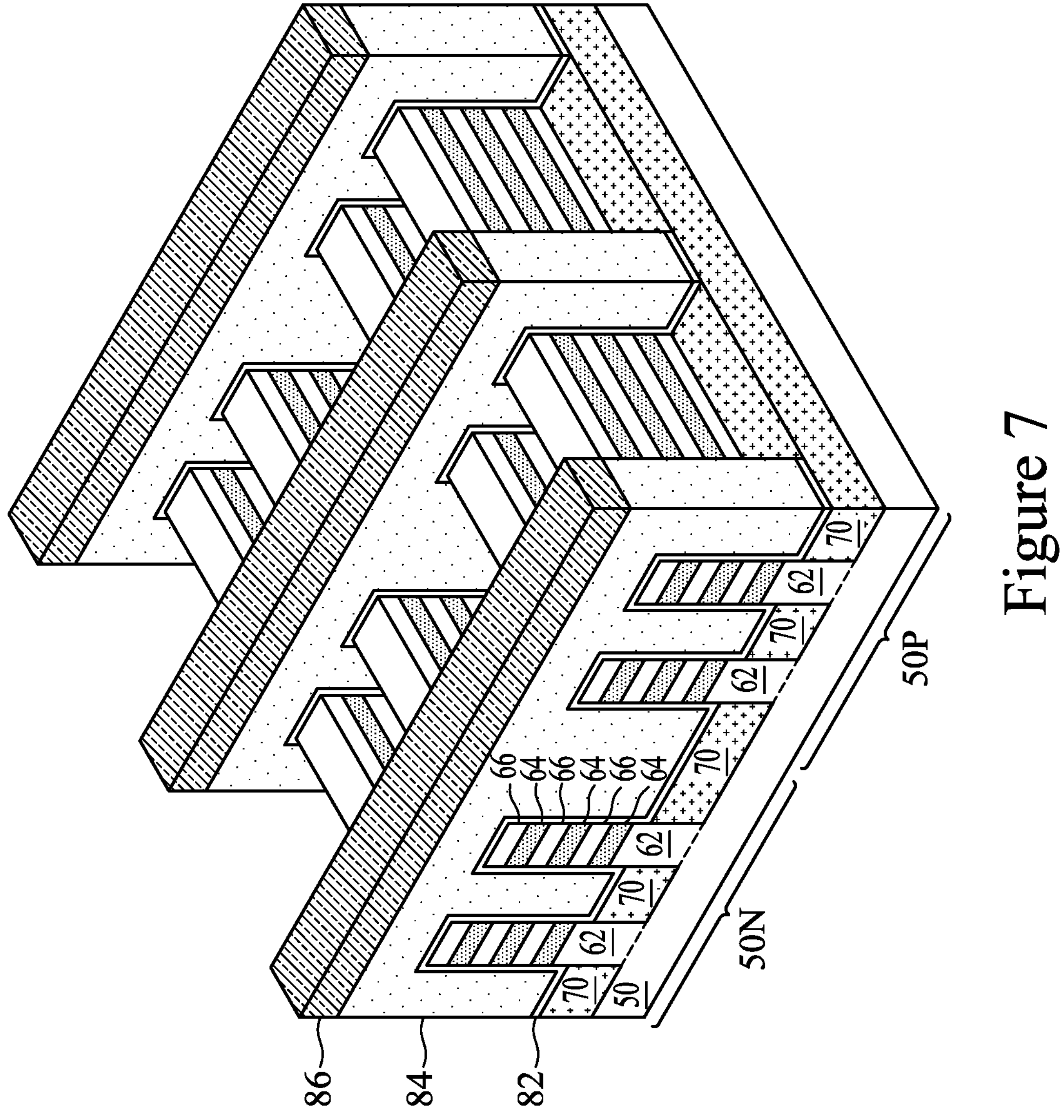

In FIG. 7, the mask layer 76 is patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective fins 62. The masks 86 can optionally be removed after patterning, such as by any acceptable etching technique.

FIGS. 8A-26C illustrate various additional steps in the manufacturing of embodiment devices. FIGS. 8A-17C and 21A-26C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description of each figure.

Additionally, FIGS. 8A-26C illustrate features in a high-efficiency region 50E and a high-speed region 50S. The devices formed in the high-efficiency region 50E will have a small effective work function, and the devices formed in the high-speed region 50S will have a large effective work function. Accordingly, the devices formed in the high-efficiency region 50E have greater power efficiency than the devices formed in the high-speed region 50S, and the devices formed in the high-speed region 50S have greater performance than the devices formed in the high-efficiency region 50E. A same logic cell of an integrated circuit die (a "hybrid logic cell") may include both high-efficiency and high-speed devices. Utilizing hybrid logic cells may allow for more flexible consideration of performance, power efficiency, and cell area when designing the integrated circuit. Each of the high-efficiency region 50E and the high-speed region 50S can include devices from both of the n-type region 50N and the p-type region 50P. In other words, the high-efficiency region 50E and the high-speed region 50S can each include n-type devices and p-type devices.

The nanostructures 64, 66 in the high-efficiency region 50E have the same dimensions (e.g., width and thickness) as the nanostructures 64, 66 in the high-speed region 50S. Accordingly, pattern loading effects, such as during etching processes, may be avoided. Additionally, processing windows may be increased. The manufacturing yield of the resulting devices may thus be improved.

Figure 8A:
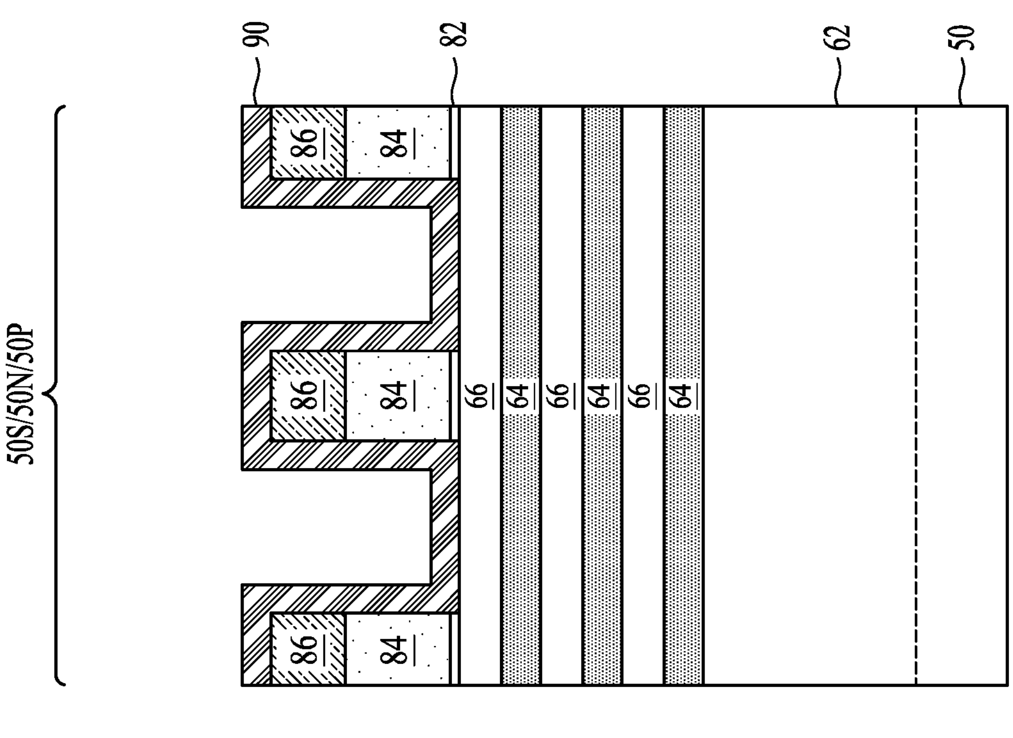
Figure 8A:
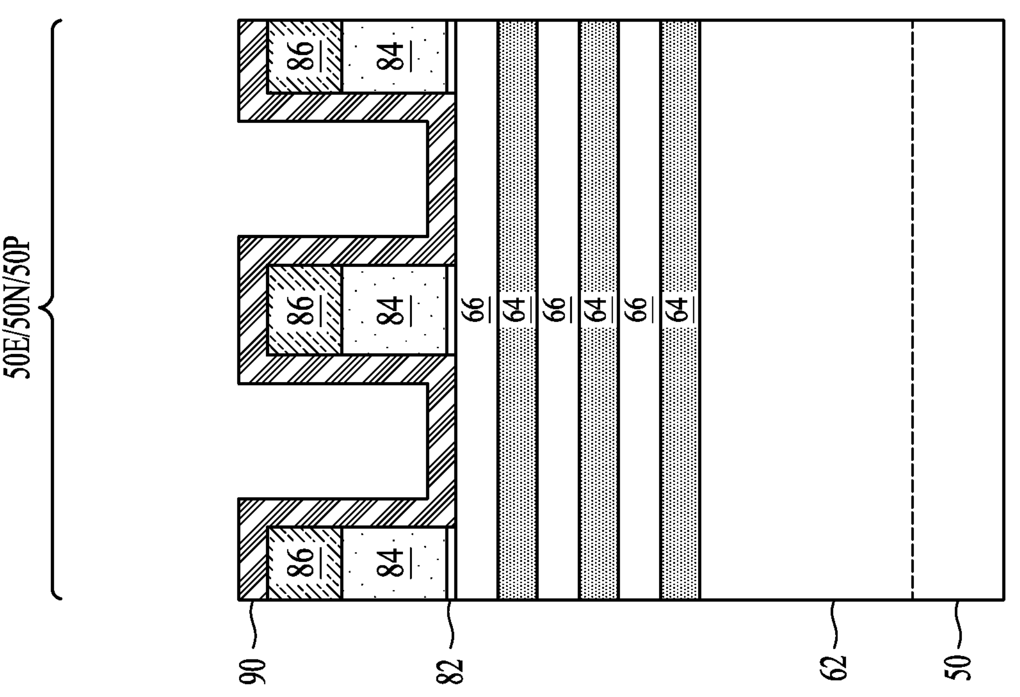
Figure 8B:
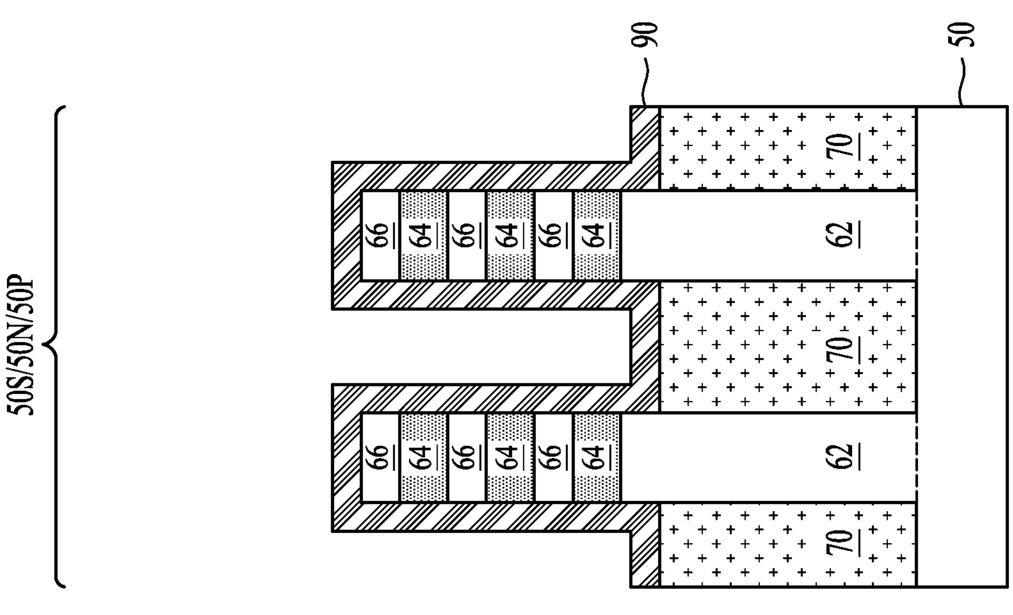
Figure 8B:
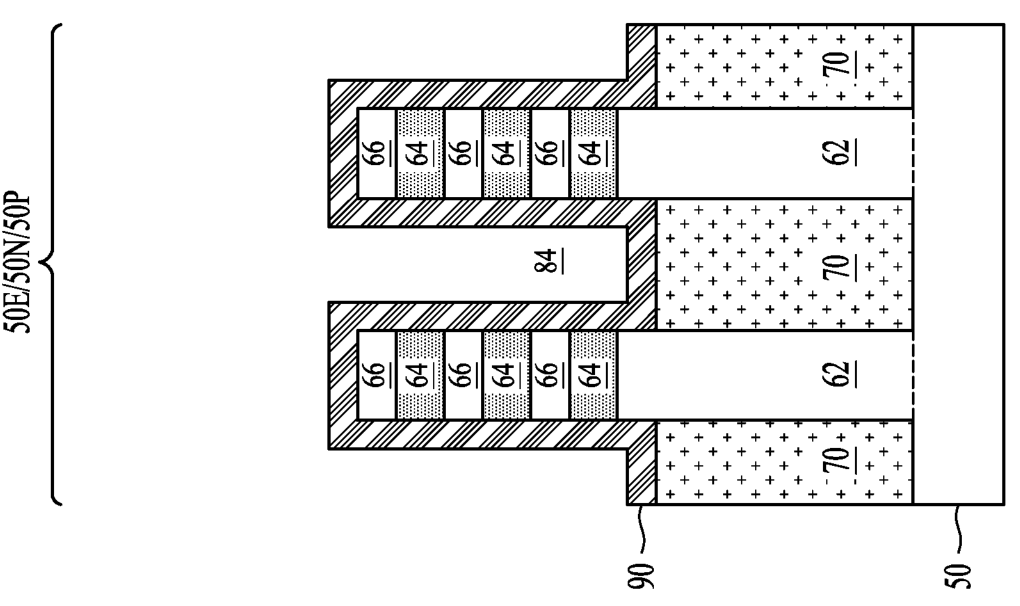
Figure 8C:
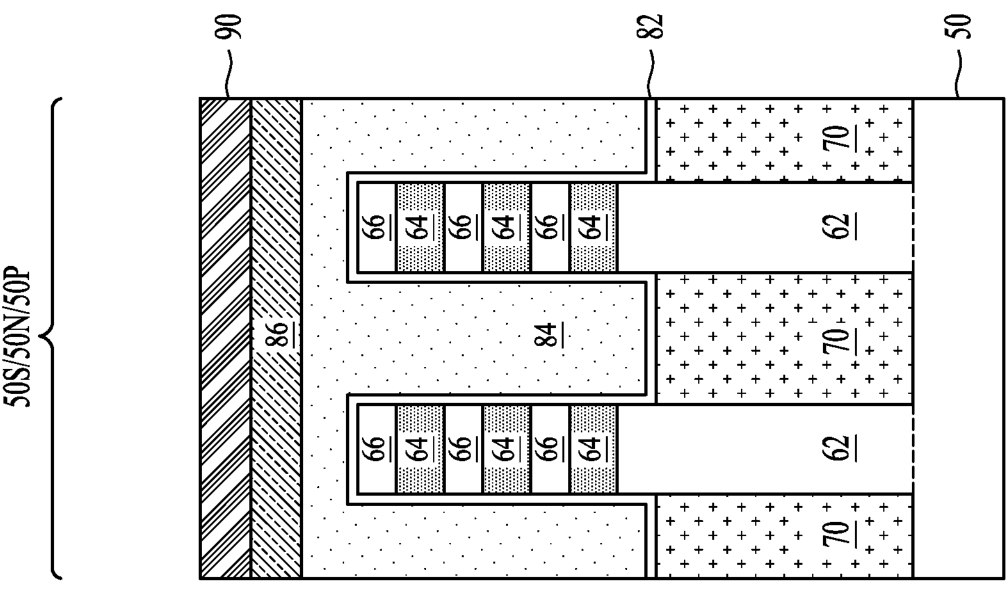
Figure 8C:
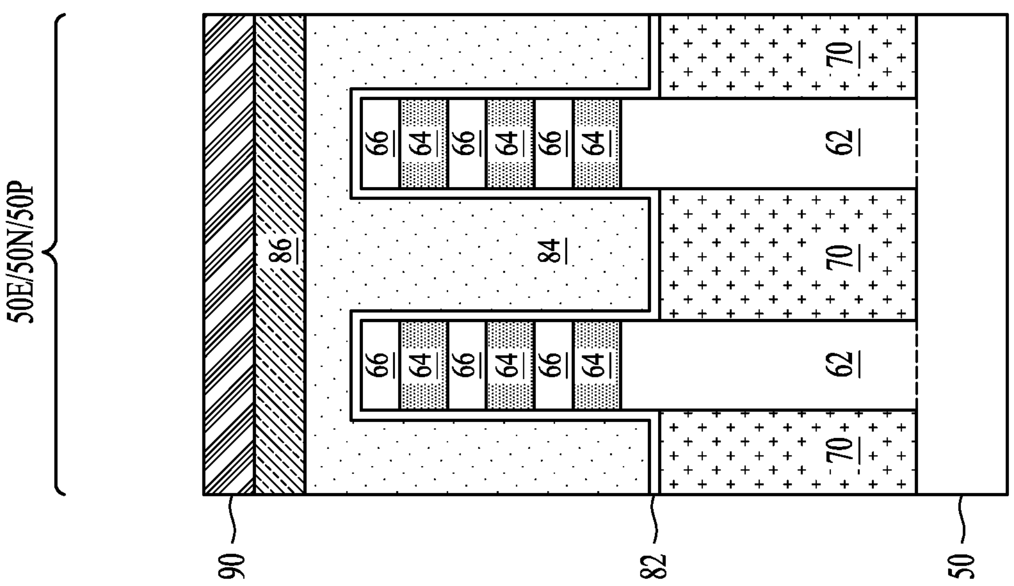

In FIGS. 8A-8C, a spacer layer 90 is conformally formed over the nanostructures 64, 66 and the STI regions 70, on exposed sidewalls of the masks 86 (if present), the dummy gates 84, the dummy dielectrics 82, the nanostructures 64, 66, and the fins 62. The spacer layer 90 may be formed of one or more dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. The spacer layer 90 will be subsequently etched to form spacers.

Figure 9A:
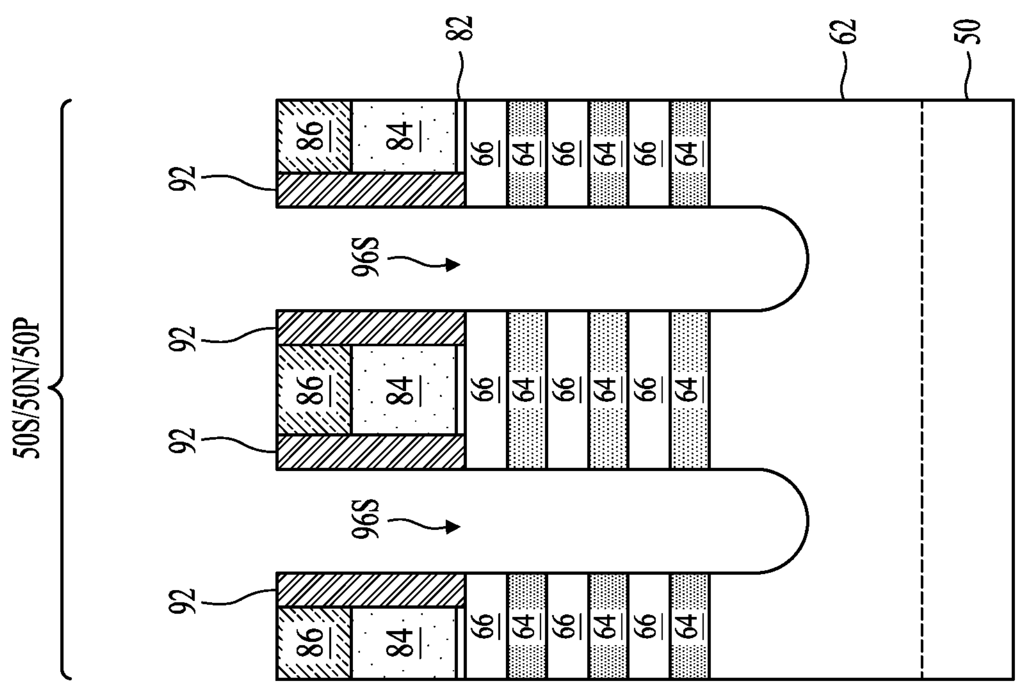
Figure 9A:
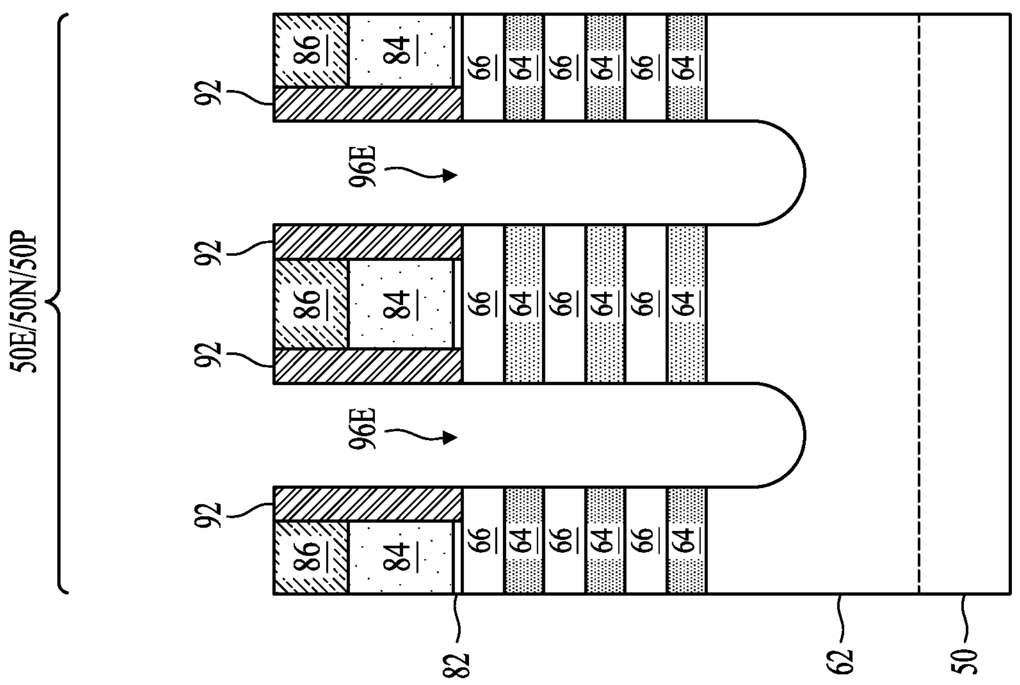
Figure 9B:
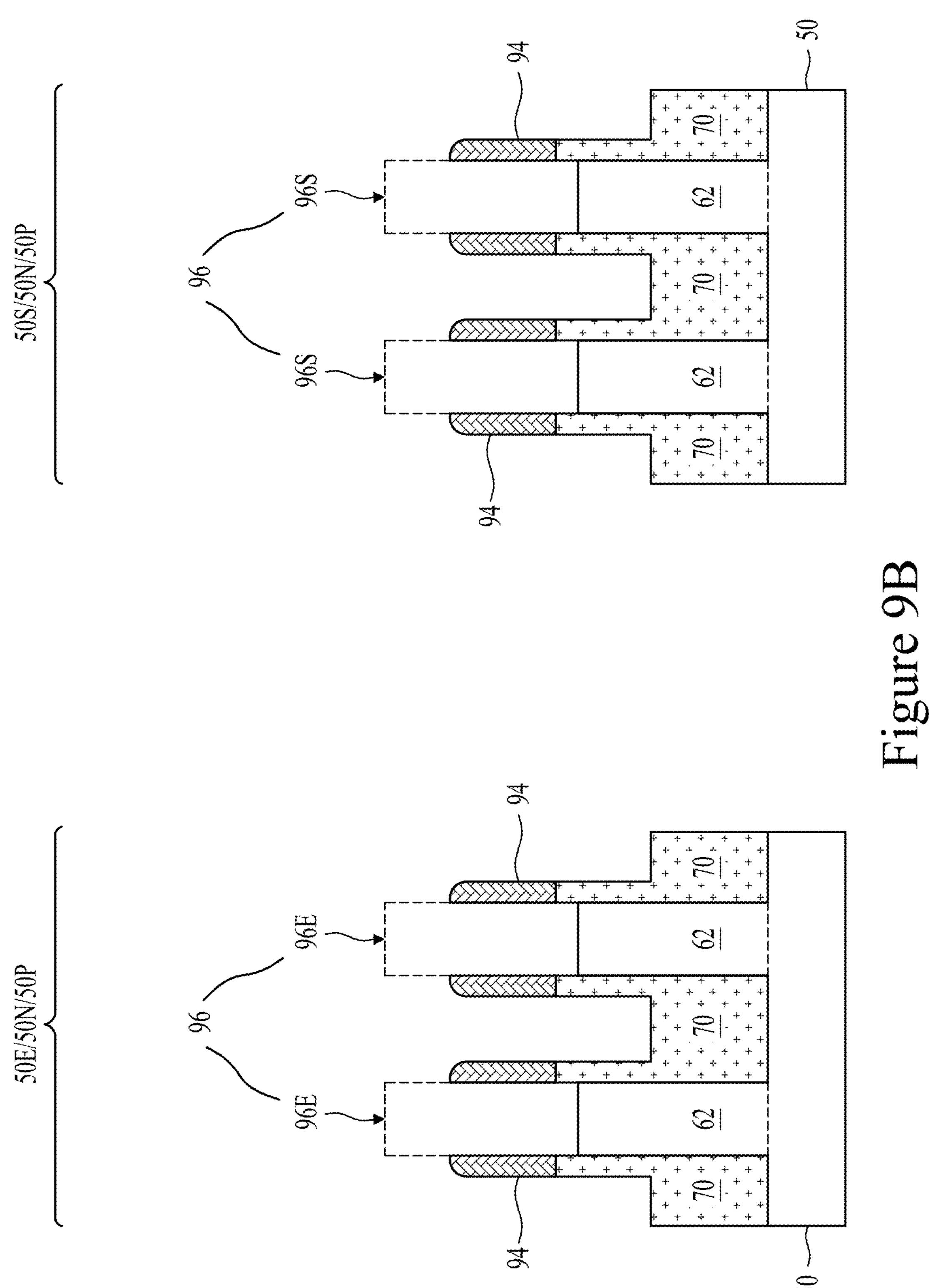
Figure 9C:
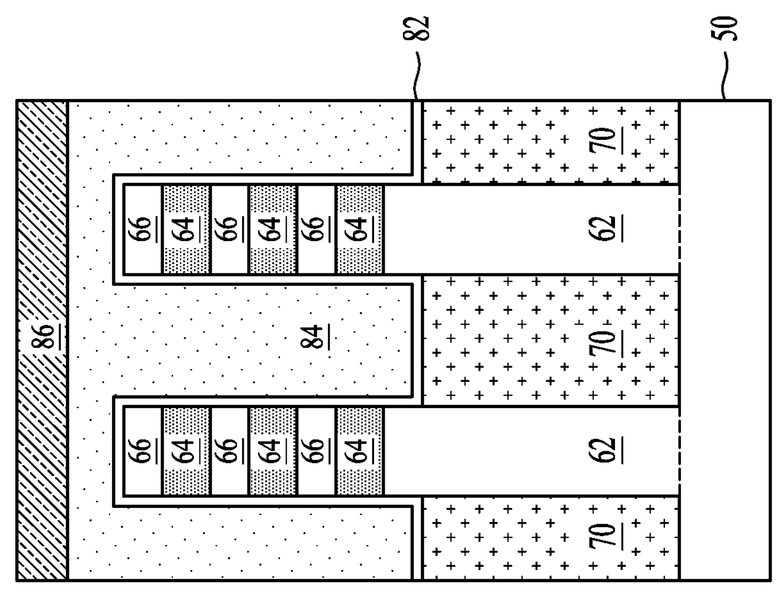
Figure 9C:
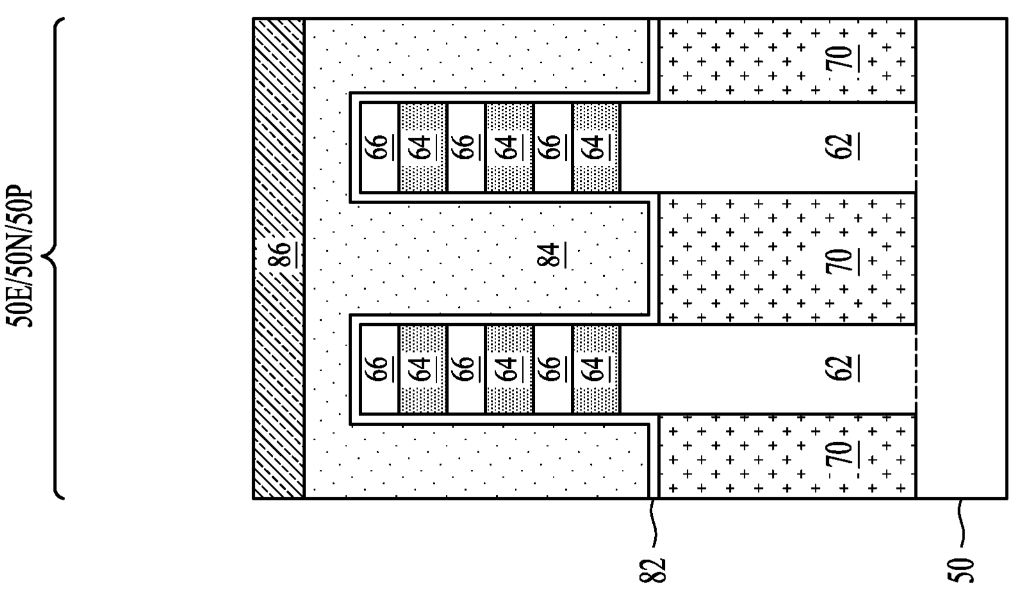

In FIGS. 9A-9C, the spacer layer 90 is patterned to form gate spacers 92 and fin spacers 94. Any acceptable etch process, such as a dry etch, a wet etch, the like, or a combination thereof, may be performed to pattern the spacer layer 90. The etching may be anisotropic. The spacer layer 90, when etched, has portions left on the sidewalls of the dummy gates 84 (thus forming the gate spacers 92) and has portions left on the sidewalls of the fins 62 and/or the nanostructures 64, 66 (thus forming the fin spacers 94). After etching, the fin spacers 94 and/or the gate spacers 92 can have straight sidewalls or can have curved sidewalls. Additionally, the STI regions 70 may also be etched when patterning the spacer layer 90. The etching may recess portions of the STI regions 70 between the fins 62.

As noted above, pattern loading effects may be avoided as a result of the nanostructures 64, 66 in the high-efficiency region 50E having the same dimensions (e.g., width and thickness) as the nanostructures 64, 66 in the high-speed region 50S. As a result, the fin spacers 94 in the high-efficiency region 50E may have the same dimensions (e.g., width and thickness) as the fin spacers 94 in the high-speed region 50S. In some embodiments, the fin spacers 94 in the high-efficiency region 50E and the high-speed region 50S have a height in the range of 15 nm to 30 nm and have a width in the range of 5 nm to 10 nm.

Further, implants for lightly doped source/drain (LDD) regions (not separately illustrated) may be performed. In embodiments with different device types, similar to the implants for the previously described wells, a mask, such as a photoresist, may be formed over the n-type region 50N, while exposing the p-type region 50P, and appropriate type (e.g., p-type) impurities may be implanted into the fins 62 and the nanostructures 64, 66 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the fins 62 and the nanostructures 64, 66 exposed in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from $10^{15}$ atoms/cm 3 to $10^{19}$ atoms/$cm^3$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Source/drain recesses 96 (including source/drain recesses 96E in the high-efficiency region 50E and source/drain recesses 96S in the high-speed region 50S) are patterned in the fins 62, the nanostructures 64, 66, and the substrate 50. Epitaxial source/drain regions will be subsequently formed in the source/drain recesses 96. The source/drain recesses 96 may extend through the nanostructures 64, 66 and into the substrate 50. In some embodiments, the fins 62 may be etched such that bottom surfaces of the source/drain recesses 96 are disposed below the top surfaces of the STI regions 74. The source/drain recesses 96 may be formed by etching the fins 62, the nanostructures 64, 66, and the substrate 50 using anisotropic etching processes, such as RIE, NBE, or the like. The gate spacers 92 and the dummy gates 84 mask portions of the fins 62, the nanostructures 64, 66, and the substrate 50 during the etching processes used to form the source/drain recesses 96. A single etch process or multiple etch processes may be used to etch each layer of the nanostructures 64, 66 and/or the fins 62. Timed etch processes may be used to stop the etching of the source/drain recesses 96 after the source/drain recesses 96 reach a desired depth.

Figure 10B:
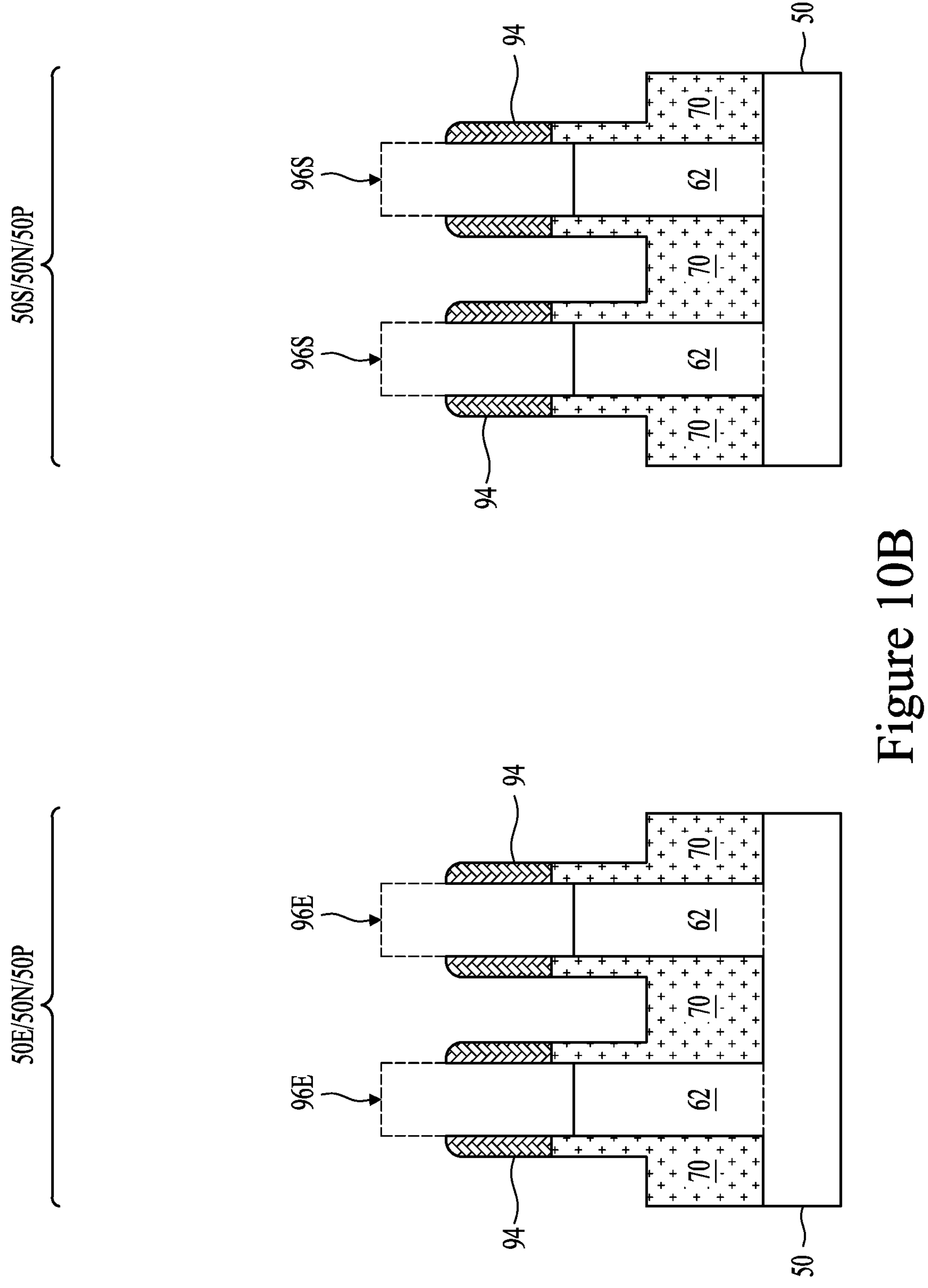
Figure 10C:
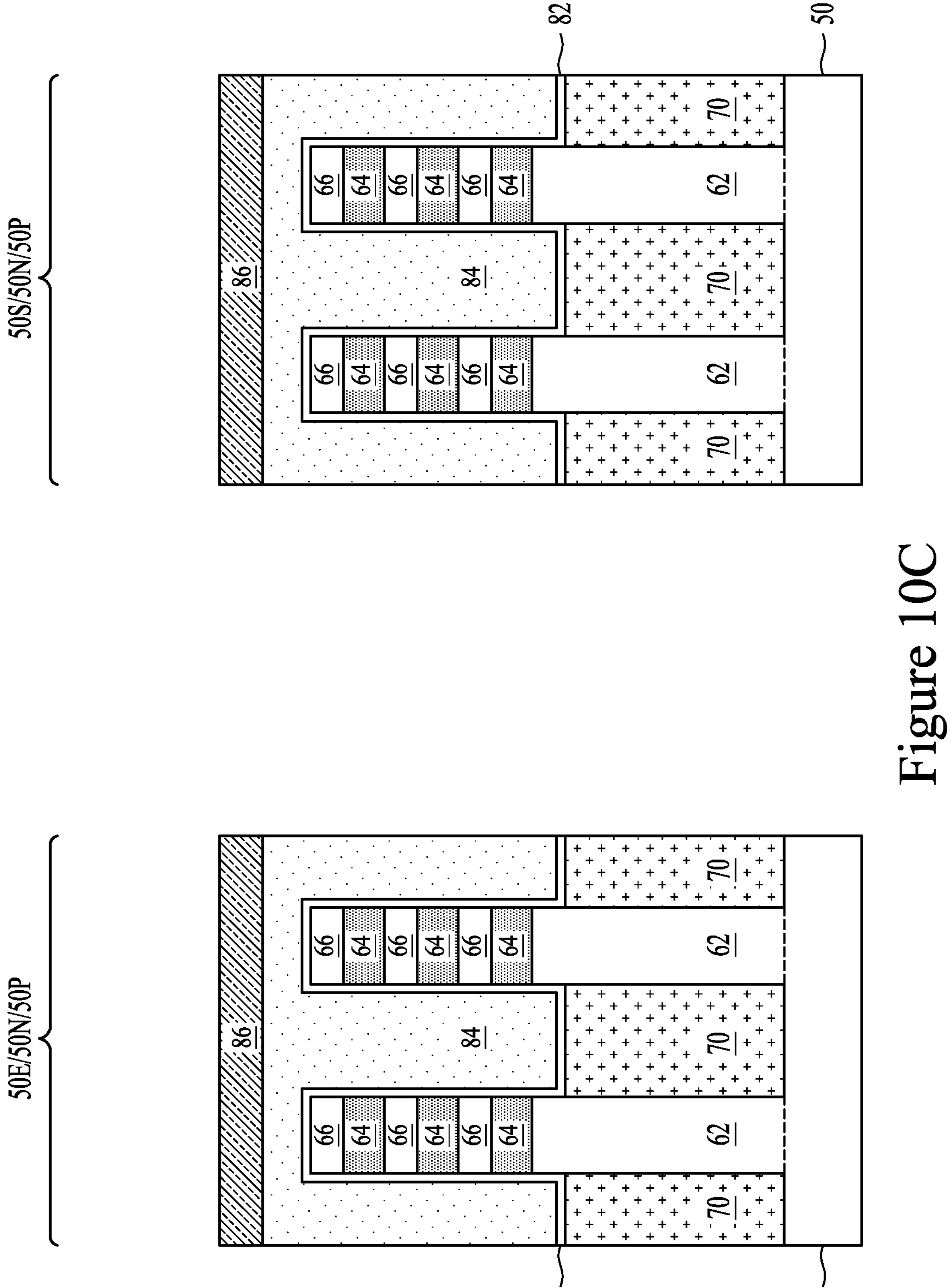

In FIGS. 10A-10C, inner spacers 98 are formed on the sidewalls of the remaining portions of the first nanostructures 64, e.g., those sidewalls exposed by the source/drain recesses 96. As will be subsequently described in greater detail, source/drain regions will be subsequently formed in the source/drain recesses 96, and the first nanostructures 64 will be subsequently replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as etch processes used to subsequently remove the first nanostructures 64.

As an example to form the inner spacers 98, the source/drain recesses 96 can be laterally expanded. Specifically, portions of the sidewalls of the first nanostructures 64 exposed by the source/drain recesses 96 may be recessed to form sidewall recesses. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide ($NH_4OH$), or the like. In another embodiment, the etch process may be a dry etch using a fluorine-based gas such as hydrogen fluoride (HF) gas. In some embodiments, the same etch process may be continually performed to both form the source/drain recesses 96 and recess the sidewalls of the first nanostructures 64. The inner spacers 98 can then be formed by conformally forming an insulating material in the source/drain recesses 96, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like.

Although outer sidewalls of inner spacers 98 are illustrated as being flush with sidewalls of the second nanostructures 66, the outer sidewalls of the inner spacers 98 may extend beyond or be recessed from sidewalls of the second nanostructures 66. In other words, the inner spacers 98 may partially fill, completely fill, or overfill the sidewall recesses. Moreover, although the sidewalls of the inner spacers 98 are illustrated as being straight, the sidewalls of the inner spacers 98 may be concave or convex.

Figure 11A:
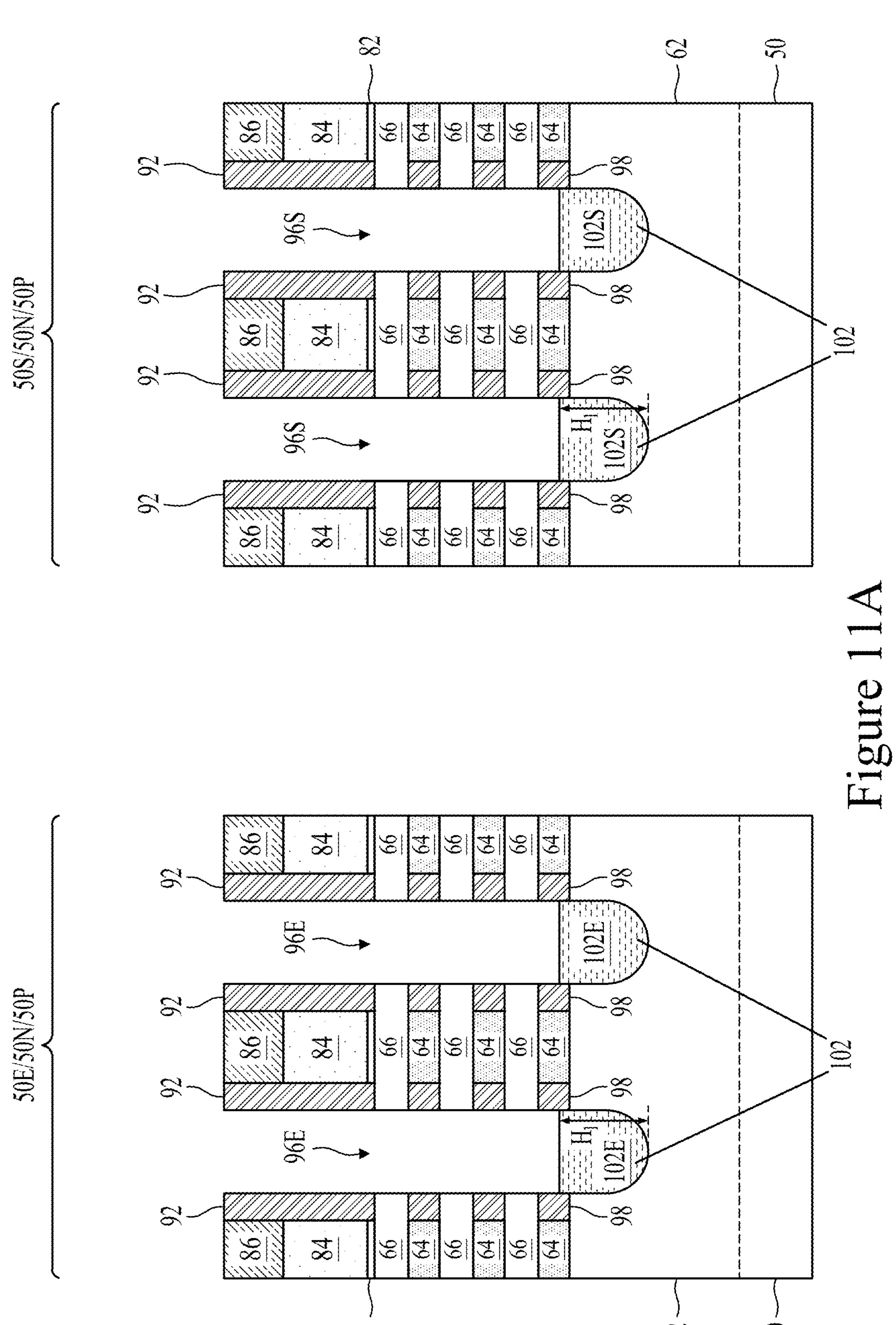
Figure 11B:
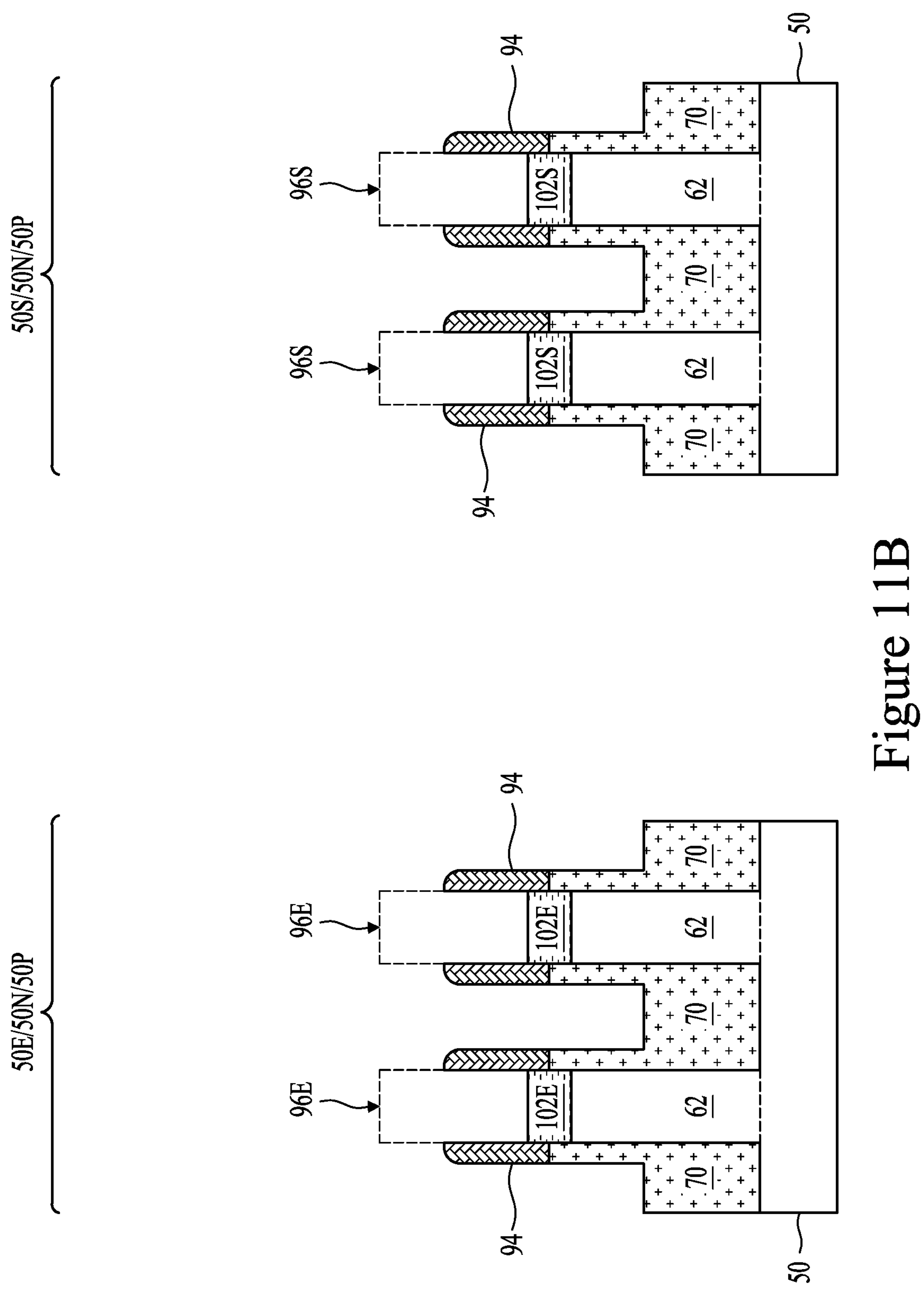
Figure 11C:
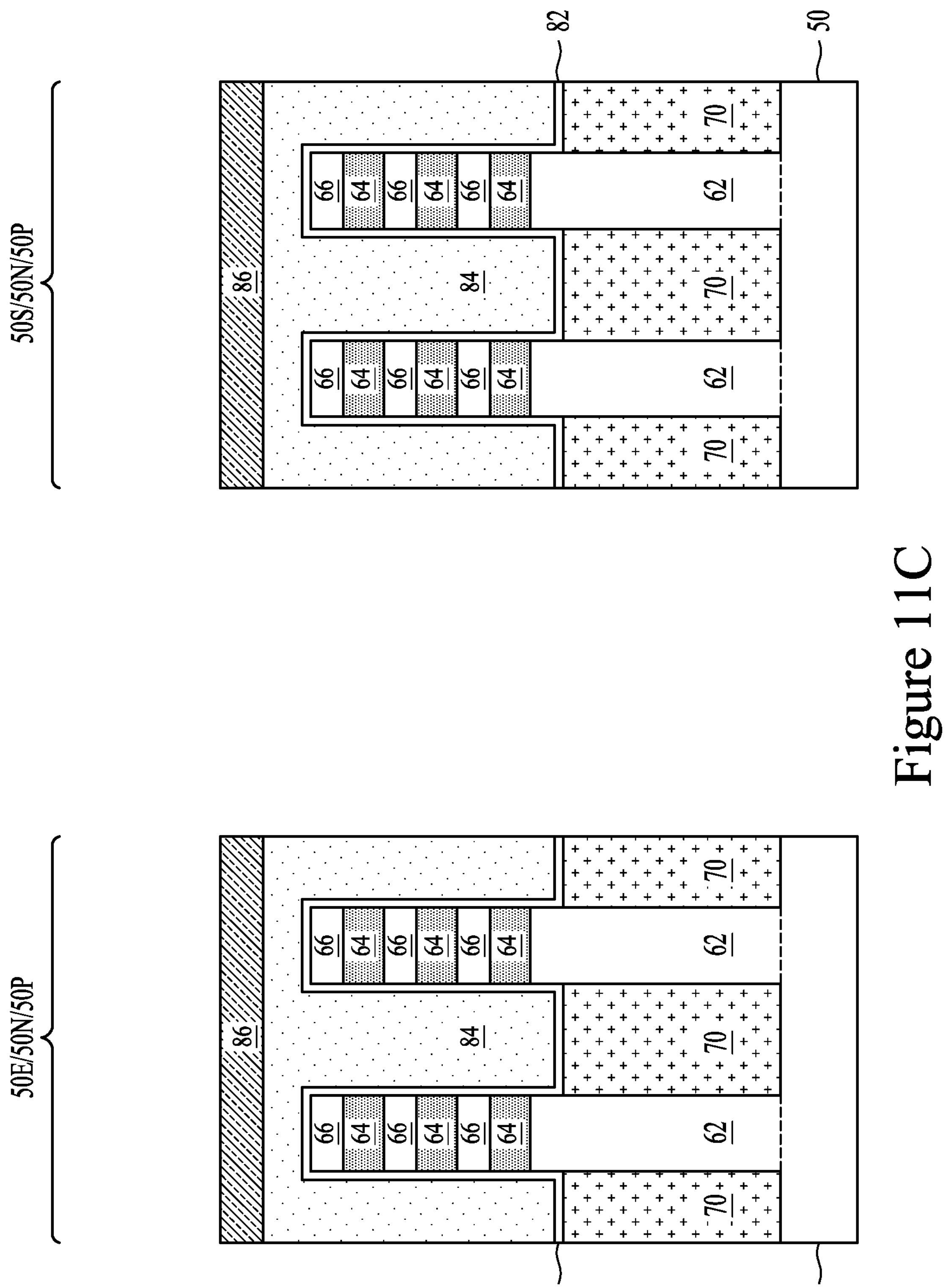

In FIGS. 11A-11C, semiconductor layers 102 (including semiconductor layers 102E in the high-efficiency region 50E and semiconductor layers 102S in the high-speed region 50S) are formed in the source/drain recesses 96. The semiconductor layers 102 may be formed of a semiconductor material selected from the candidate semiconductor materials of the substrate 50, which may be grown by an epitaxial growth process such as vapor phase epitaxy (VPE), molecular beam epitaxy (MBE), or the like. The semiconductor layers 102 may be undoped semiconductor layers. In some embodiments, the semiconductor layers 102 are formed of undoped silicon or undoped silicon germanium. In this embodiment, the top surfaces of the semiconductor layers 102 are flat top surfaces. In another embodiment (subsequently described), the top surfaces of the semiconductor layers 102 are convex top surfaces. The semiconductor layers 102 provide non-concave (e.g., planar or convex) top surfaces that subsequently formed spacers will be formed on.

The semiconductor layers 102 may be epitaxially grown by flowing a semiconductor-containing precursor and an etchant-containing precursor in the source/drain recesses 96. The semiconductor-containing precursor may be a silicon-containing precursor such as a silane, such as monosilane ($SiH_4$), dichlorosilane ($H_2SiCl_2$), disilane ($Si_2H_6$), or the like; a germanium-containing precursor such as germane ($GeH_4$) or the like; combinations thereof; or the like. The etchant-containing precursor may be a chlorine-containing precursor such as hydrogen chloride (HCl) gas, chlorine ($Cl_2$) gas, or the like. The etchant-containing precursor is flowed at a fast flow rate, which may cause the semiconductor layers 102 to be grown in more of a bottom-up manner than a lateral manner. In some embodiments, the semiconductor-containing precursor is flowed at a flow rate in the range of 0 sccm to 1000 sccm and the etchant-containing precursor is flowed at a flow rate in the range of 0 sccm to 1000 sccm. As such, the semiconductor layers 102 may be grown from the fins 62 but not from the nanostructures 66. In some embodiments, the epitaxial growth is performed at a temperature in the range of 500° C. to 900° C., and at a pressure in the range of 1 Torr to 150 Torr. The semiconductor layers 102 may be formed with flat or convex top surfaces by controlling the flow rate of the etchant-containing precursor during deposition.

The semiconductor layers 102 may partially fill, completely fill, or overfill the portions of the source/drain recesses 96 in the fins 62. At this step of processing, the semiconductor layers 102 may be in contact with the sidewalls of some of the inner spacers 98, but the semiconductor layers 102 are not in contact with the sidewalls of the nanostructures 66. The height $H_1$ of the semiconductor layers 102 is less than the distance between the fins 62 and the lower nanostructures 66. In some embodiments, the height $H_1$ of the semiconductor layers 102 is in the range of 10 nm to 15 nm. Timed epitaxial growth processes may be used to stop the growth of the semiconductor layers 102 after the semiconductor layers 102 reach a desired height. At this step of processing, the semiconductor layers 102E have the same height $H_1$ as the semiconductor layers 102S. As subsequently described in greater detail, an additional epitaxial growth process will be performed to increase the height of the semiconductor layers 102E as compared to the semiconductor layers 102S.

Figure 12A:
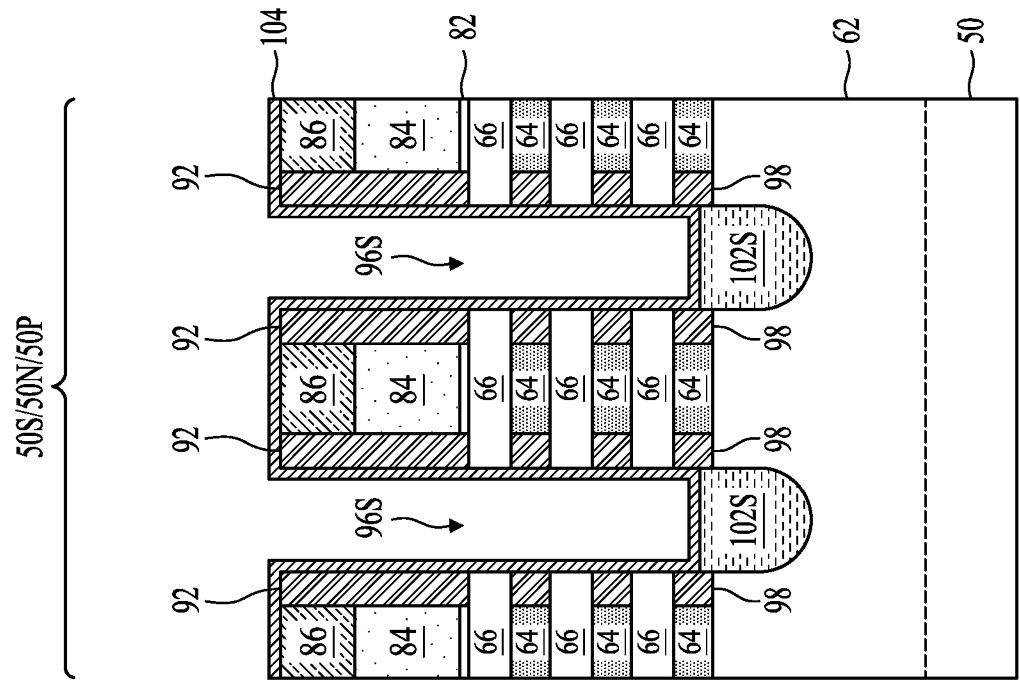
Figure 12A:
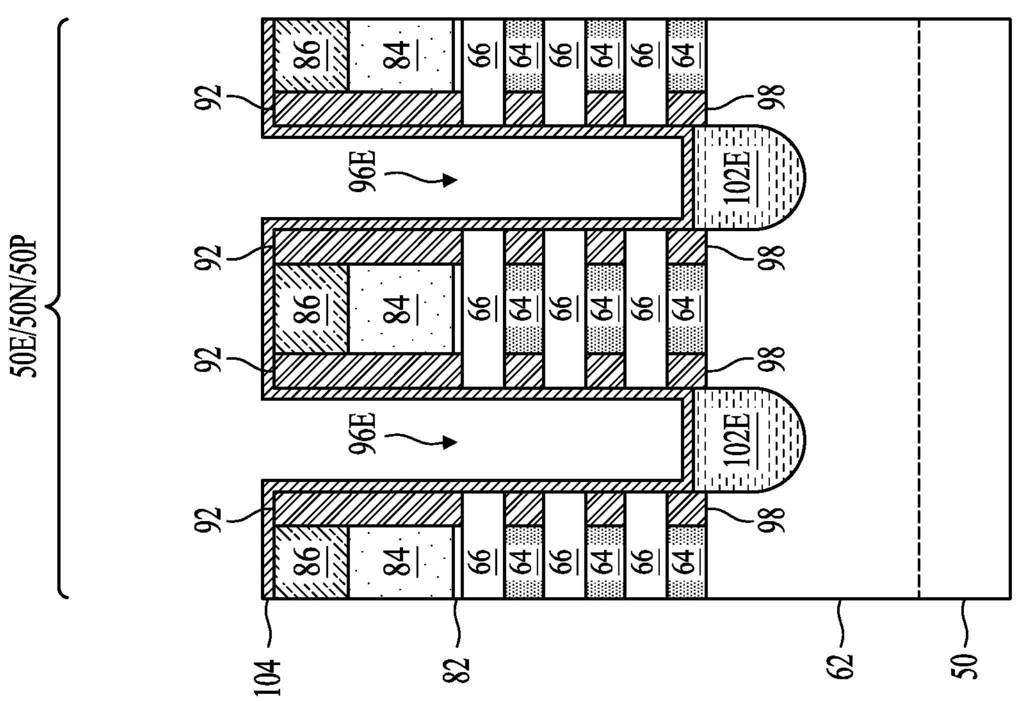
Figure 12B:
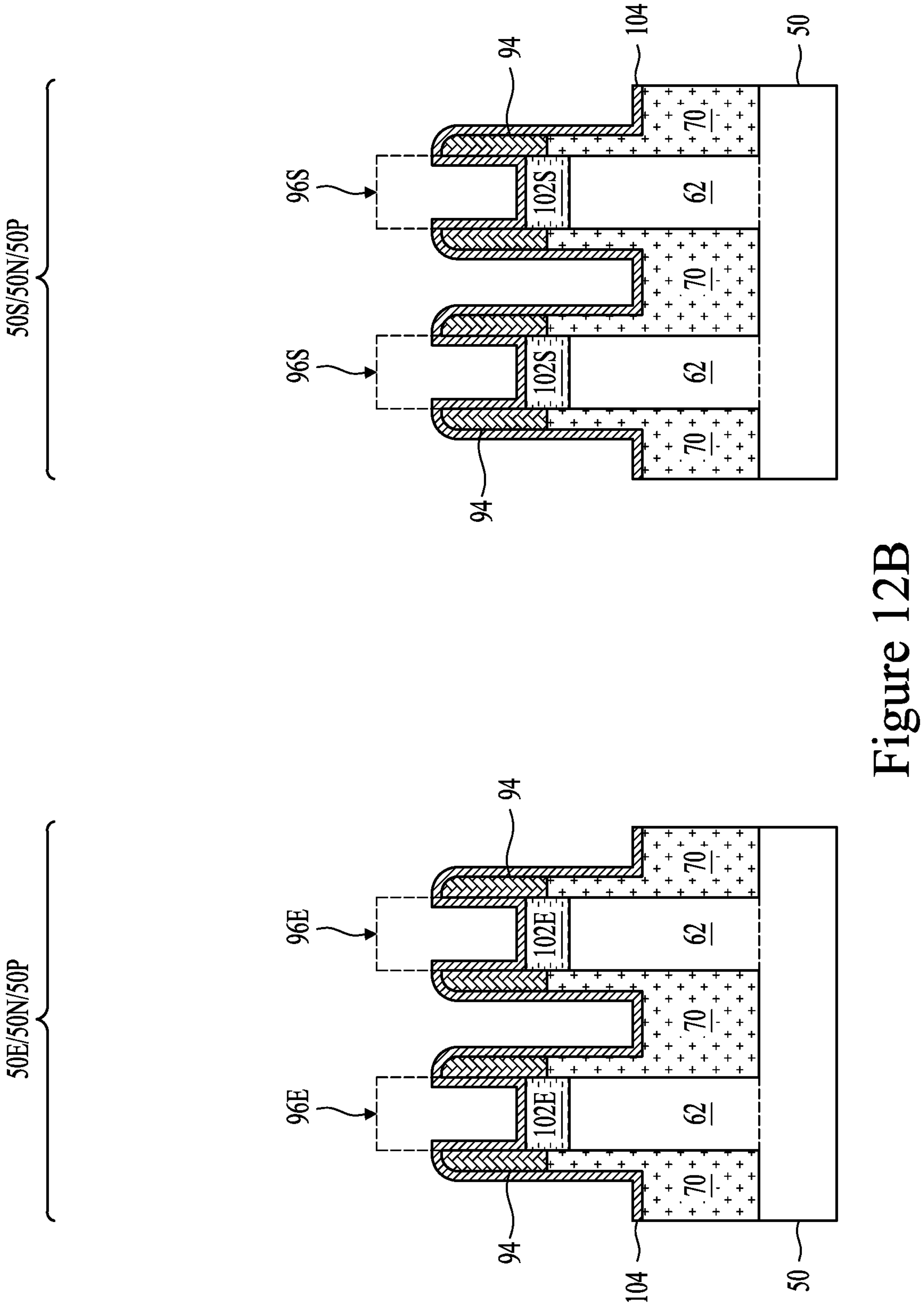
Figure 12C:
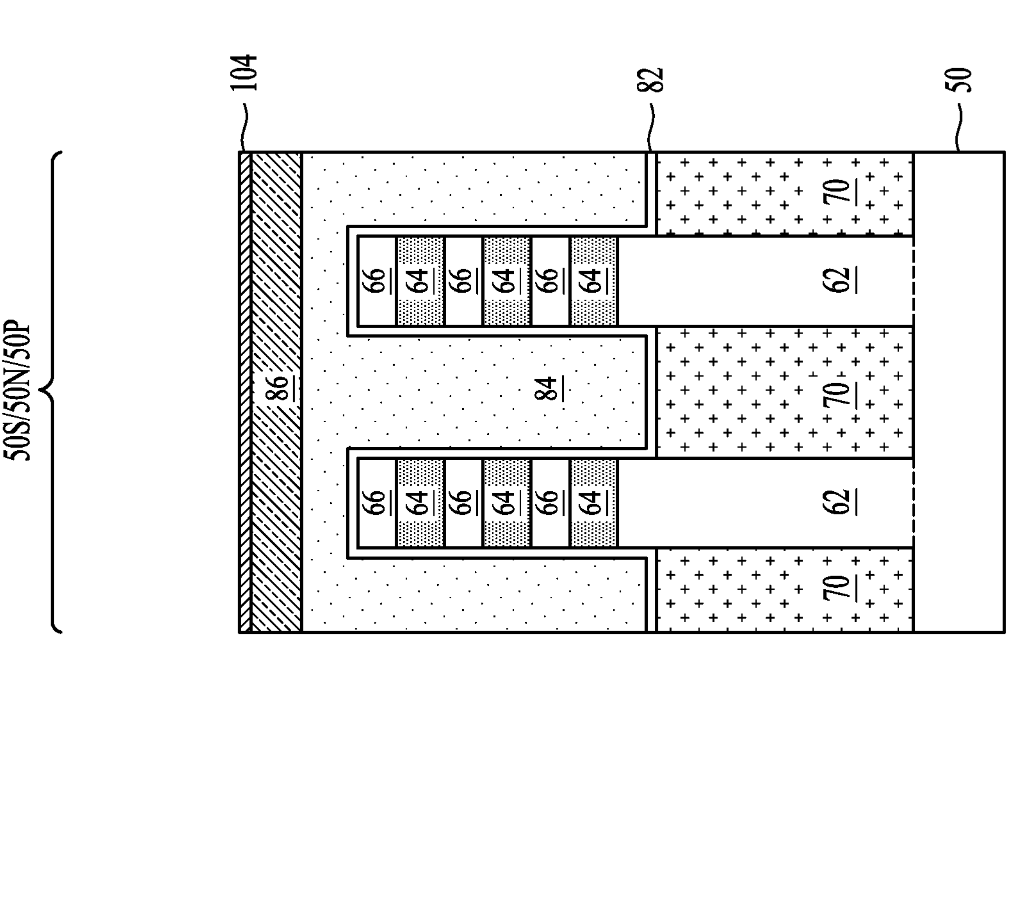
Figure 12C:
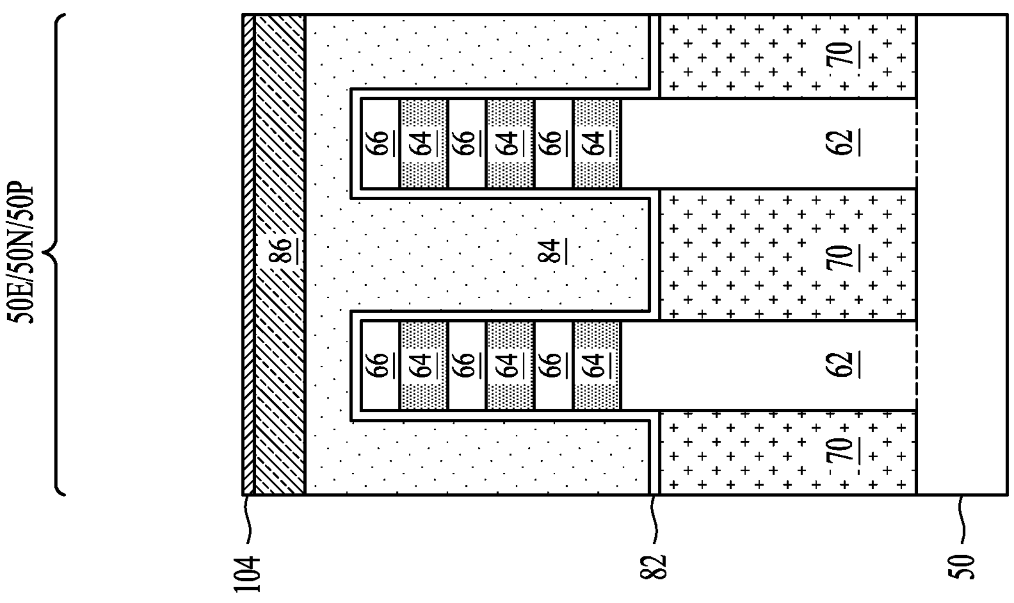

In FIGS. 12A-12C, a mask layer 104 is conformally formed over the semiconductor layers 102, the fin spacers 94, the gate spacers 92, the STI regions 70, and the masks 86 (if present) or the dummy gates 84, and on the sidewalls of the nanostructures 66 and the inner spacers 98 in the source/drain recesses 96. The mask layer 104 may be formed of a hard mask material, such as aluminum oxide, silicon carbide, titanium nitride, or the like, which may be formed by a deposition process such as chemical vapor deposition (CVD), atomic layer deposition (ALD), or the like. The mask layer 104 is formed in both the high-efficiency region 50E and the high-speed region 50S.

Figure 13A:
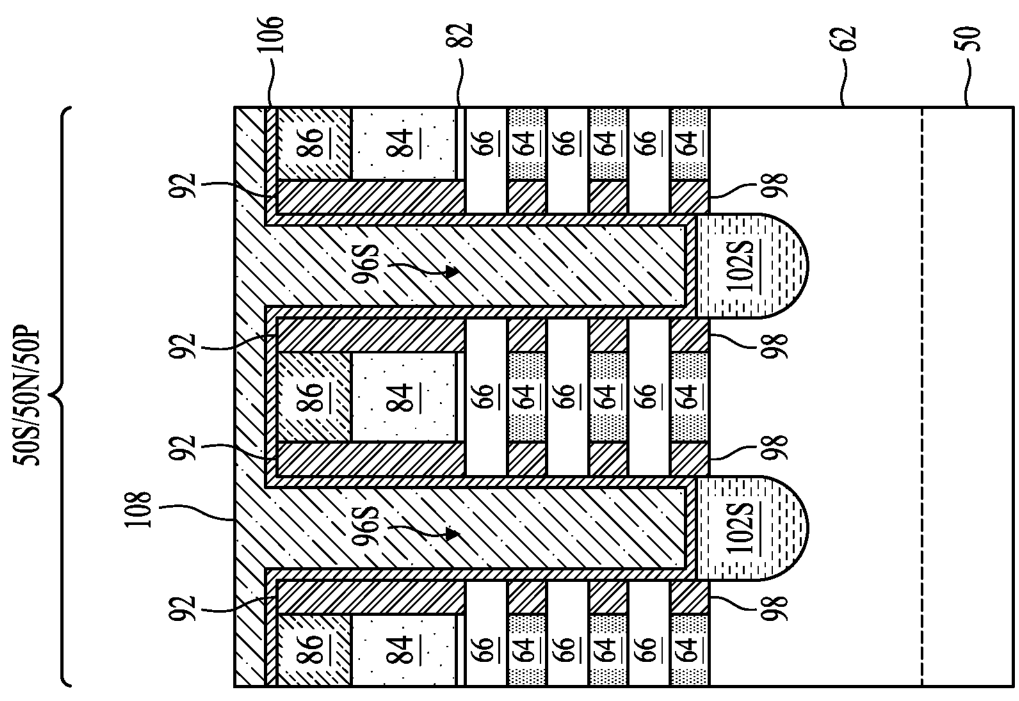
Figure 13A:
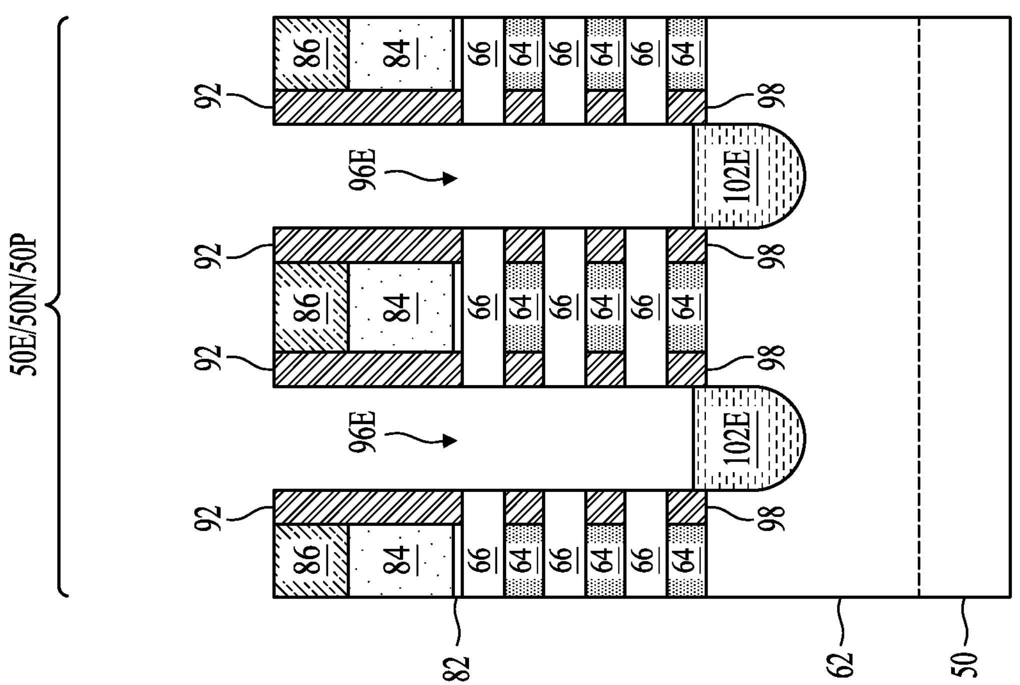
Figure 13B:
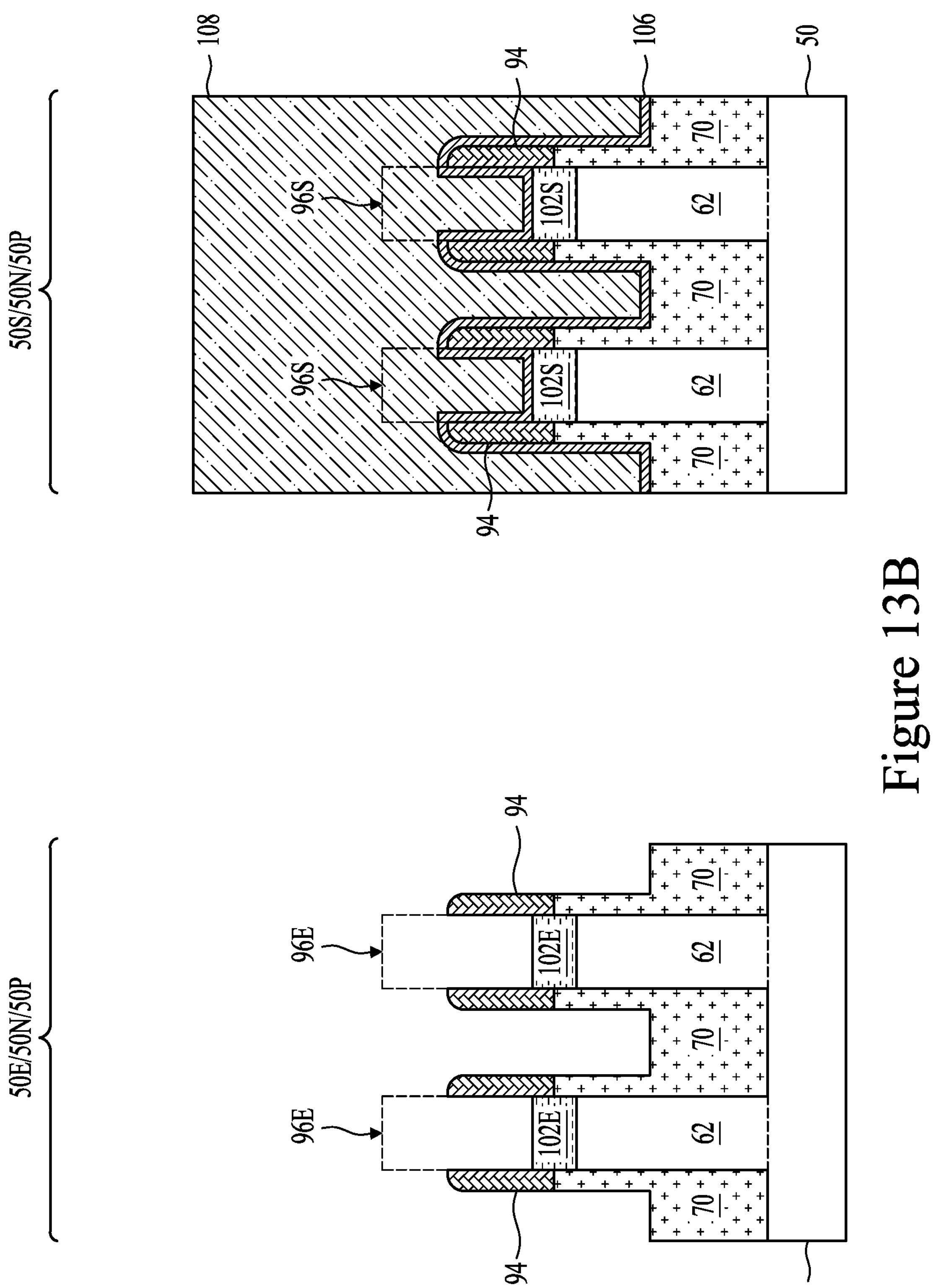
Figure 13C:
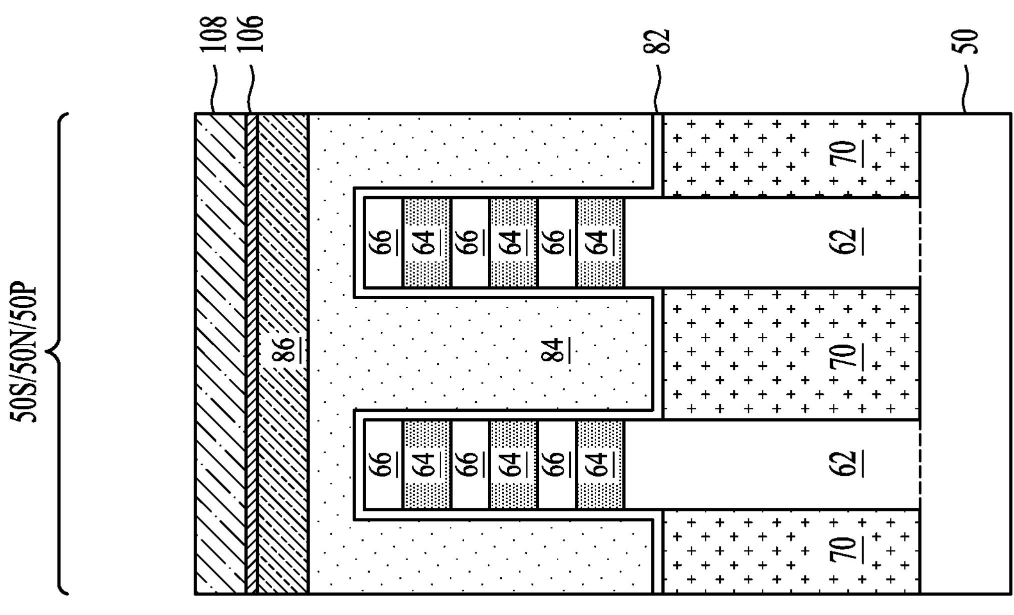
Figure 13C:
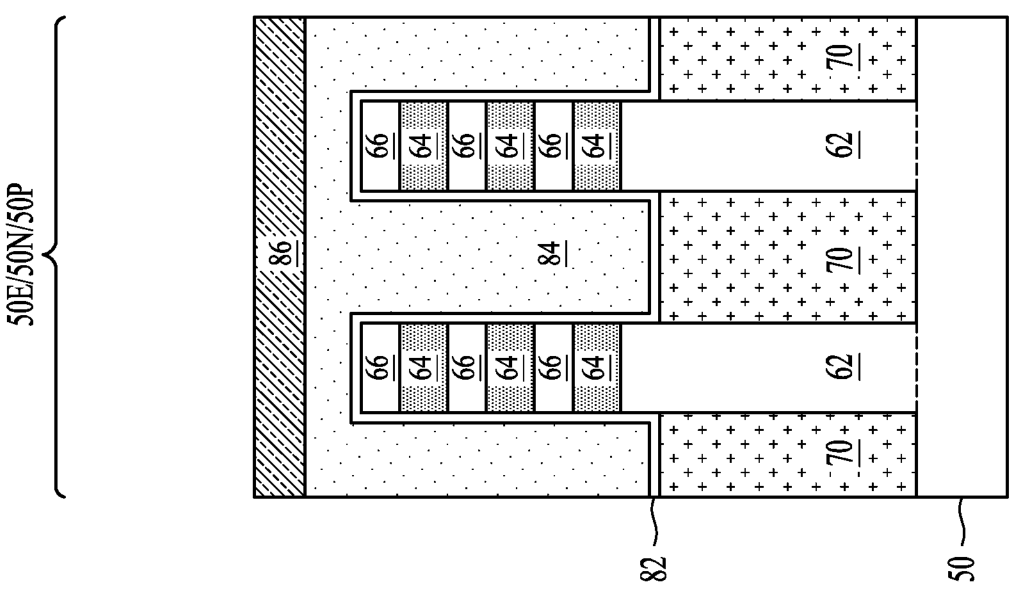

In FIGS. 13A-13C, the mask layer 104 is patterned to remove portions of the mask layer 104 in the high-efficiency region 50E, thereby forming a mask 106. The mask layer 104 may be patterned with any acceptable etch process that is selective to the mask layer 104 (e.g., selectively etches the material of the mask layer 104 at a faster rate than the material of the semiconductor layers 102). The etch process may be isotropic. A photoresist 108 may be formed over the semiconductor layers 102, the fin spacers 94, the gate spacers 92, the STI regions 70, and the masks 86 (if present) or the dummy gates 84 in the high-efficiency region 50E and the high-speed region 50S. The photoresist 108 is patterned to expose the high-efficiency region 50E. The photoresist 108 can be formed by using a spin-on technique and can be patterned using acceptable photolithography techniques. Once the photoresist 108 is patterned, the mask layer 104 may be etched in the high-efficiency region 50E, and the photoresist 108 may act as an etching mask to substantially prevent etching of the mask layer 104 in the high-speed region 50S. After the etch, the photoresist 108 is removed, such as by an acceptable ashing process. The mask 106 covers the semiconductor layers 102S and exposes the semiconductor layers 102E.

Figure 14A:
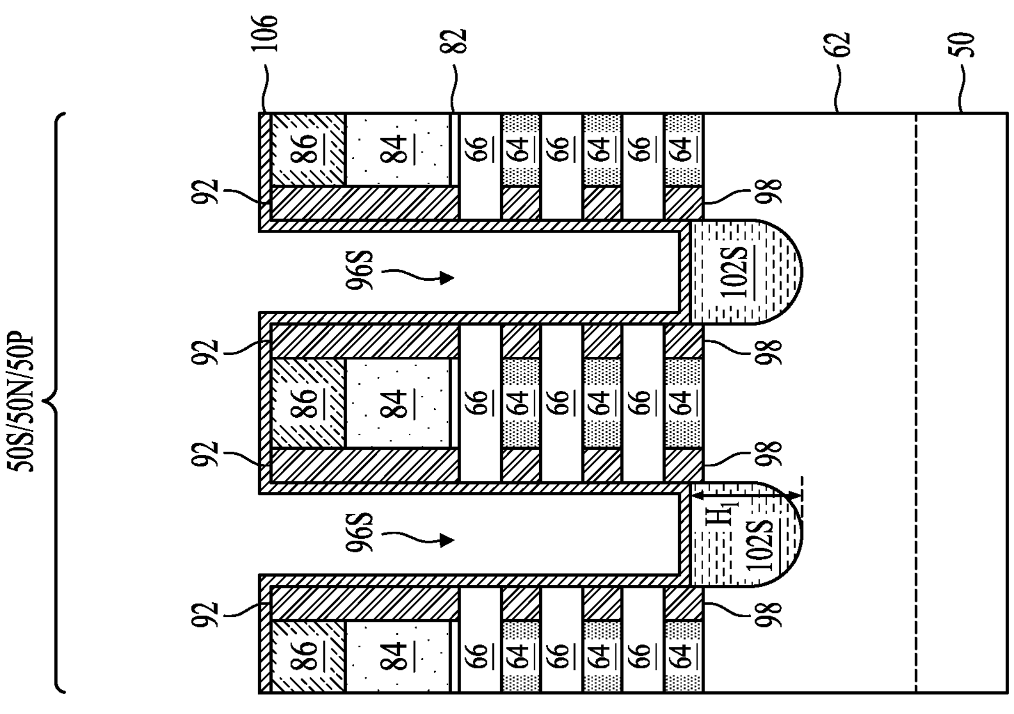
Figure 14A:
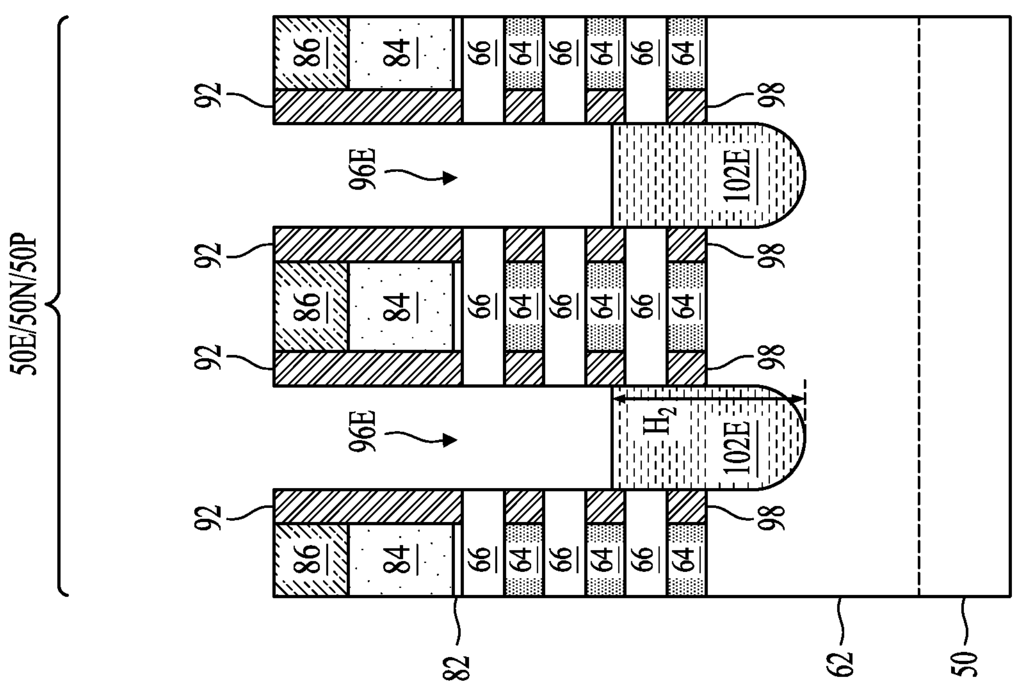
Figure 14B:
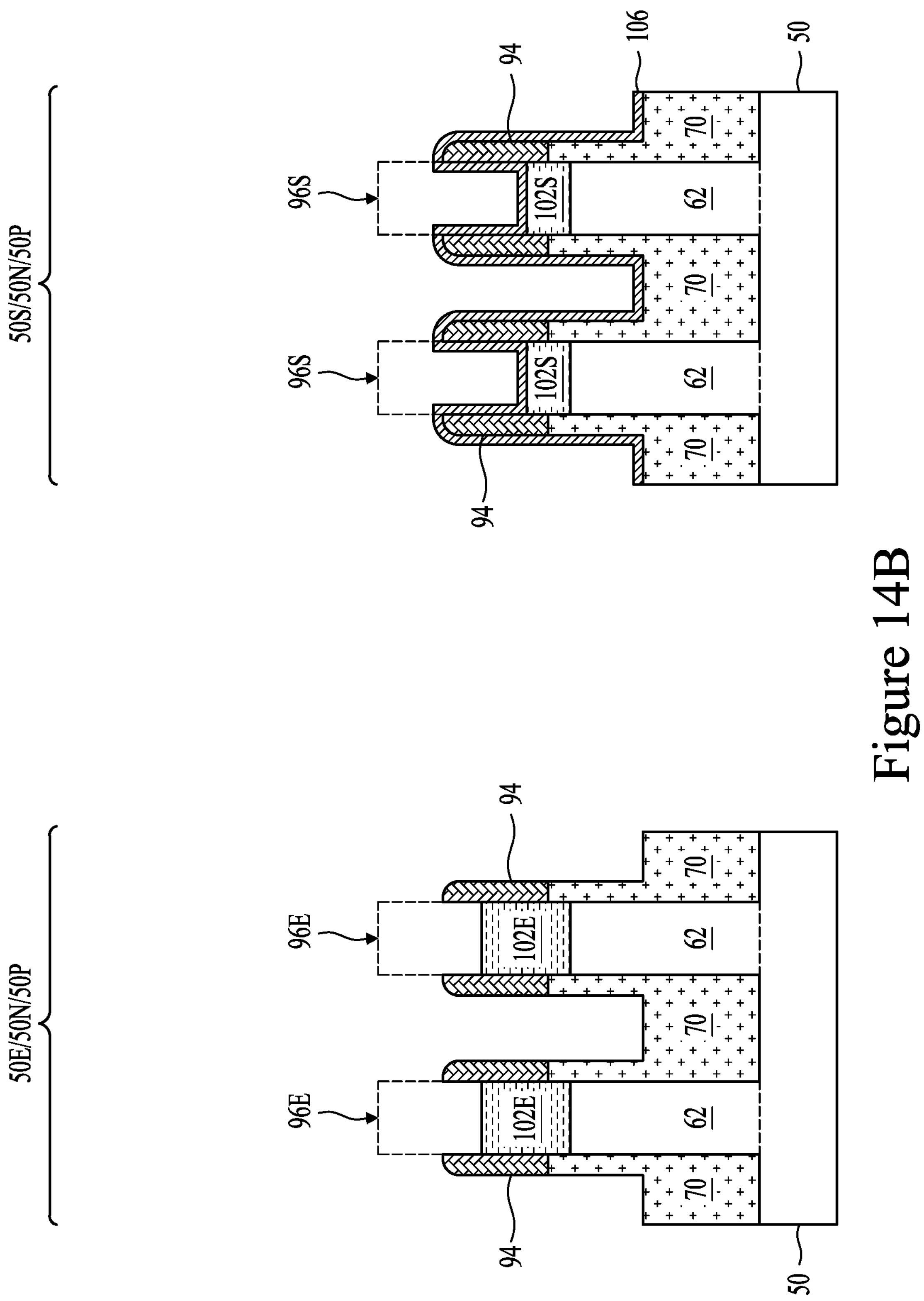
Figure 14C:
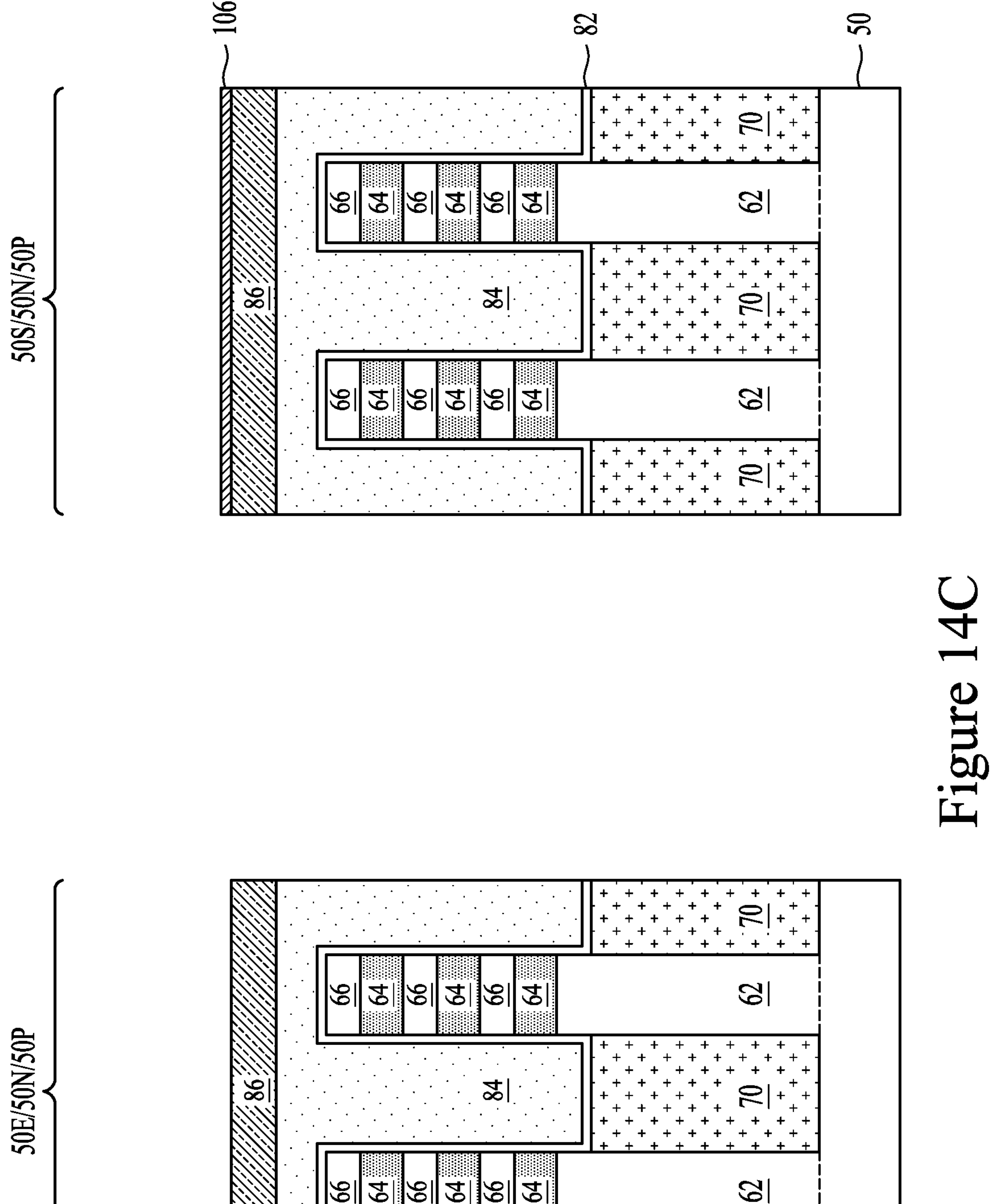

In FIGS. 14A-14C, the height of the semiconductor layers 102E is increased, as compared to the semiconductor layers 102S. The height of the semiconductor layers 102E may be increased by repeating the previously described epitaxial growth process for forming the semiconductor layers 102, thereby growing more of the semiconductor material of the semiconductor layers 102E. The mask 106 covers the semiconductor layers 102S during the growth to substantially prevent additional epitaxial growth of the semiconductor layers 102S when performing the additional epitaxial growth of the semiconductor layers 102E.

At this step of processing, the semiconductor layers 102E are in contact with the sidewalls of some of the nanostructures 66. The semiconductor layers 102E cover the sidewalls of some of the nanostructures 66, while the semiconductor layers 102S may not cover the sidewalls of the nanostructures 66. The height $H_2$ of the semiconductor layers 102E is greater than the height $H_1$ of the semiconductor layers 102S. In some embodiments, the height $H_2$ of the semiconductor layers 102E is in the range of 25 nm to 32 nm. Timed epitaxial growth processes may be used to stop the additional growth of the semiconductor layers 102E after the semiconductor layers 102E reach a desired height.

Increasing the height $H_2$ of the semiconductor layers 102E reduces the depth of the source/drain recesses 96E, as compared to the depth of the source/drain recesses 96S. The depth of the source/drain recesses 96S is greater than the depth of the source/drain recesses 96E. As subsequently described in greater detail, the source/drain recesses 96E having a smaller depth than the source/drain recesses 96S allows subsequently formed source/drain regions in the high-efficiency region 50E to be coupled to fewer nanostructures 66 than subsequently formed source/drain regions in the high-speed region 50S.

Figure 15A:
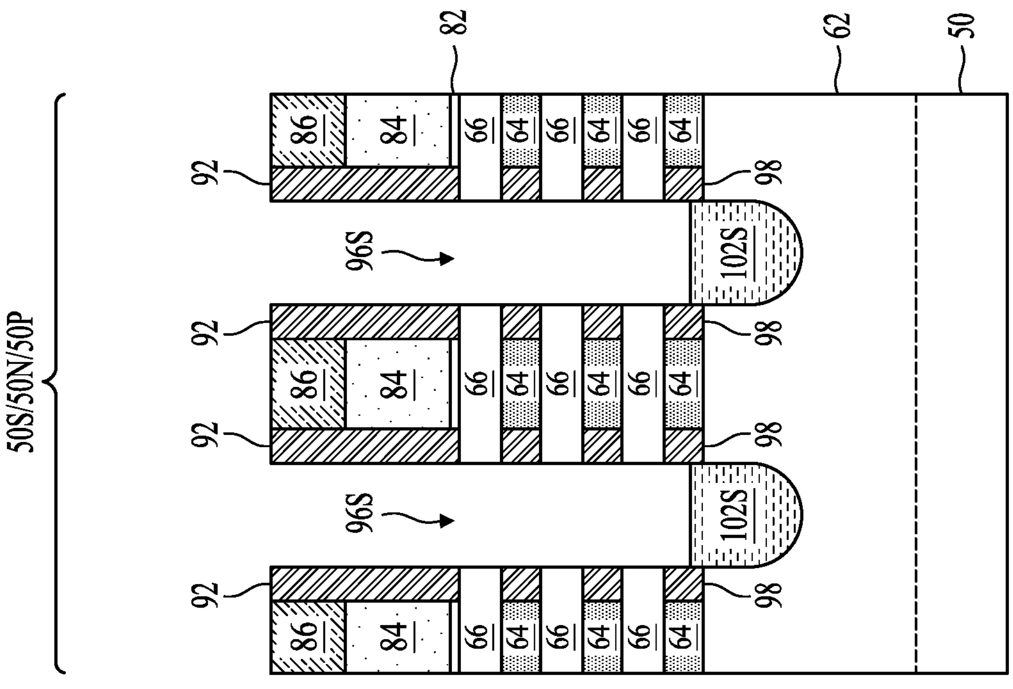
Figure 15A:
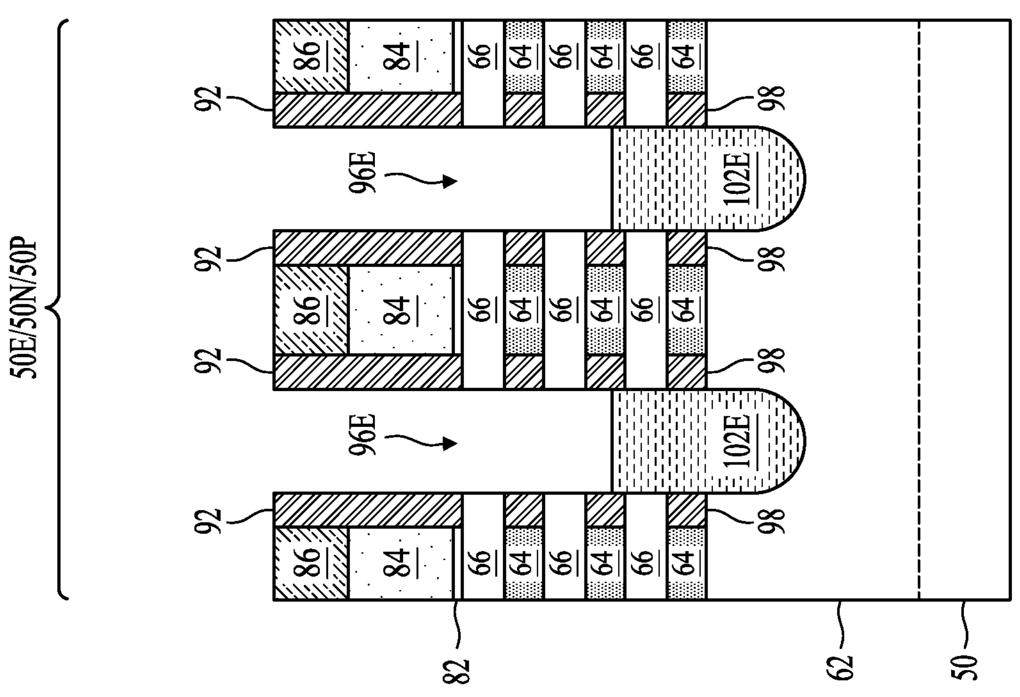
Figure 15B:
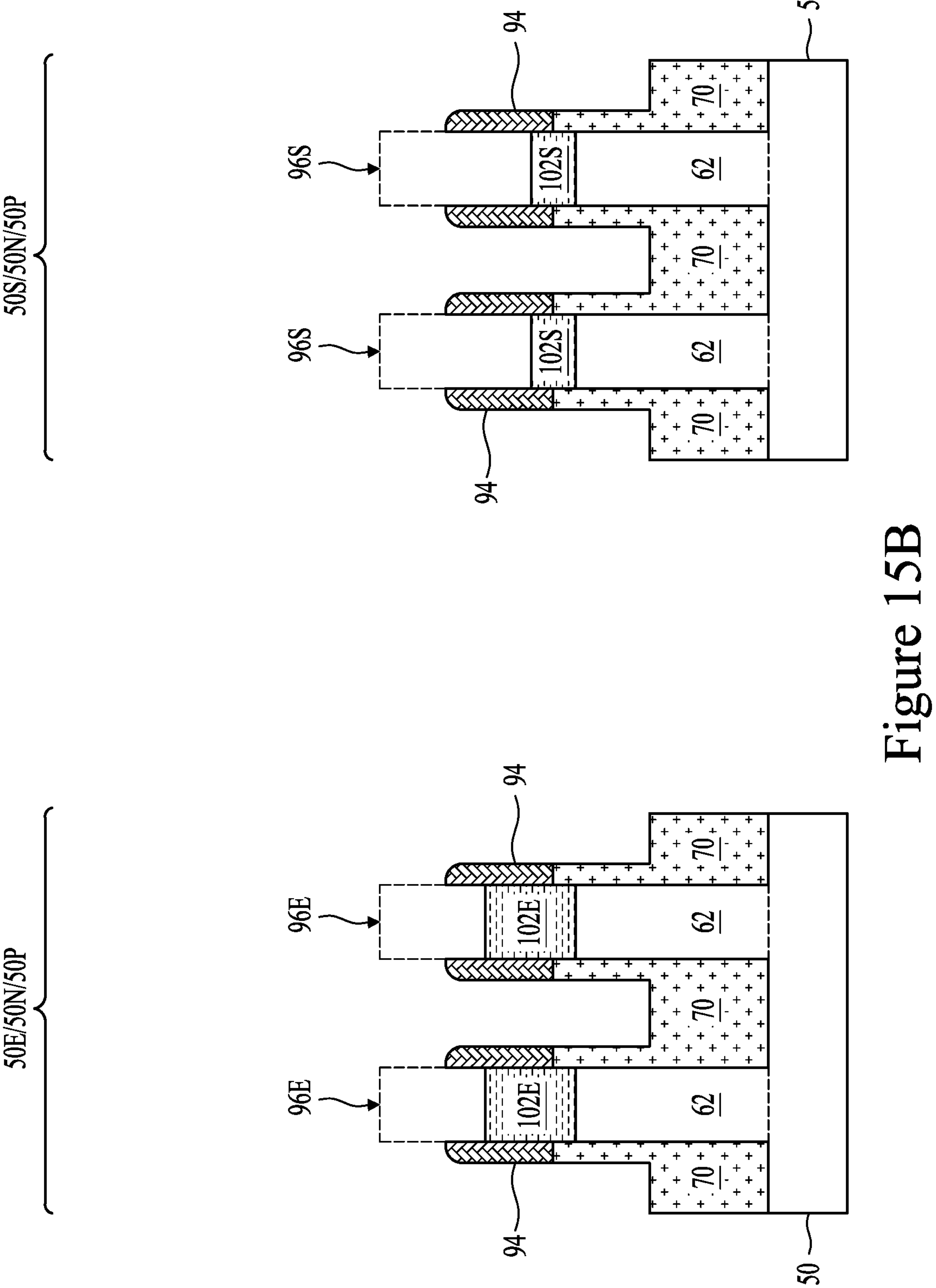

In FIGS. 15A-15C, the mask 106 is removed to expose the semiconductor layers 102S. The mask 106 may be removed with any acceptable etch process that is selective to the mask 106 (e.g., selectively etches the material of the mask 106 at a faster rate than the material of the semiconductor layers 102). The etch process may be isotropic. For example, when the mask 106 is formed of aluminum oxide, the etch process may be a wet etch using ammonium hydroxide ($NH_4OH$), dilute hydrofluoric (dHF) acid, or the like.

Figure 16A:
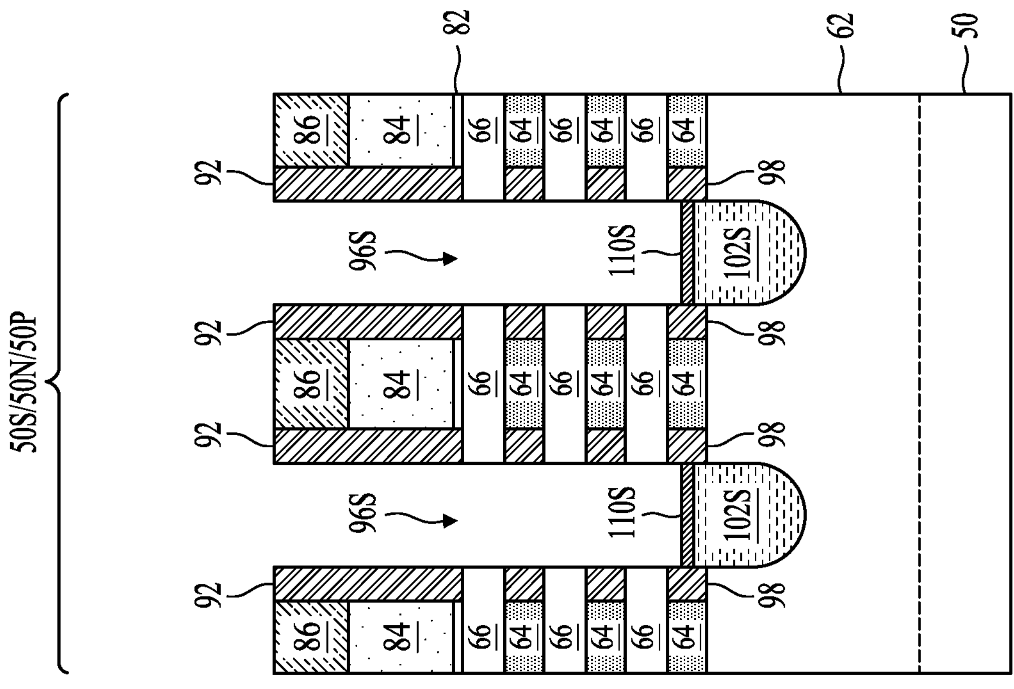
Figure 16A:
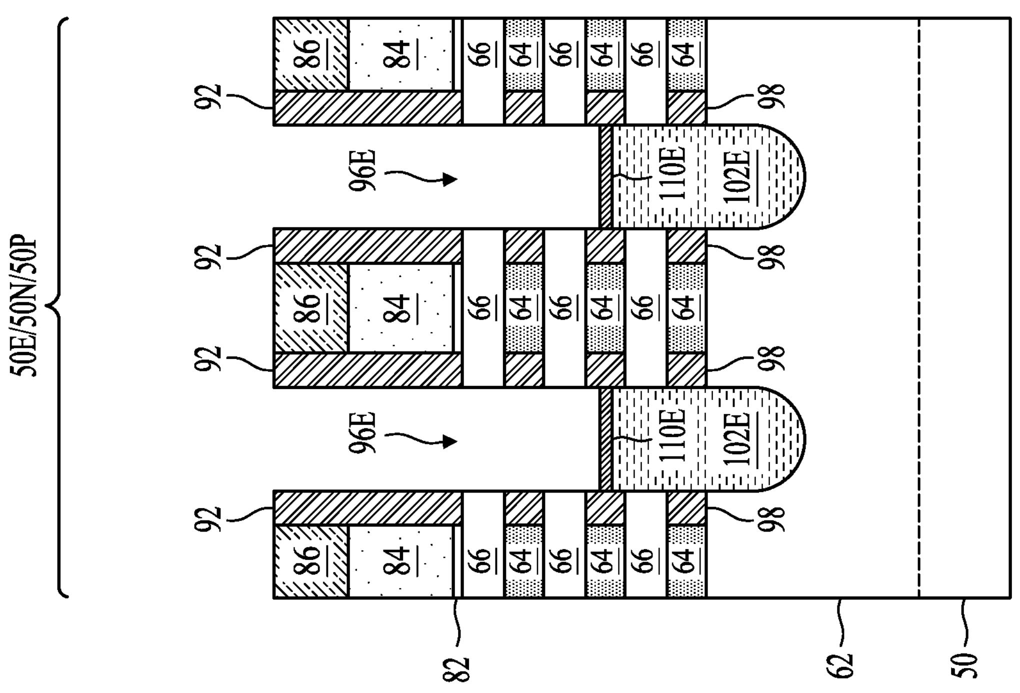
Figure 16B:
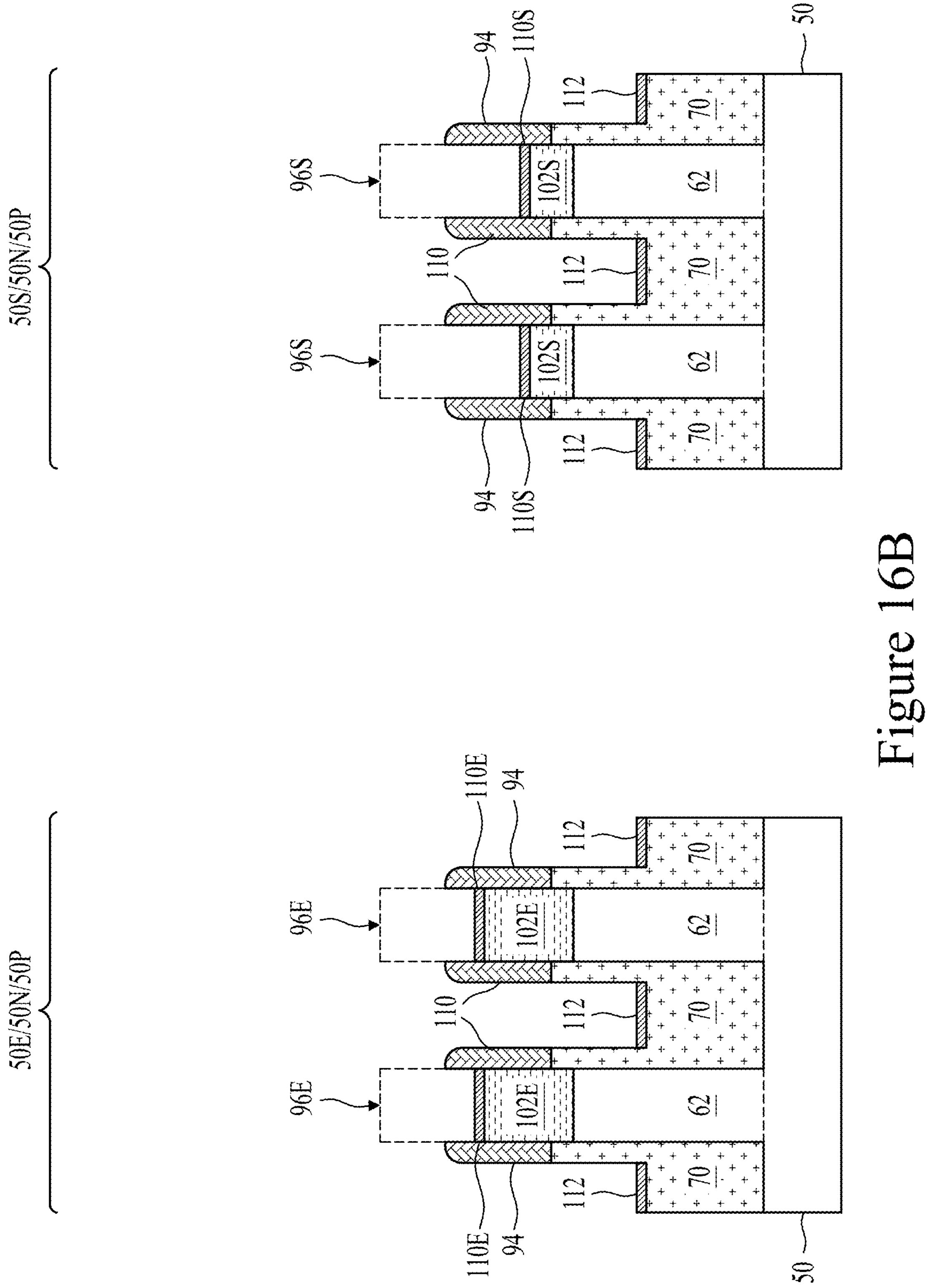
Figure 16C:
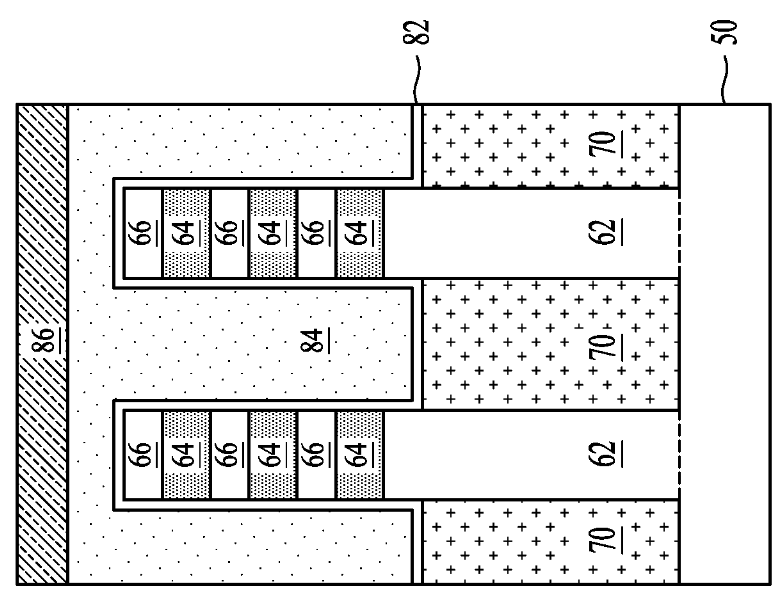
Figure 16C:
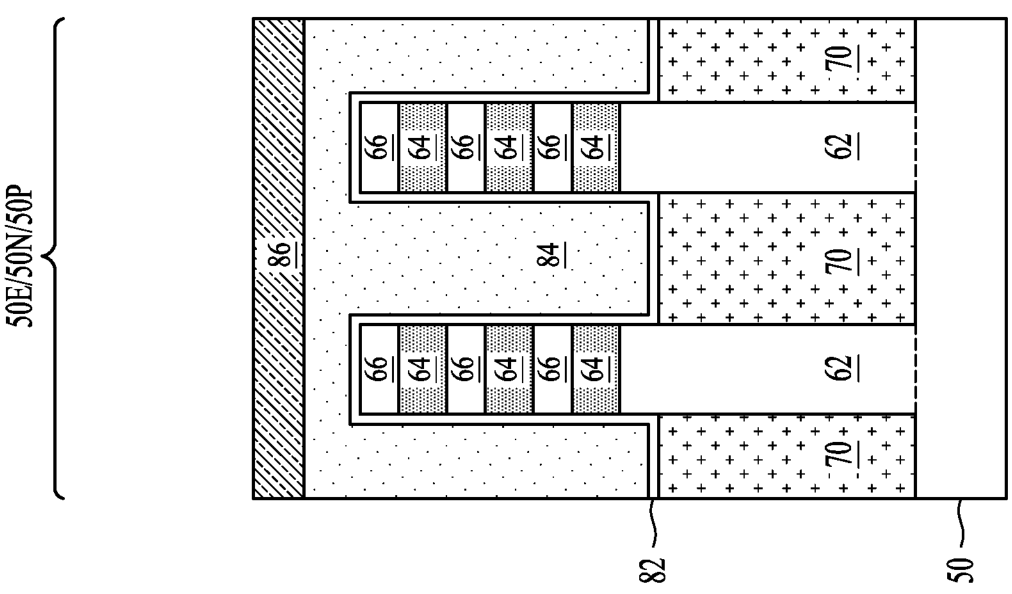

In FIGS. 16A-16C, bottom spacers 110 (including bottom spacers 110E in the high-efficiency region 50E and bottom spacers 1105 in the high-speed region 50S) are formed on the semiconductor layers 102 (including the semiconductor layers 102E and the semiconductor layers 102S). Additionally, bottom spacers 112 may also be formed on other horizontal surfaces, such as on portions of the STI regions 70 between the source/drain recesses 96. In some embodiments where the semiconductor layers 102S are not in contact with the sidewalls of the nanostructures 66, the bottom spacers 1105 are disposed beneath the top surfaces of the lower inner spacers 98 (e.g., the inner spacers 98 disposed closest to the substrate 50). Further, the bottom spacers 110E may be disposed above the top surfaces of the lower inner spacers 98. The bottom spacers 110, 112 may be formed by conformally forming one or more dielectric material(s) over the semiconductor layers 102, the fin spacers 94, the gate spacers 92, the STI regions and the masks 86 (if present) or the dummy gates 84, and then subsequently etching the dielectric material(s). Acceptable dielectric materials may include silicon nitride, silicon oxynitride, silicon oxycarbonitride, silicon oxycarbide, silicon carbonitride, silicon oxide, aluminum oxide, hafnium oxide, or the like, which may be formed by a deposition process such as chemical vapor deposition (CVD), atomic layer deposition (ALD), or the like. Any acceptable etch process, such as a dry etch, a wet etch, the like, or a combination thereof, may be performed to pattern the dielectric material(s). The etching may be anisotropic. The etching removes the vertical portions of the dielectric material(s). The dielectric material(s), when etched, have horizontal portions left on the top surfaces of the STI regions 70 and/or the semiconductor layers 102 (thus forming the bottom spacers 112 and/or the bottom spacers 110). The bottom spacers 110 may be thin, so as to not occupy excessive space in the source/drain recesses 96. In some embodiments, the thickness of the bottom spacers 110 is in the range of 3 nm to 5 nm.

Figure 17A:
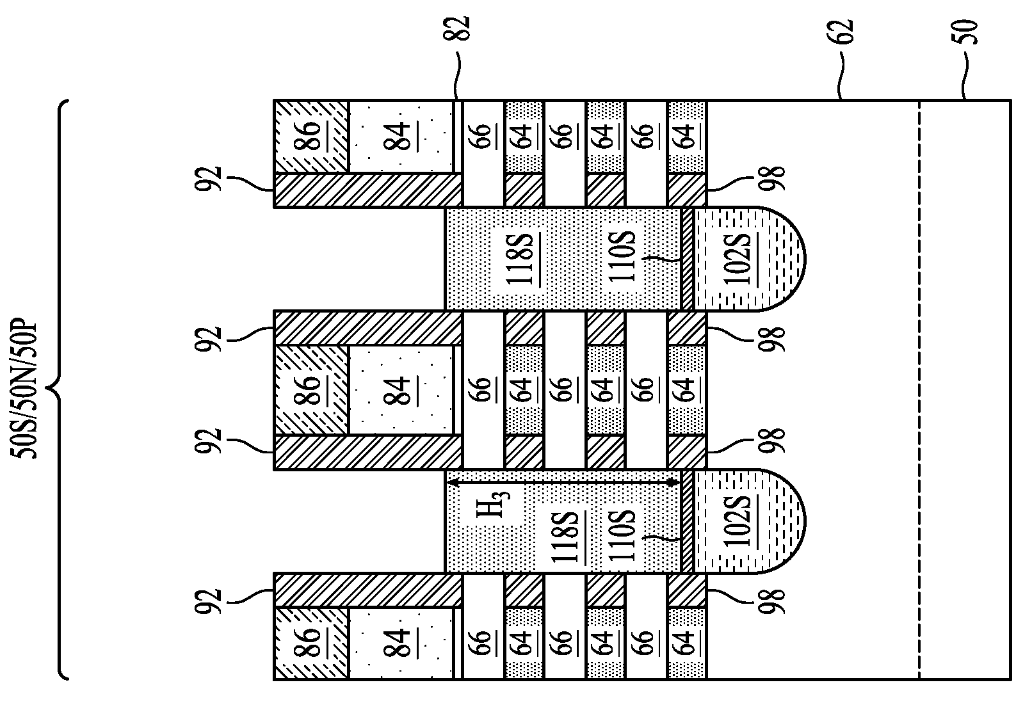
Figure 17A:
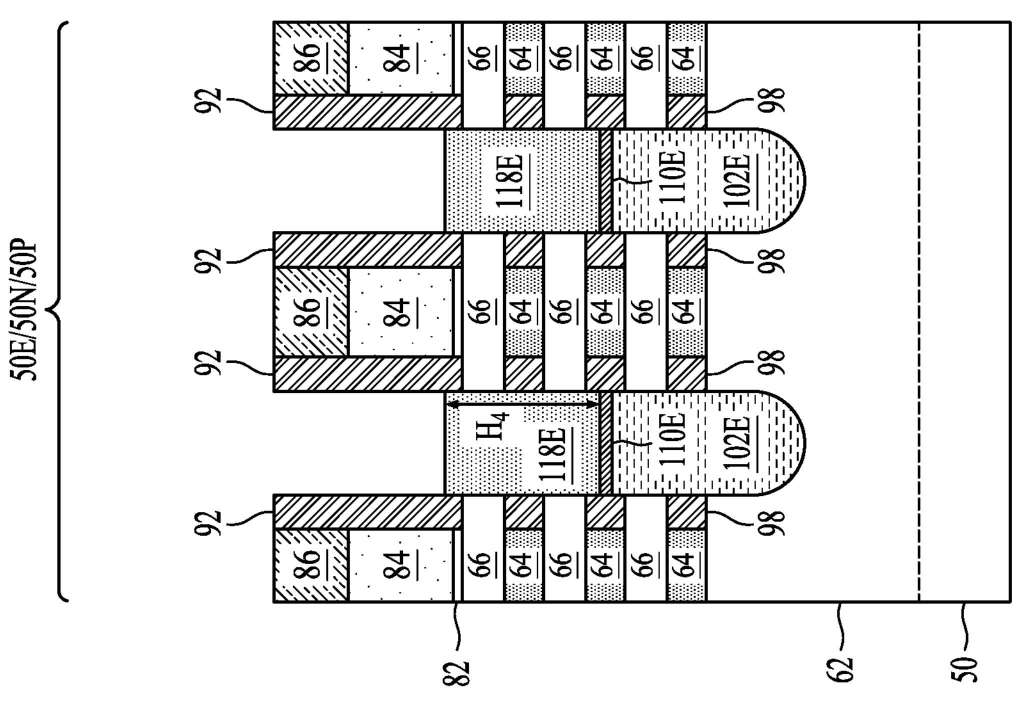
Figure 17B:
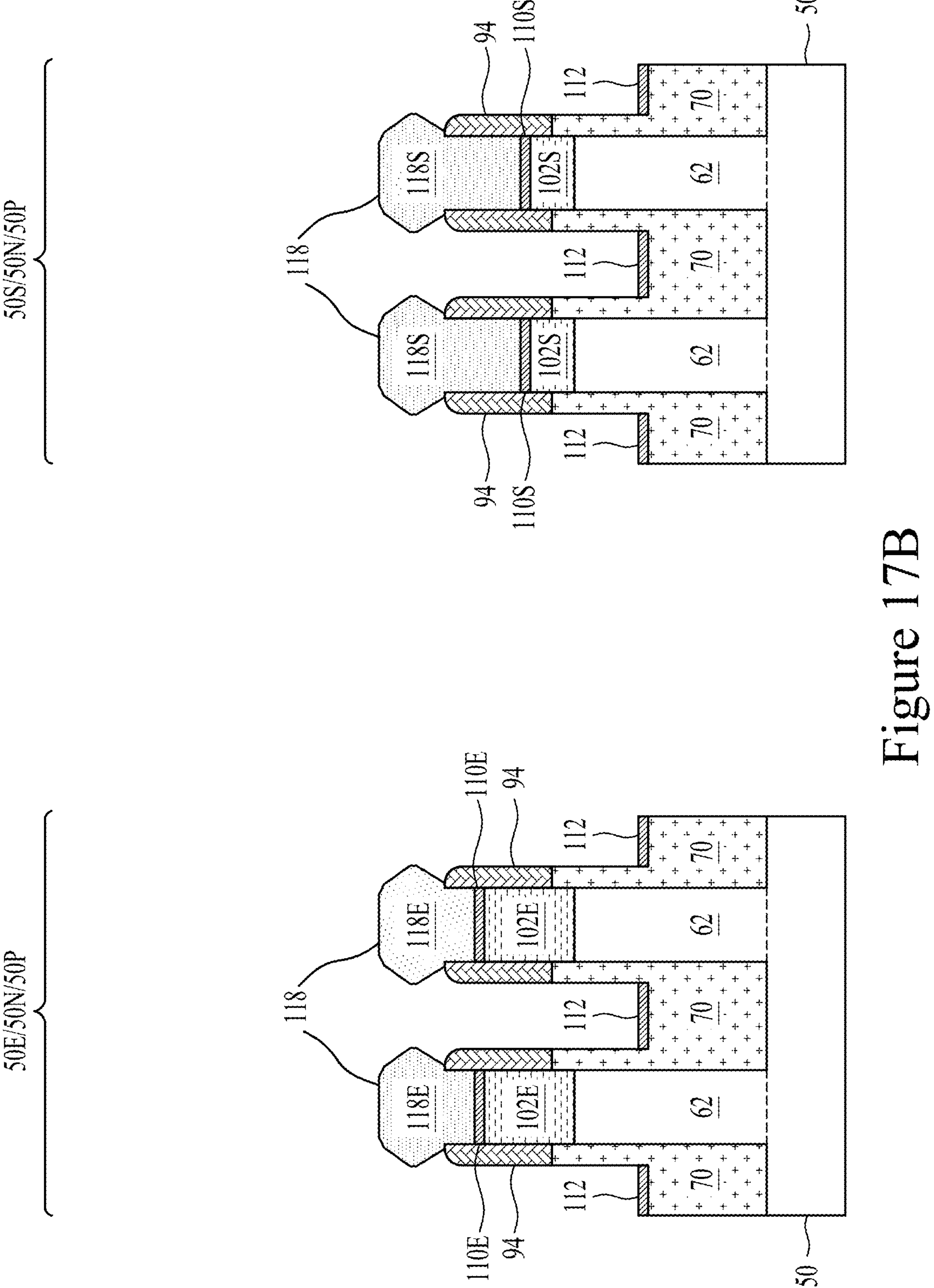
Figure 17C:
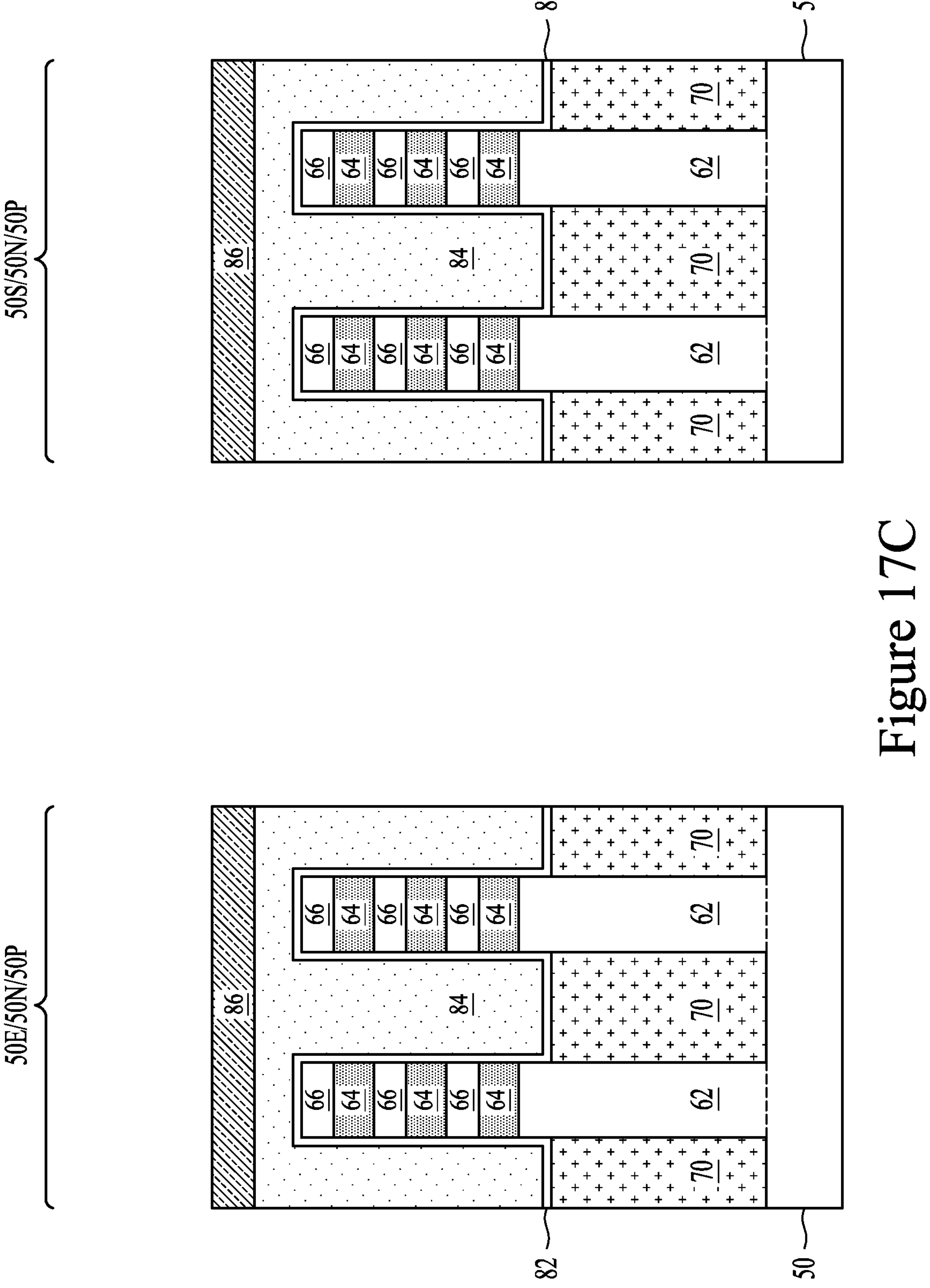

In FIGS. 17A-17C, epitaxial source/drain regions 118 (including epitaxial source/drain regions 118S in the high-speed region 50S and epitaxial source/drain regions 118E in the high-efficiency region 50E) are formed in the source/drain recesses 96. In some embodiments, the epitaxial source/drain regions 118 exert stress in the respective channel regions of the second nanostructures 66, thereby improving performance. The epitaxial source/drain regions 118 are formed in the source/drain recesses 96 such that each dummy gate 84 is disposed between respective neighboring pairs of the epitaxial source/drain regions 118. In some embodiments, the gate spacers 92 are used to separate the epitaxial source/drain regions 118 from the dummy gates 84 and the inner spacers 98 are used to separate the epitaxial source/drain regions 118 from the nanostructures 64 by an appropriate lateral distance so that the epitaxial source/drain regions 118 do not short out with subsequently formed gates of the resulting nano structure-FETs.

The epitaxial source/drain regions 118 in the n-type region 50N may be formed by an epitaxy process (subsequently described). The epitaxial source/drain regions 118 may include any acceptable material appropriate for n-type nanostructure-FETs. For example, if the second nanostructures 66 are formed of silicon, the epitaxial source/drain regions 118 may include materials exerting a tensile strain on the second nanostructures 66, such as silicon, silicon carbide, phosphorous doped silicon carbide, silicon phosphide, or the like. The epitaxial source/drain regions 118 in the n-type region 50N may be referred to as "n-type source/drain regions." The epitaxial source/drain regions 118 may have surfaces raised from respective upper surfaces of the nanostructures 64, 66 and may have facets.

The epitaxial source/drain regions 118 in the p-type region 50P may be formed by an epitaxy process (subsequently described). The epitaxial source/drain regions 118 may include any acceptable material appropriate for p-type nanostructure-FETs. For example, if the second nanostructures 66 are formed of silicon, the epitaxial source/drain regions 118 may comprise materials exerting a compressive strain on the first nanostructures 64, such as silicon-germanium, boron doped silicon-germanium, germanium, germanium tin, or the like. The epitaxial source/drain regions 118 in the p-type region 50P may be referred to as "p-type source/drain regions." The epitaxial source/drain regions 118 may also have surfaces raised from respective surfaces of the nanostructures 64, 66 and may have facets.

The epitaxial source/drain regions 118, the nanostructures 64, 66, and/or the fins 62 may be implanted with dopants to form source/drain regions, similar to the process previously discussed for forming lightly-doped source/drain regions, followed by an anneal. The source/drain regions may have an impurity concentration of between $10^{19}$ atoms/cm$^3$ and $10^{21}$ atoms/cm$^3$. The n-type and/or p-type impurities for source/drain regions may be any of the impurities previously discussed. In some embodiments, the epitaxial source/drain regions 118 may be in situ doped during growth.

As a result of the epitaxy processes used to form the epitaxial source/drain regions 118, upper surfaces of the epitaxial source/drain regions 118 have facets which expand laterally outward beyond sidewalls of the nanostructures 64, 66. In some embodiments, these facets cause adjacent epitaxial source/drain regions 118 of a same nanostructure-FET to merge, as illustrated by FIG. 1. In other embodiments, adjacent epitaxial source/drain regions 118 remain separated after the epitaxy process is completed, as illustrated by FIG. 17B. In the illustrated embodiments, the fin spacers 94 are formed on top surfaces of the STI regions 70, thereby blocking the epitaxial growth. In some other embodiments, the fin spacers 94 may cover portions of the sidewalls of the nanostructures 64, 66 and/or the fins 62, further blocking the epitaxial growth. In another embodiment, the spacer etch used to form the gate spacers 92 is adjusted to not form the fin spacers 94, so as to allow the epitaxial source/drain regions 118 to extend to the surface of the STI region 70.

The epitaxial source/drain regions 118 (including the epitaxial source/drain regions 118S in the high-speed region 50S and the epitaxial source/drain regions 118E in the high-efficiency region 50E) extend above the top surface of the nanostructures 66. As a result, the top surface of an epitaxial source/drain region 118 is disposed further from the substrate 50 than the top surface of the adjacent nanostructures 66. In some embodiments, the top surfaces of the epitaxial source/drain regions 118S are substantially coplanar (within process variations) with the top surfaces of the epitaxial source/drain regions 118E.

The bottom spacers 110 cover the semiconductor layers 102 so the epitaxial source/drain regions 118 are not grown from the semiconductor layers 102. Accordingly, the epitaxial source/drain regions 118 are electrically isolated from the semiconductor layers 102. The semiconductor layers 102 and the bottom spacers 110 are beneath the epitaxial source/drain regions 118. The bottom spacers 110 are between the semiconductor layers 102 and the epitaxial source/drain regions 118. Further, because the source/drain recesses 96S are deeper than the source/drain recesses 96E, the epitaxial source/drain regions 118S in the high-speed region 50S have a greater height than the epitaxial source/drain regions 118E in the high-efficiency region 50E. The height $H_3$ of the epitaxial source/drain regions 118S is greater than the height $H_4$ of the epitaxial source/drain regions 118E. In some embodiments, the height $H_3$ of the epitaxial source/drain regions 118S is in the range of 40 nm to 60 nm and the height $H_4$ of the epitaxial source/drain regions 118E is in the range of 25 nm to 45 nm.

As a result of the epitaxial source/drain regions 118S having a greater height than the epitaxial source/drain regions 118E, the epitaxial source/drain regions 118S contact the sidewalls of a greater quantity of nanostructures 66 than the epitaxial source/drain regions 118E. In this example, each epitaxial source/drain region 118S contacts the sidewalls of three nanostructures 66 beneath a dummy gate 84, while each epitaxial source/drain region 118E contacts the sidewalls of two nanostructures 66 beneath a dummy gate 84. Therefore, the devices formed in the high-speed region 50S have more channel regions than the devices formed in the high-efficiency region 50E. As a result, the devices in the high-speed region 50S have a larger effective work function than the devices in the high-efficiency region 50E, even though the nanostructures 64, 66 of the devices in the high-speed region 50S have the same dimensions (e.g., width and thickness) as the nanostructures 64, 66 of the devices in the high-efficiency region 50E. A hybrid logic cell may thus be formed while avoiding pattern loading effects. The nanostructures 64, 66 that underly the channel regions and do not contact the epitaxial source/drain regions 118 are unused dummy regions. Subsequently formed gate structures will wrap around the channel regions and the dummy regions of the nanostructures.

In this embodiment, the epitaxial source/drain regions 118 extend across an entirety of the top surfaces of the bottom spacers 110. In another embodiment (subsequently described), voids are formed beneath the epitaxial source/drain regions 118, such that portions of the top surfaces of the bottom spacers 110 are exposed to the voids. The voids may be formed during epitaxial growth when the epitaxial source/drain regions 118 merge before the lower portions of the source/drain recesses 96 are completely filled.

Figure 18:
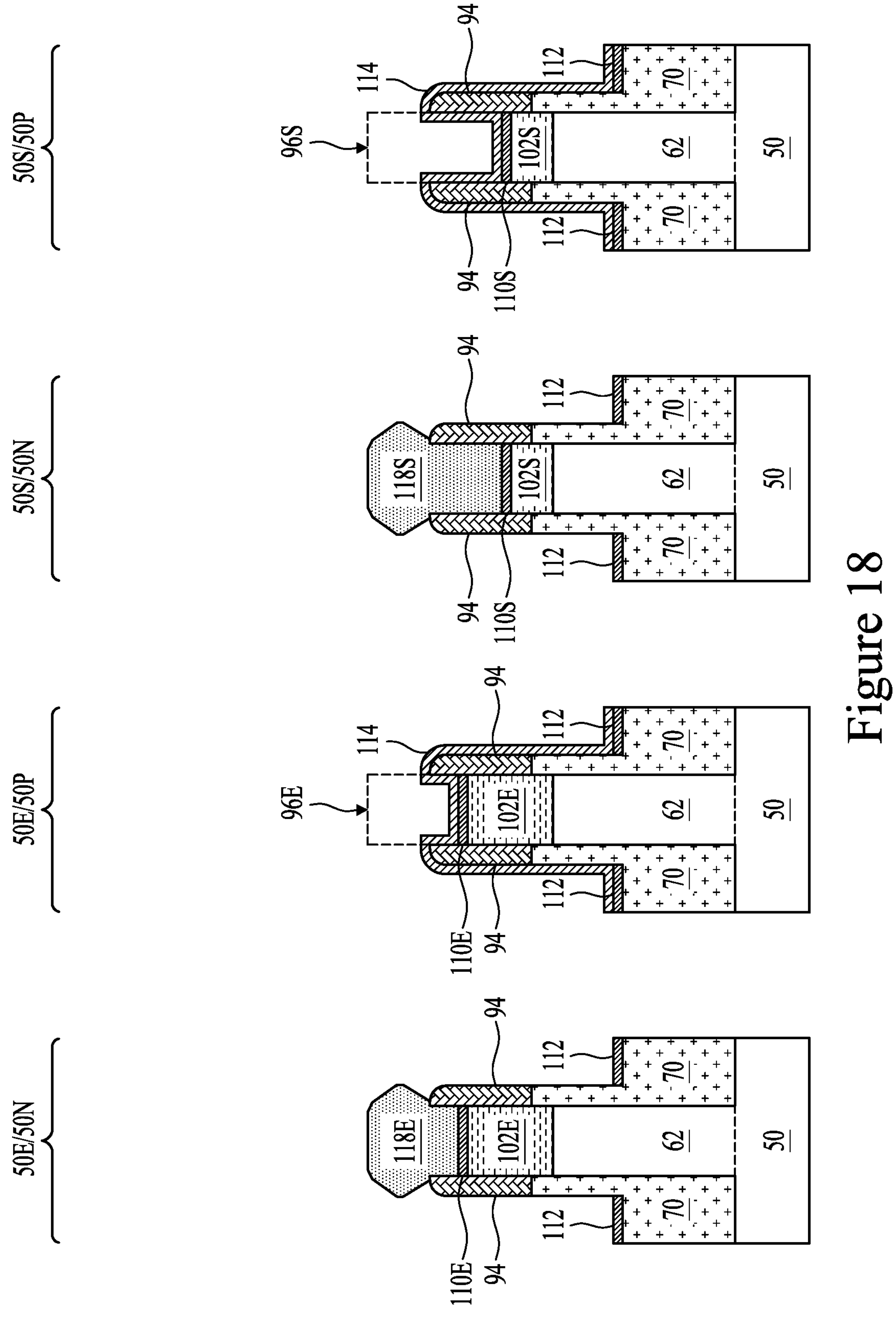
Figure 19:
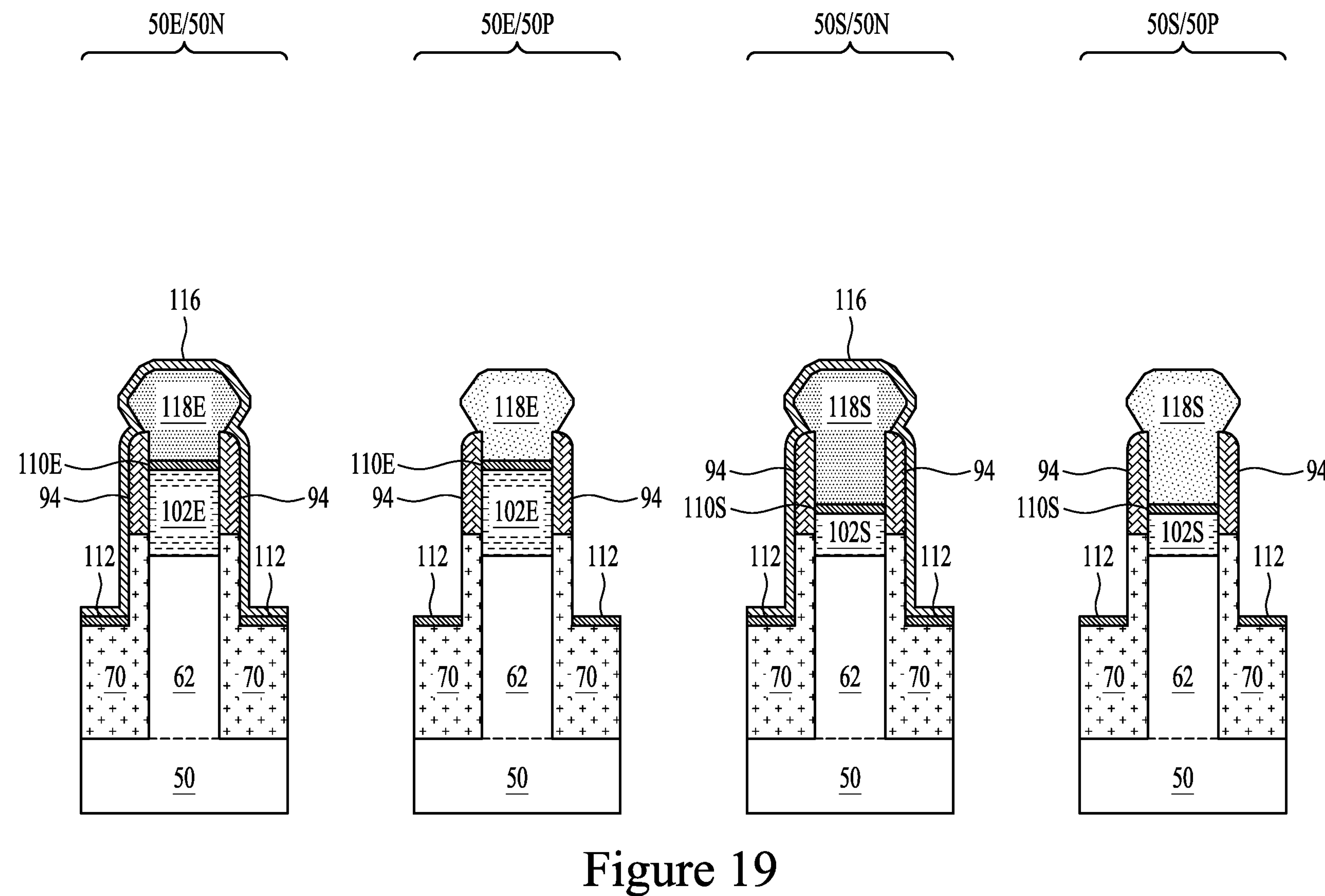
Figure 20A:
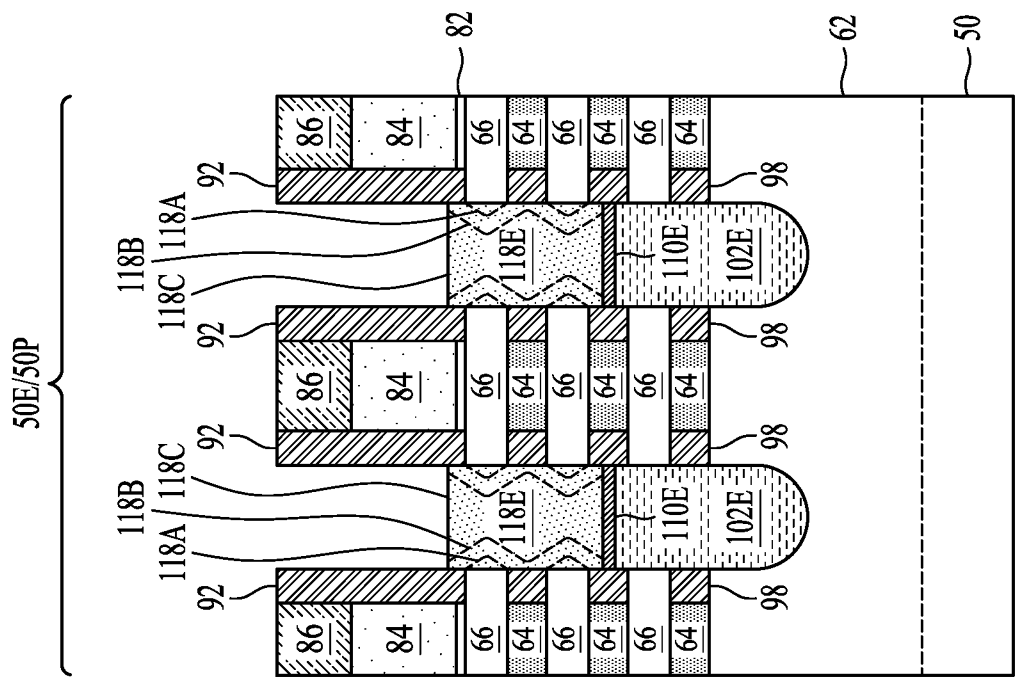
Figure 20A:
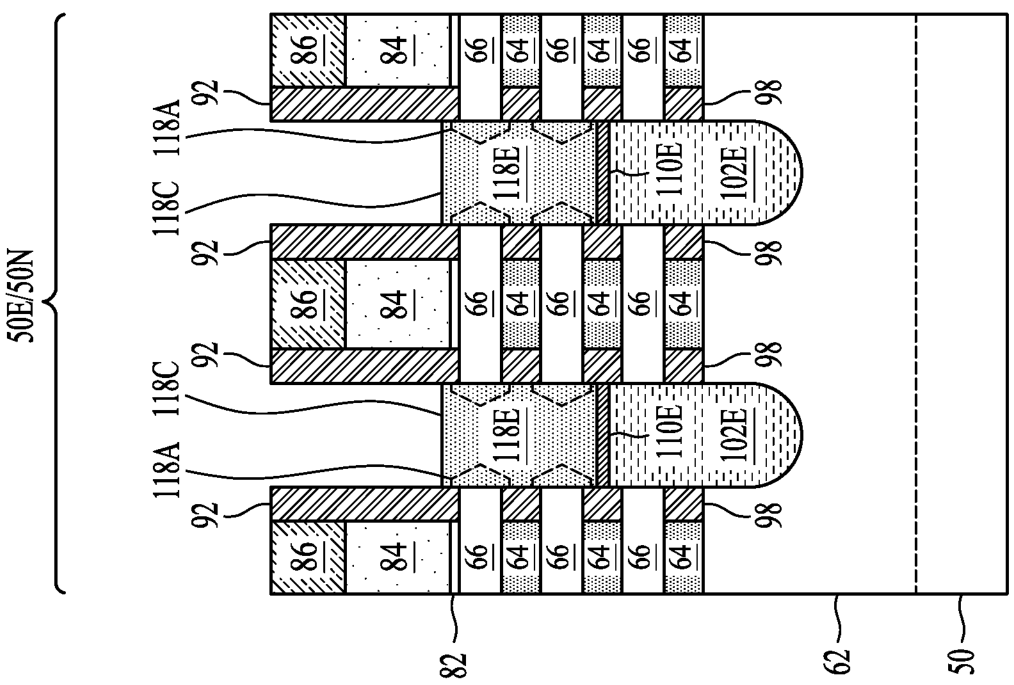
Figure 20B:
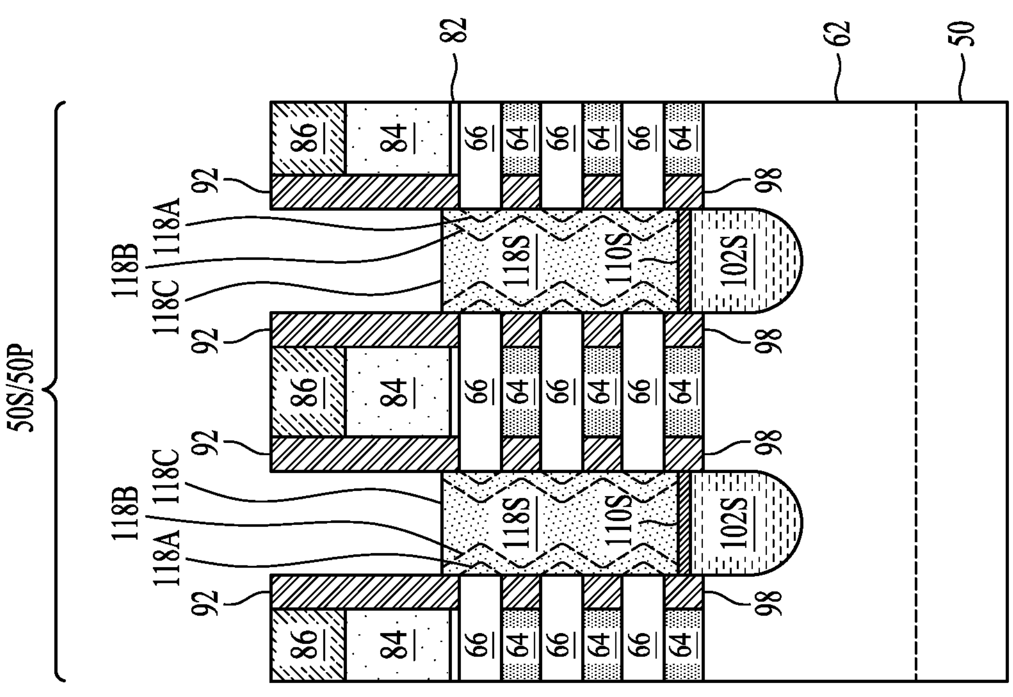
Figure 20B:
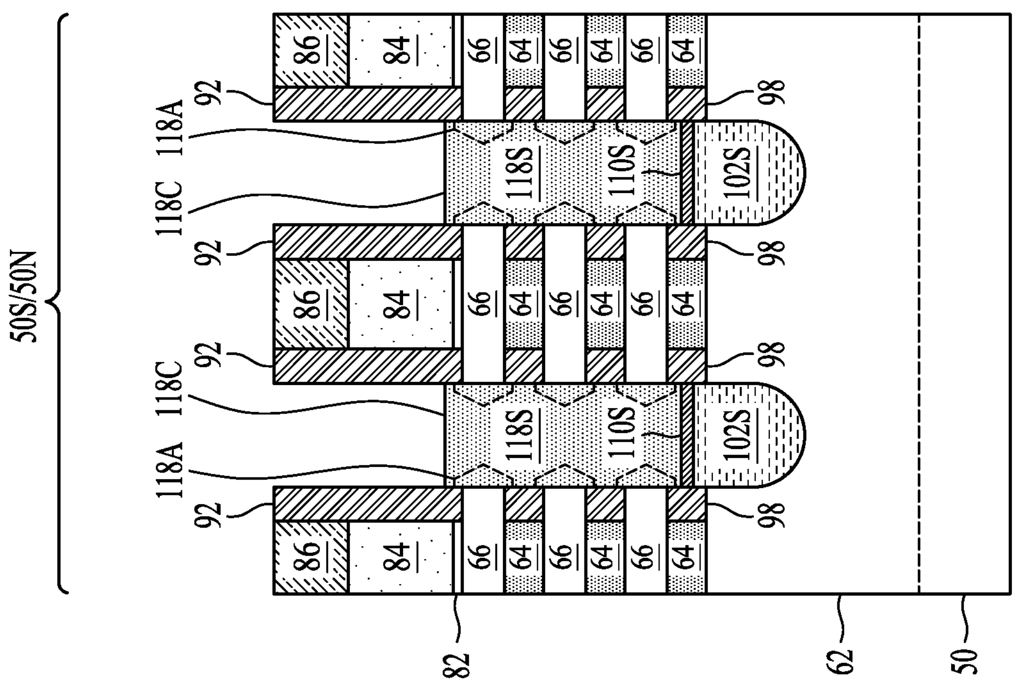

FIGS. 18-19 illustrate steps in the forming of epitaxial source/drain regions 118 in the source/drain recesses 96. The forming of an epitaxial source/drain region 118E in the n-type region 50N, an epitaxial source/drain region 118S in the n-type region 50N, an epitaxial source/drain region 118E in the p-type region 50P, and an epitaxial source/drain region 118S in the p-type region 50P are illustrated.

In FIG. 18, a mask 114 is formed to mask the p-type region 50P. For example, a mask layer may be formed over the bottom spacers 110, the fin spacers 94, the gate spacers 92, the STI regions 70, and the masks 86 (if present) or the dummy gates 84 in the n-type region 50N and the p-type region 50P. The mask layer is patterned to expose the n-type region 50N. The mask layer may be formed of a hard mask material, such as aluminum oxide, silicon carbide, titanium nitride, or the like, which may be formed by a deposition process such as chemical vapor deposition (CVD), atomic layer deposition (ALD), or the like. The mask layer can be patterned using acceptable photolithography and etching techniques to form the mask 114. In other embodiments, another type of mask, such as a photoresist, may be utilized.

Then, the epitaxial source/drain regions 118 are epitaxially grown in the source/drain recesses 96 in the n-type region 50N. The mask 114 substantially prevents growth in the p-type region 50P. The epitaxy processes used to form the epitaxial source/drain regions 118 are performed so that the epitaxial source/drain regions 118 are selectively grown from semiconductor features (e.g., the nanostructures 66) and do not grow from dielectric features (e.g., the bottom spacers 110). The epitaxial source/drain regions 118 may be grown by flowing a semiconductor-containing precursor, an etchant-containing precursor, and a dopant-containing precursor in the source/drain recesses 96. The semiconductor-containing precursor and the etchant-containing precursor may be selected from, respectively, the same semiconductor-containing precursors and etchant-containing precursors for growing the semiconductor layers 102, or may include different precursors. The dopant-containing precursor contains an appropriate dopant for n-type source/drain regions, such as an arsenic-containing precursor such as arsine ($AsH_3$), a phosphorus-containing precursor such as diphosphine ($P_2H_6$) or phosphane ($PH_3$), or the like. The etchant-containing precursor may be flowed at a slower flow rate when growing the epitaxial source/drain regions 118 than when growing the semiconductor layers 102, which may cause the epitaxial source/drain regions 118 to be grown in more of a lateral manner than a bottom-up manner. In some embodiments, the semiconductor-containing precursor is flowed at a flow rate in the range of 0 sccm to 1000 sccm, the etchant-containing precursor is flowed at a flow rate in the range of 0 sccm to 1000 sccm, and the dopant-containing precursor is flowed at a flow rate in the range of 0 sccm to 1000 sccm. The epitaxy process for the epitaxial source/drain regions 118 may have a faster lateral growth rate and a slower bottom-up growth rate than the epitaxy process for the semiconductor layers 102. As such, the epitaxial source/drain regions 118 may grow laterally from the nanostructures 66. In some embodiments, the epitaxial growth is performed at a temperature in the range of 400° C. to 900° C., and at a pressure in the range of 1 Torr to 500 Torr.

After growth of the epitaxial source/drain regions 118 in the n-type region the mask 114 is removed. The mask 114 may be removed with any acceptable etch process that is selective to the mask 114 (e.g., selectively etches the material of the mask 114 at a faster rate than the material of the epitaxial source/drain regions 118). The etch process may be isotropic. For example, when the mask 114 is formed of aluminum oxide, the etch process may be a wet etch using ammonium hydroxide ($NH_4OH$), dilute hydrofluoric (dHF) acid, or the like.

In FIG. 19, a mask 116 is formed to mask the n-type region 50N. For example, a mask layer may be formed over the epitaxial source/drain regions 118, the bottom spacers 110, the fin spacers 94, the gate spacers 92, the STI regions 70, and the masks 86 (if present) or the dummy gates 84 in the p-type region 50P and the n-type region 50N. The mask layer is patterned to expose the p-type region 50P. The mask layer may be formed of a hard mask material, such as aluminum oxide, silicon carbide, titanium nitride, or the like, which may be formed by a deposition process such as chemical vapor deposition (CVD), atomic layer deposition (ALD), or the like. The mask layer can be patterned using acceptable photolithography and etching techniques to form the mask 116. In other embodiments, another type of mask, such as a photoresist, may be utilized.

Then, the epitaxial source/drain regions 118 are epitaxially grown in the source/drain recesses 96 in the p-type region 50P. The mask 116 substantially prevents growth in the n-type region 50N. The epitaxy processes used to form the epitaxial source/drain regions 118 are performed so that the epitaxial source/drain regions 118 are selectively grown from semiconductor features (e.g., the nanostructures 66) and do not grow from dielectric features (e.g., the bottom spacers 110). The epitaxial source/drain regions 118 may be grown by flowing a semiconductor-containing precursor, an etchant-containing precursor, and a dopant-containing precursor in the source/drain recesses 96. The semiconductor-containing precursor and the etchant-containing precursor may be selected from, respectively, the same semiconductor-containing precursors and etchant-containing precursors for growing the semiconductor layers 102, or may include different precursors. The dopant-containing precursor contains an appropriate dopant for p-type source/drain regions, such as a boron-containing precursor, such as diborane ($B_2H_6$), borane ($BH_3$), or the like. The etchant-containing precursor may be flowed at a slower flow rate when growing the epitaxial source/drain regions 118 than when growing the semiconductor layers 102, which may cause the epitaxial source/drain regions 118 to be grown in more of a lateral manner than a bottom-up manner. In some embodiments, the semiconductor-containing precursor is flowed at a flow rate in the range of 0 sccm to 1000 sccm, the etchant-containing precursor is flowed at a flow rate in the range of 0 sccm to 1000 sccm, and the dopant-containing precursor is flowed at a flow rate in the range of 0 sccm to 1000 sccm. The epitaxy process for the epitaxial source/drain regions 118 may have a faster lateral growth rate and a slower bottom-up growth rate than the epitaxy process for the semiconductor layers 102. As such, the epitaxial source/drain regions 118 may grow laterally from the nanostructures 66. In some embodiments, the epitaxial growth is performed at a temperature in the range of 400° C. to 900° C., and at a pressure in the range of 1 Torr to 150 Torr.

After growth of the epitaxial source/drain regions 118 in the p-type region 50P, the mask 116 is removed. The mask 116 may be removed with any acceptable etch process that is selective to the mask 116 (e.g., selectively etches the material of the mask 116 at a faster rate than the material of the epitaxial source/drain regions 118). The etch process may be isotropic. For example, when the mask 116 is formed of aluminum oxide, the etch process may be a wet etch using ammonium hydroxide ($NH_4OH$), dilute hydrofluoric (dHF) acid, or the like.

The epitaxial source/drain regions 118 may comprise one or more semiconductor material layers. For example, the epitaxial source/drain regions 118 may comprise a liner layer, a main layer, and a finishing layer (or more generally, a first semiconductor material layer, a second semiconductor material layer, and a third semiconductor material layer). Each of the liner layer, the main layer, and the finishing layer may be formed of different semiconductor materials and may be doped to different dopant concentrations. In some embodiments, the liner layer may have a dopant concentration less than the main layer and greater than the finishing layer. In embodiments in which the epitaxial source/drain regions 118 include three semiconductor material layers, the liner layers may be grown in the source/drain recesses 96, the main layers may be grown on the liner layers, and the finishing layers may be grown on the main layers. Any number of semiconductor material layers may be used for the epitaxial source/drain regions 118. In some embodiments, the epitaxial source/drain regions 118 in the n-type region 50N include liner layers 118A on the nanostructures 66 and fill layers 118C on the liner layers 118A, as demonstrated in FIGS. 20A-20B. In some embodiments, the epitaxial source/drain regions 118 in the p-type region 50P include liner layers 118A on the nanostructures 66, liner layers 118B on the liner layers 118A, and fill layers 118C on the liner layers 118B, as demonstrated in FIGS. 20A-20B.

Figure 21A:
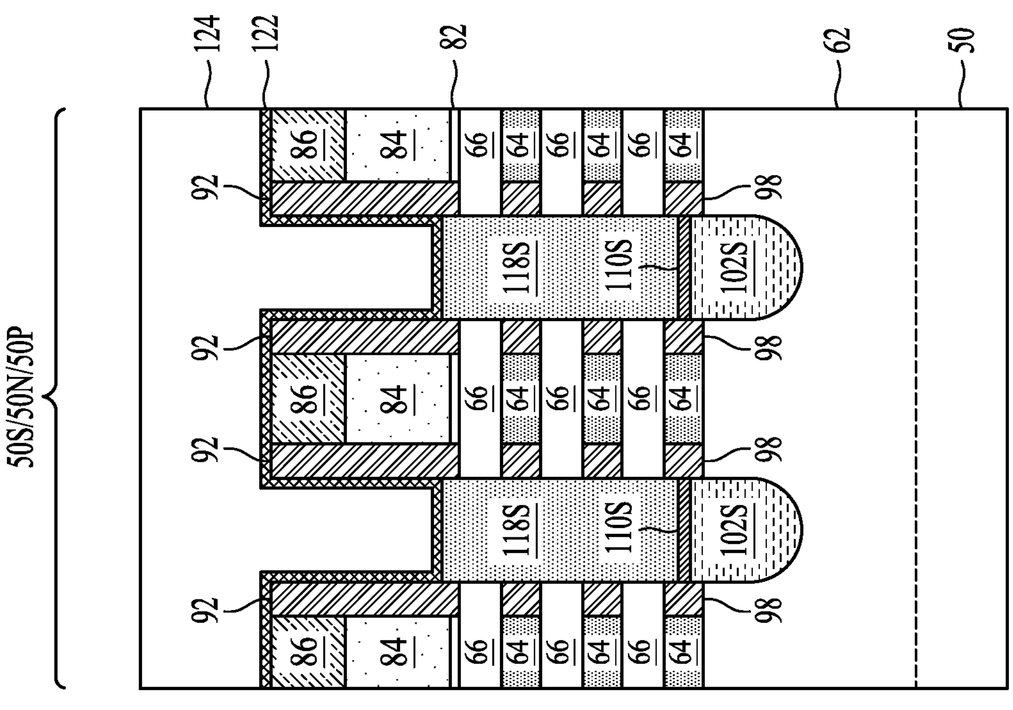
Figure 21A:
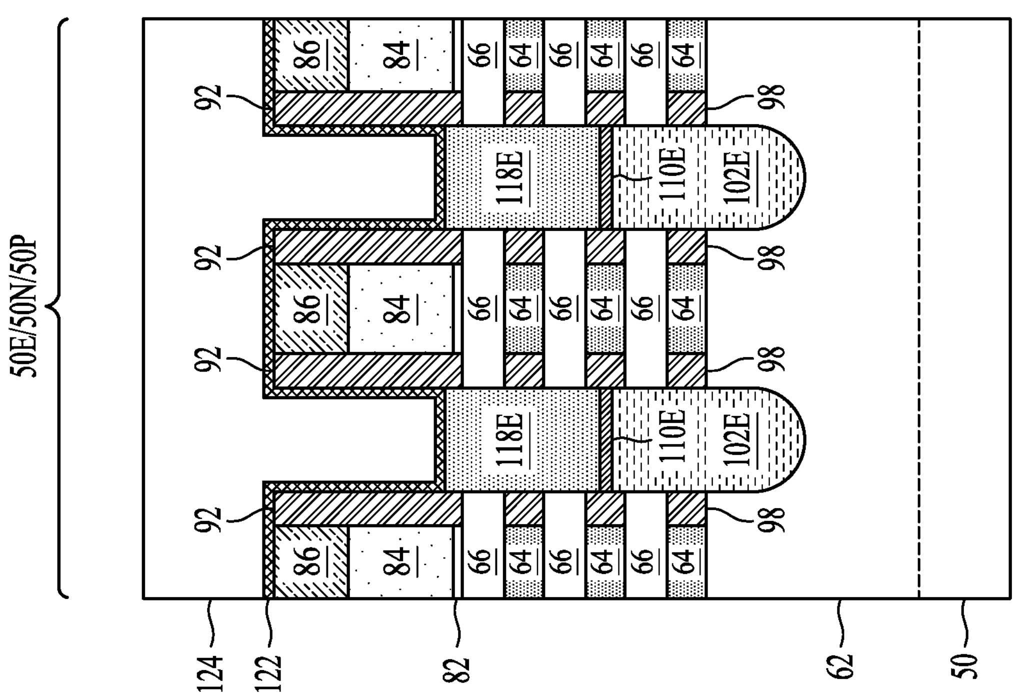
Figure 21B:
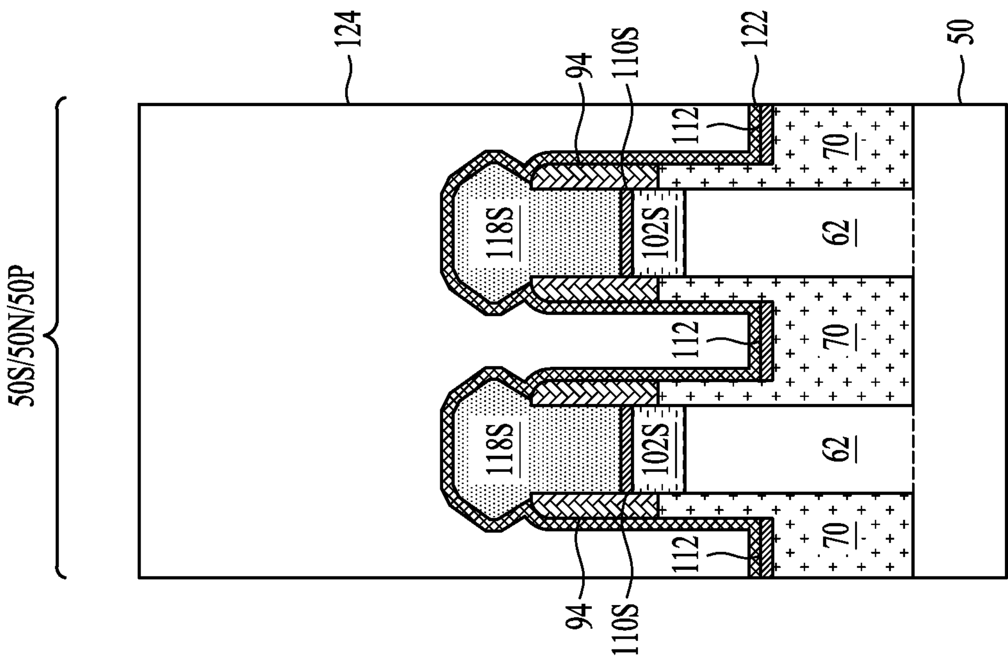
Figure 21C:
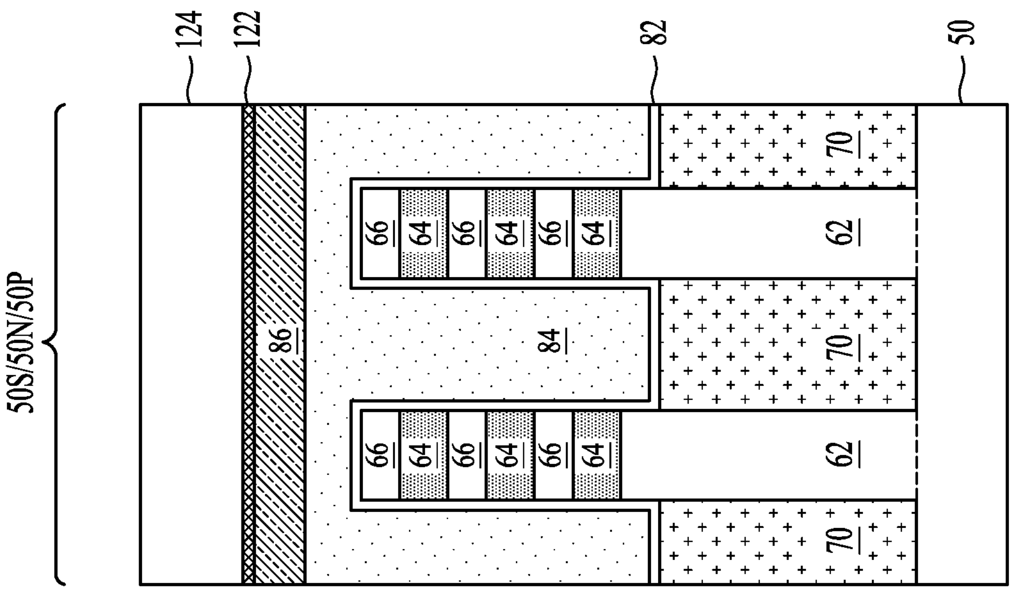
Figure 21C:
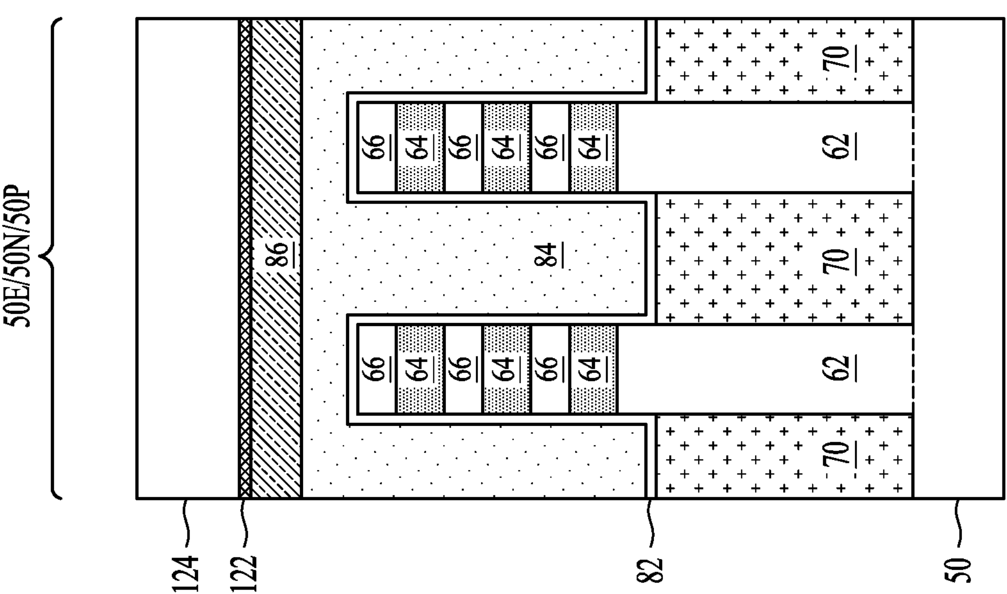

In FIGS. 21A-21C, a first ILD 124 is deposited over the epitaxial source/drain regions 118, the bottom spacers 112, the fin spacers 94, the gate spacers 92, and the masks 86 (if present) or the dummy gates 84. The first ILD 124 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 122 is formed between the first ILD 124 and the epitaxial source/drain regions 118, the bottom spacers 112, the fin spacers 94, the gate spacers 92, and the masks 86 (if present) or the dummy gates 84. The CESL 122 may be formed of a dielectric material having a high etching selectivity from the etching of the first ILD 124, such as, silicon nitride, silicon oxide, silicon oxynitride, or the like, which may be formed by any suitable deposition process, such as CVD, ALD, or the like.

Figure 22A:
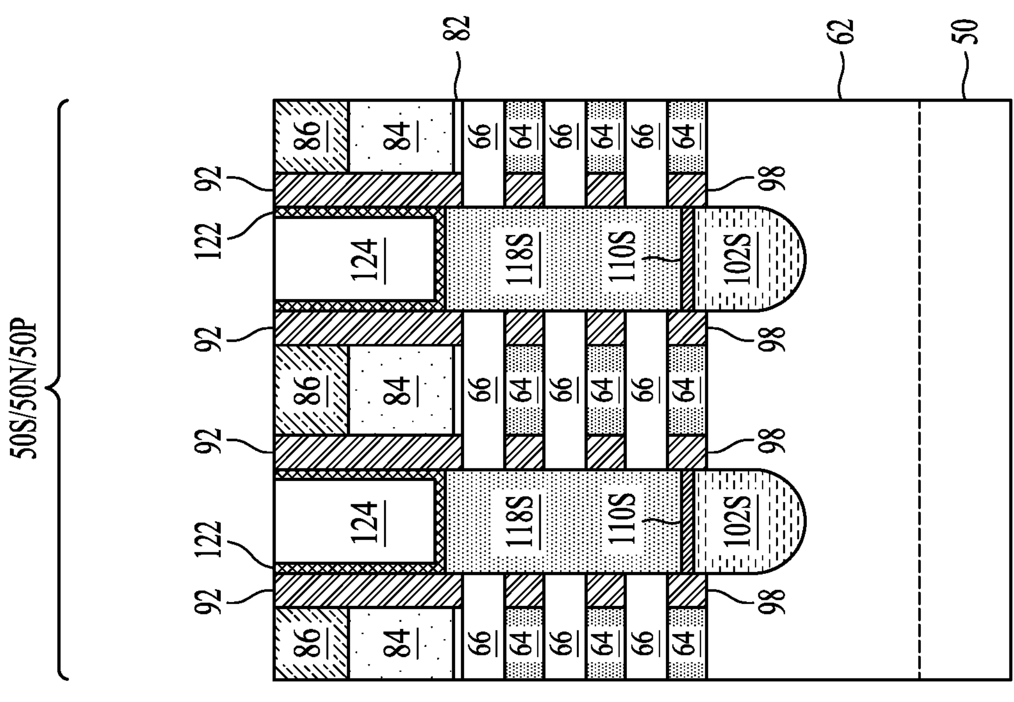
Figure 22A:
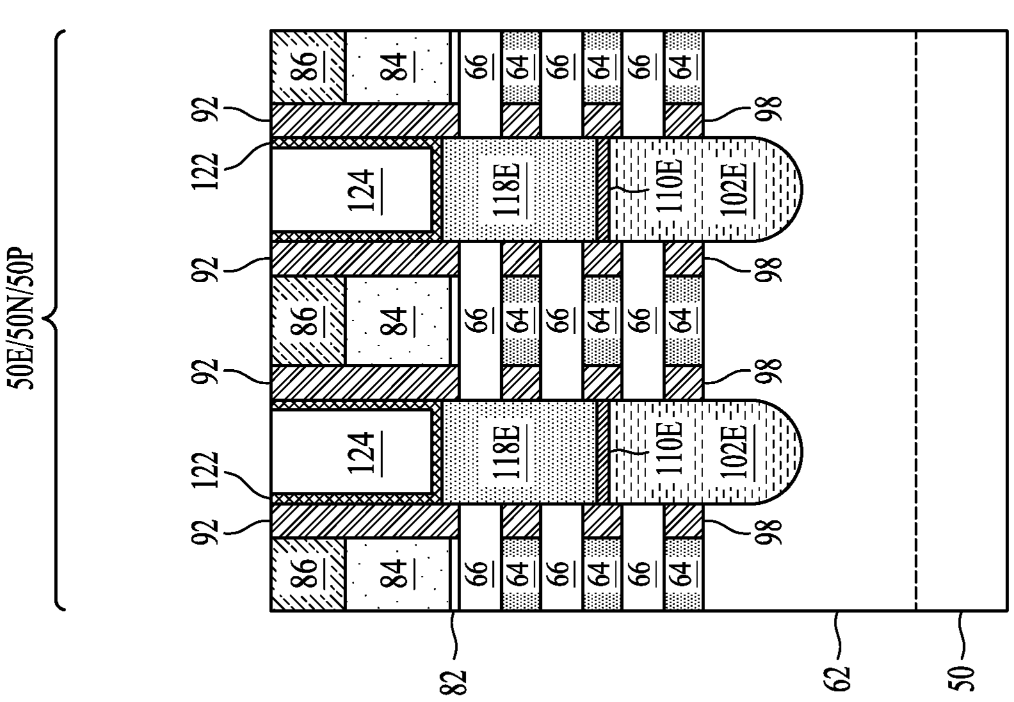
Figure 22B:
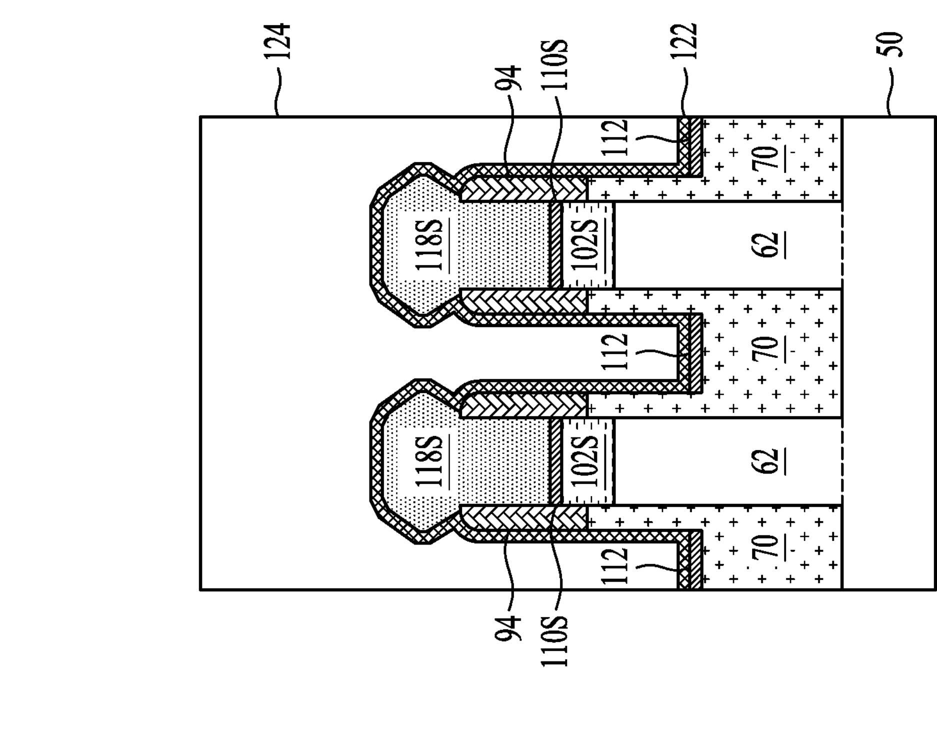
Figure 22C:
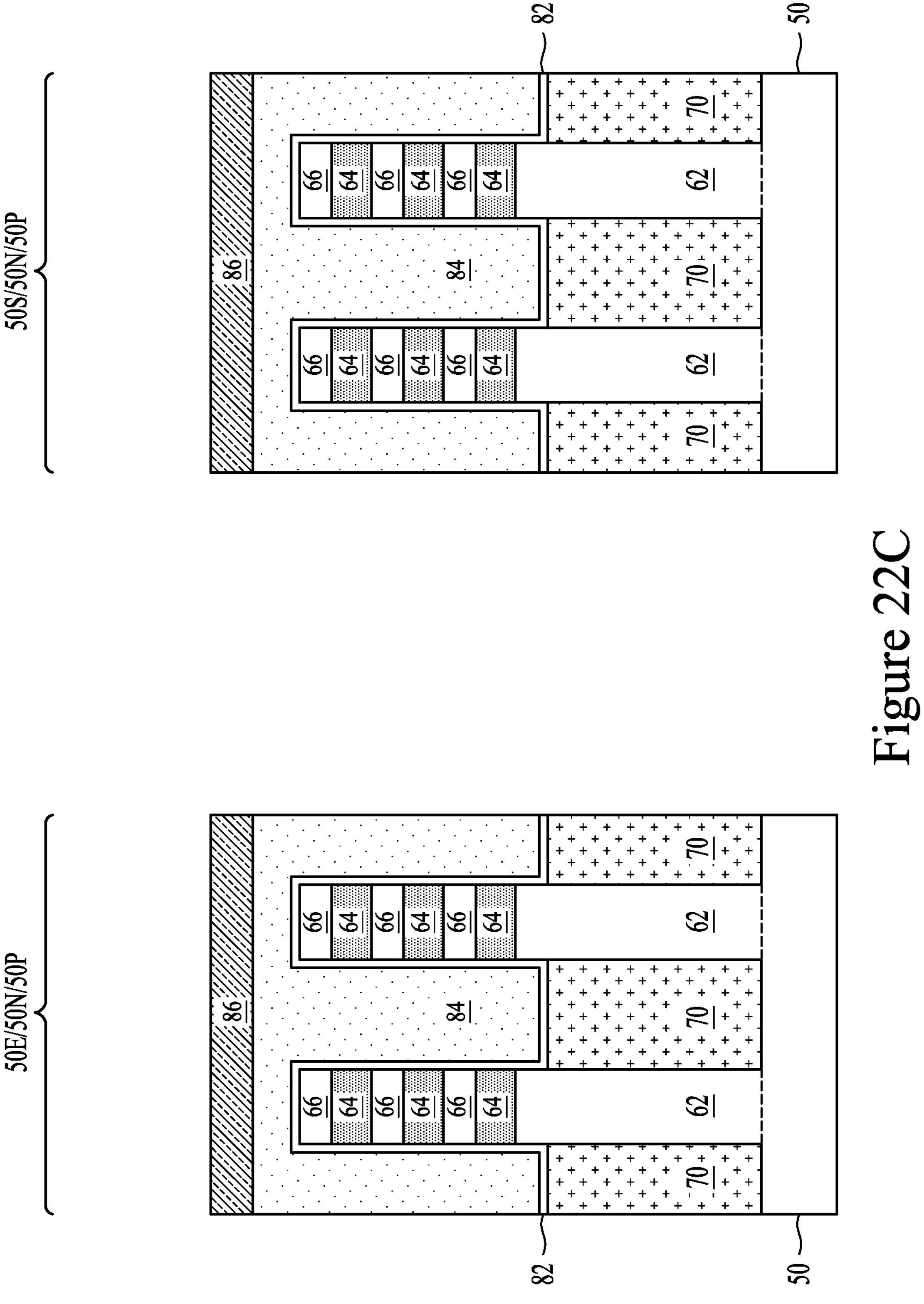

In FIGS. 22A-22C, a removal process is performed to level the top surfaces of the first ILD 124 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, top surfaces of the first ILD 124, the gate spacers 92, and the masks 86 (if present) or the dummy gates 84 are substantially coplanar (within process variations). Accordingly, the top surfaces of the masks 86 (if present) or the dummy gates 84 are exposed through the first ILD 124.

Figure 23A:
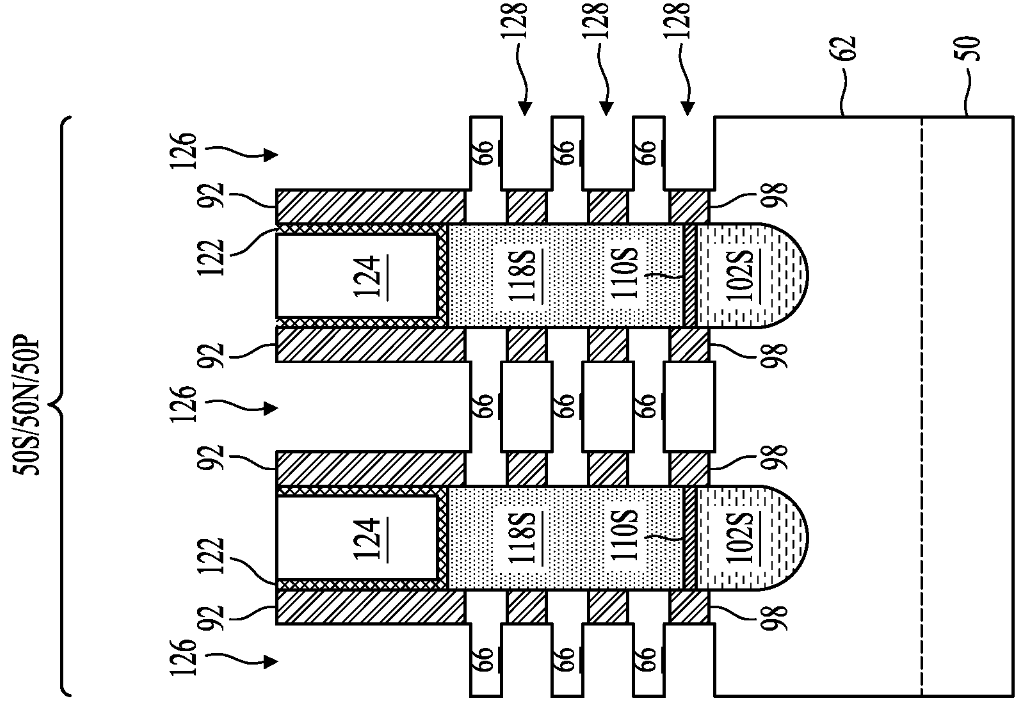
Figure 23A:
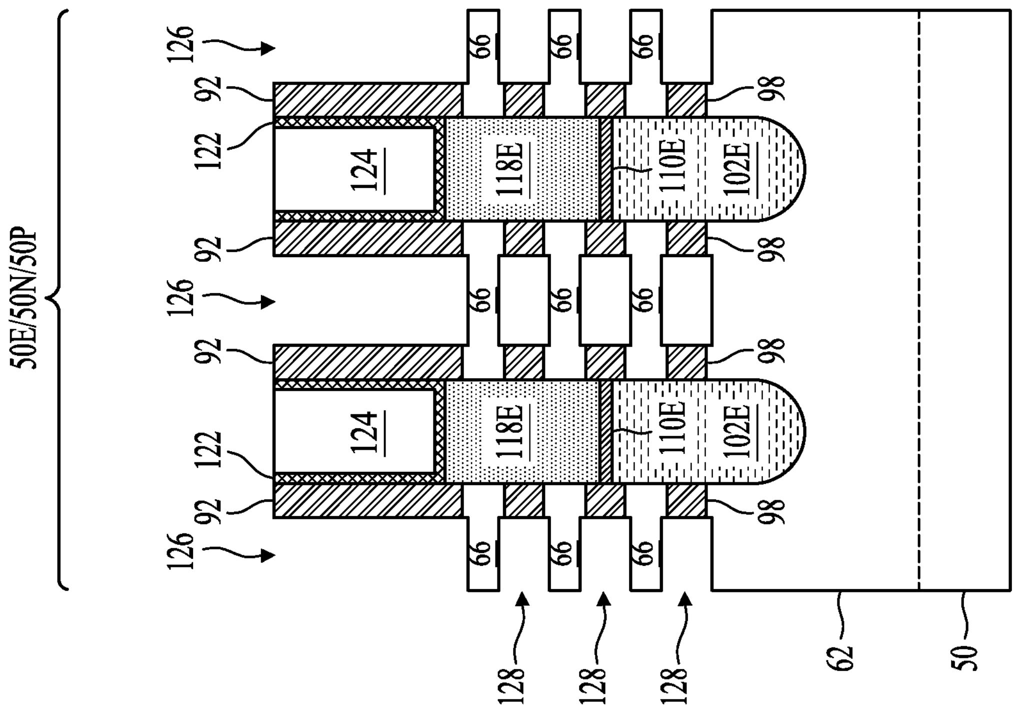
Figure 23B:
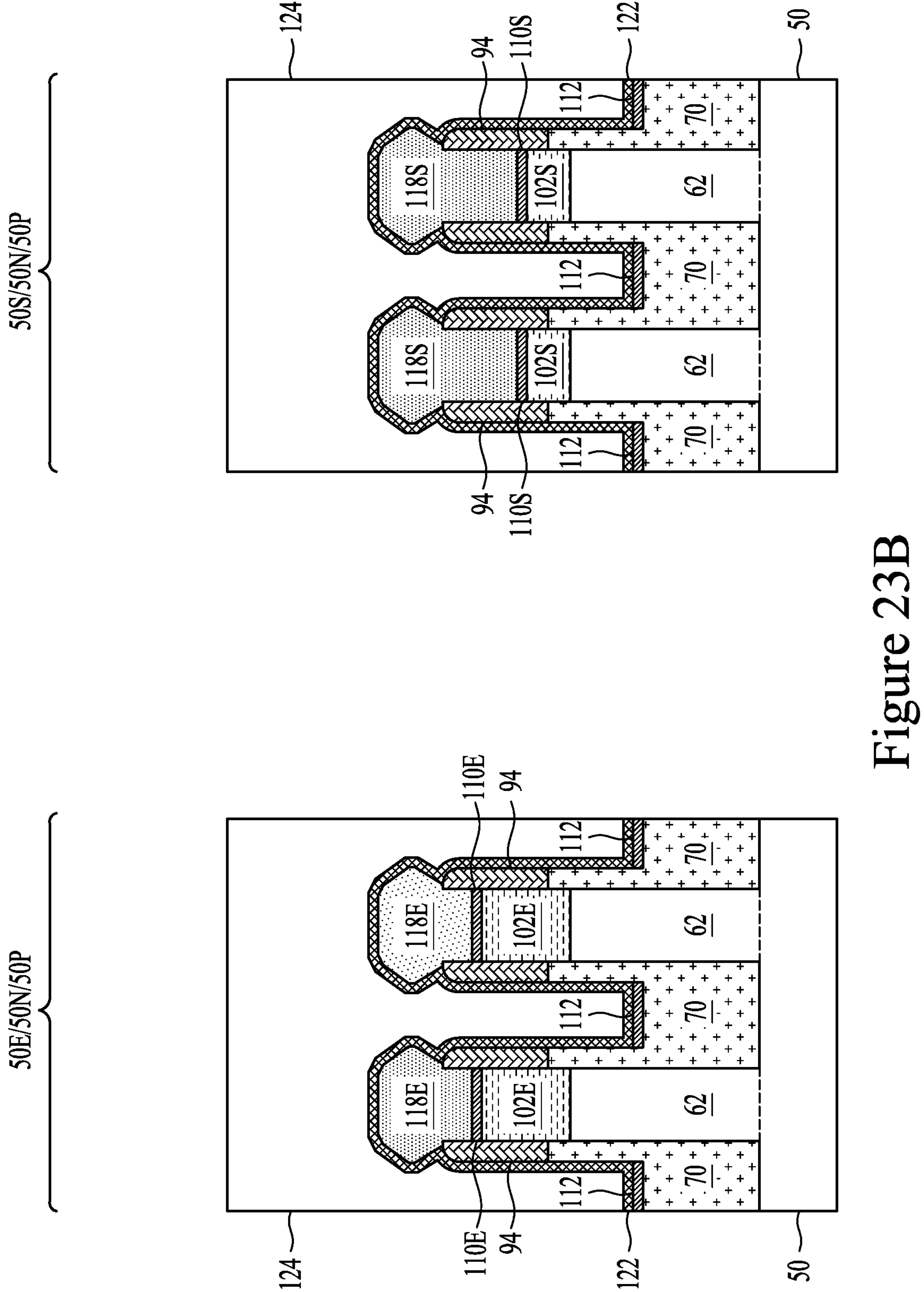
Figure 23C:
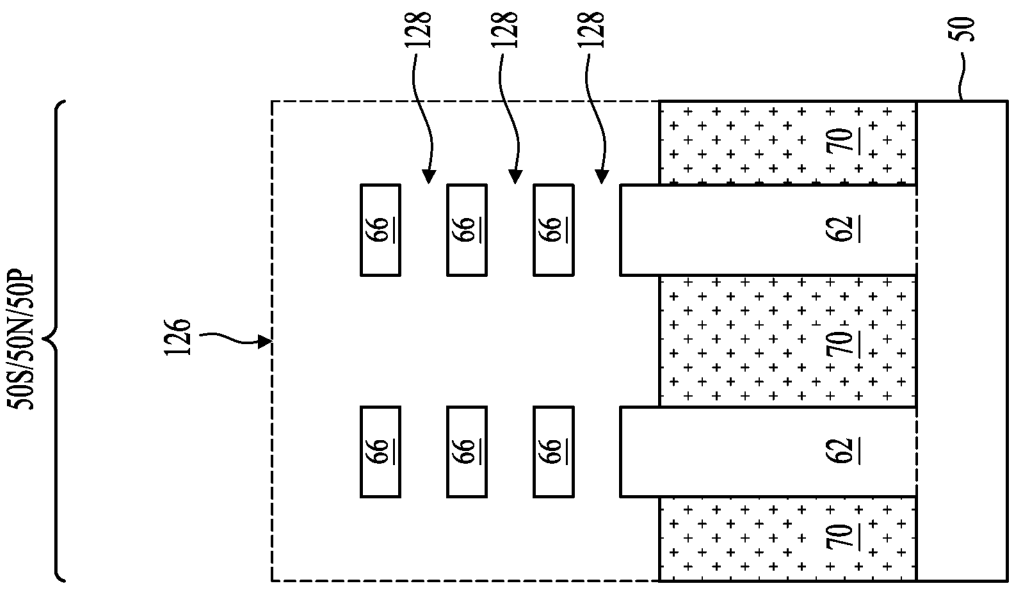
Figure 23C:
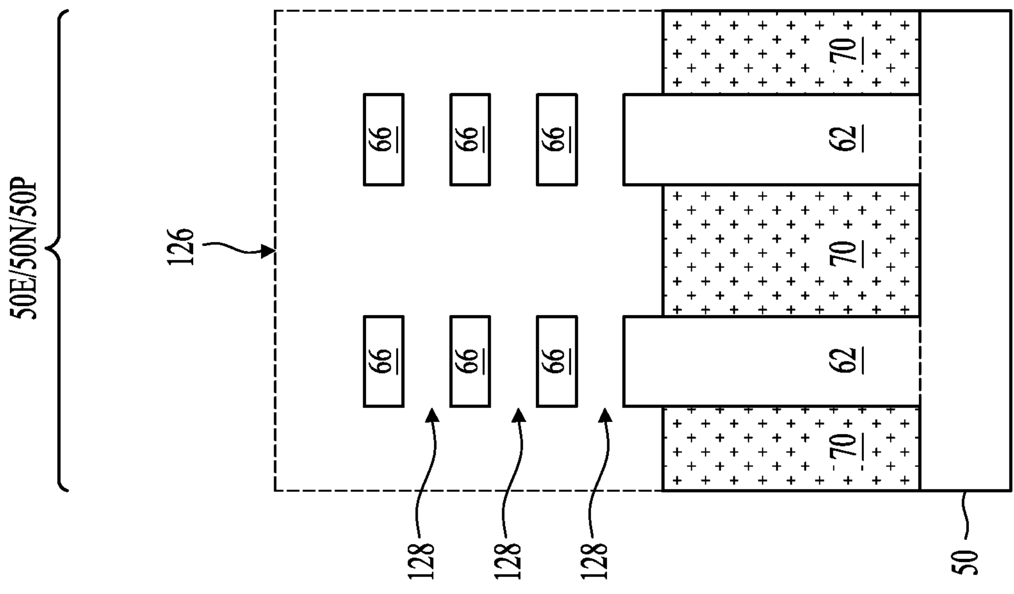

In FIGS. 23A-23C, the masks 86 (if present) and the dummy gates 84 are removed in one or more etching steps, so that recesses 126 are formed between the gate spacers 92. Portions of the dummy dielectrics 82 in the recesses 126 are also removed. In some embodiments, the dummy gates 84 and the dummy dielectrics 82 are removed by an anisotropic dry etch process. For example, the etching process may include a dry etch process using reaction gas(es) that selectively etch the material of the dummy gates 84 at a faster rate than the materials of the first ILD 124 and the gate spacers 92. Each recesses 126 exposes and/or overlies portions of nanostructures 64, 66, which act as the channel regions in subsequently completed nanostructure-FETs. Portions of the nanostructures 64, 66 which act as the channel regions are disposed between neighboring pairs of the epitaxial source/drain regions 118. Portions of the nanostructures 64, 66 which are dummy regions are disposed between neighboring pairs of the semiconductor layers 102. During the removal, the dummy dielectrics 82 may be used as etch stop layers when the dummy gates 84 are etched. The dummy dielectrics 82 may then be removed after the removal of the dummy gates 84.

The remaining portions of the first nanostructures 64 are then removed to form openings 128 in regions between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66 and expand the openings 128.

Figure 24A:
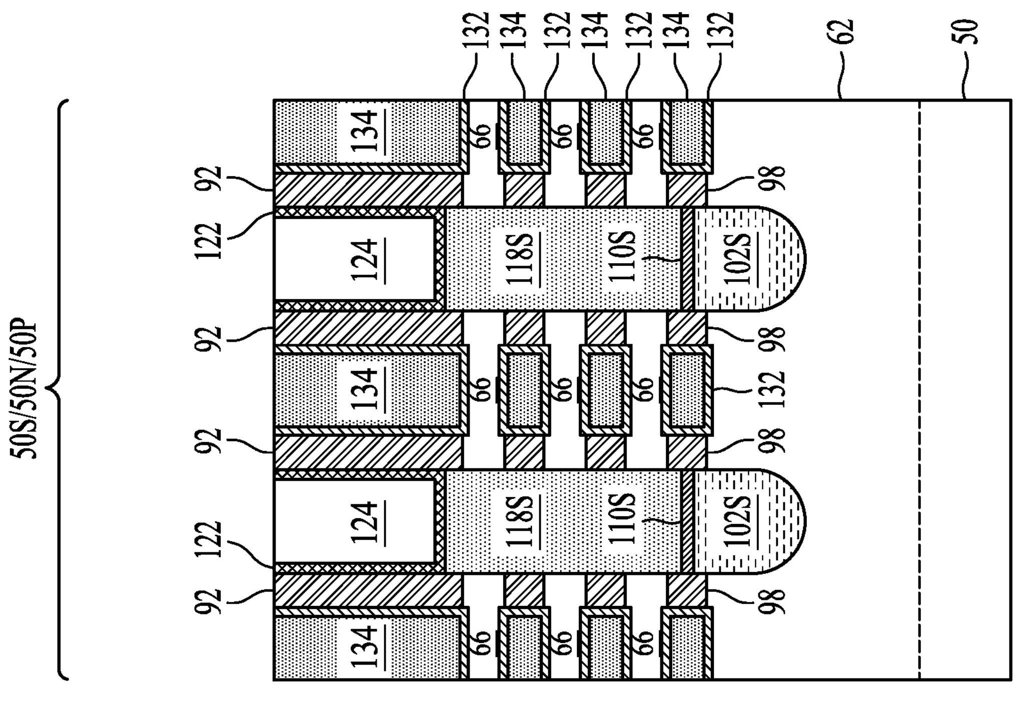
Figure 24A:
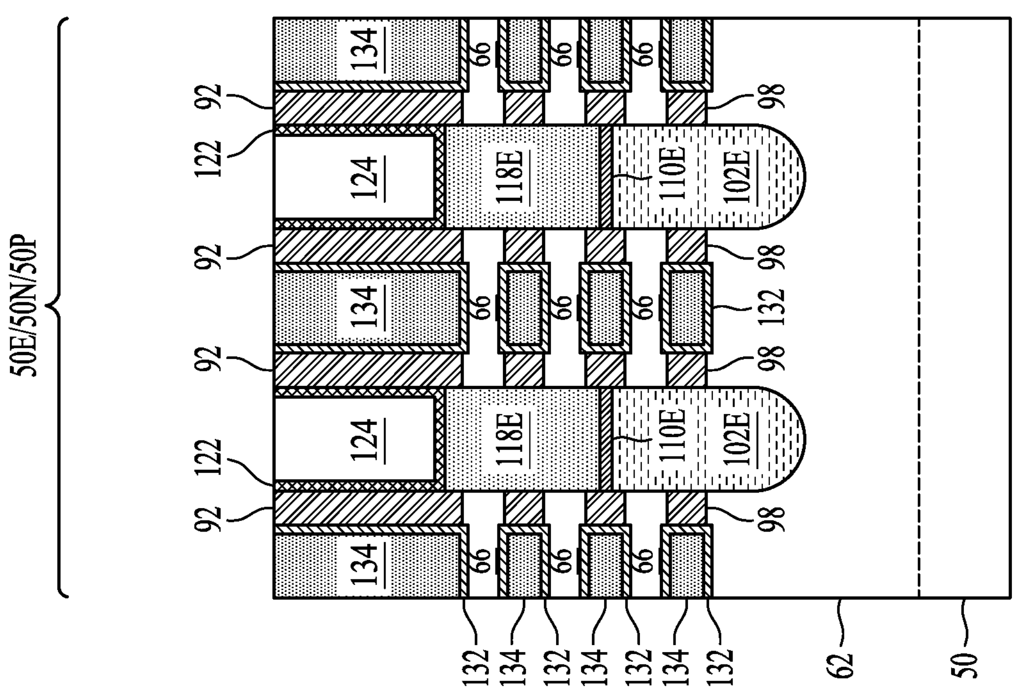
Figure 24B:
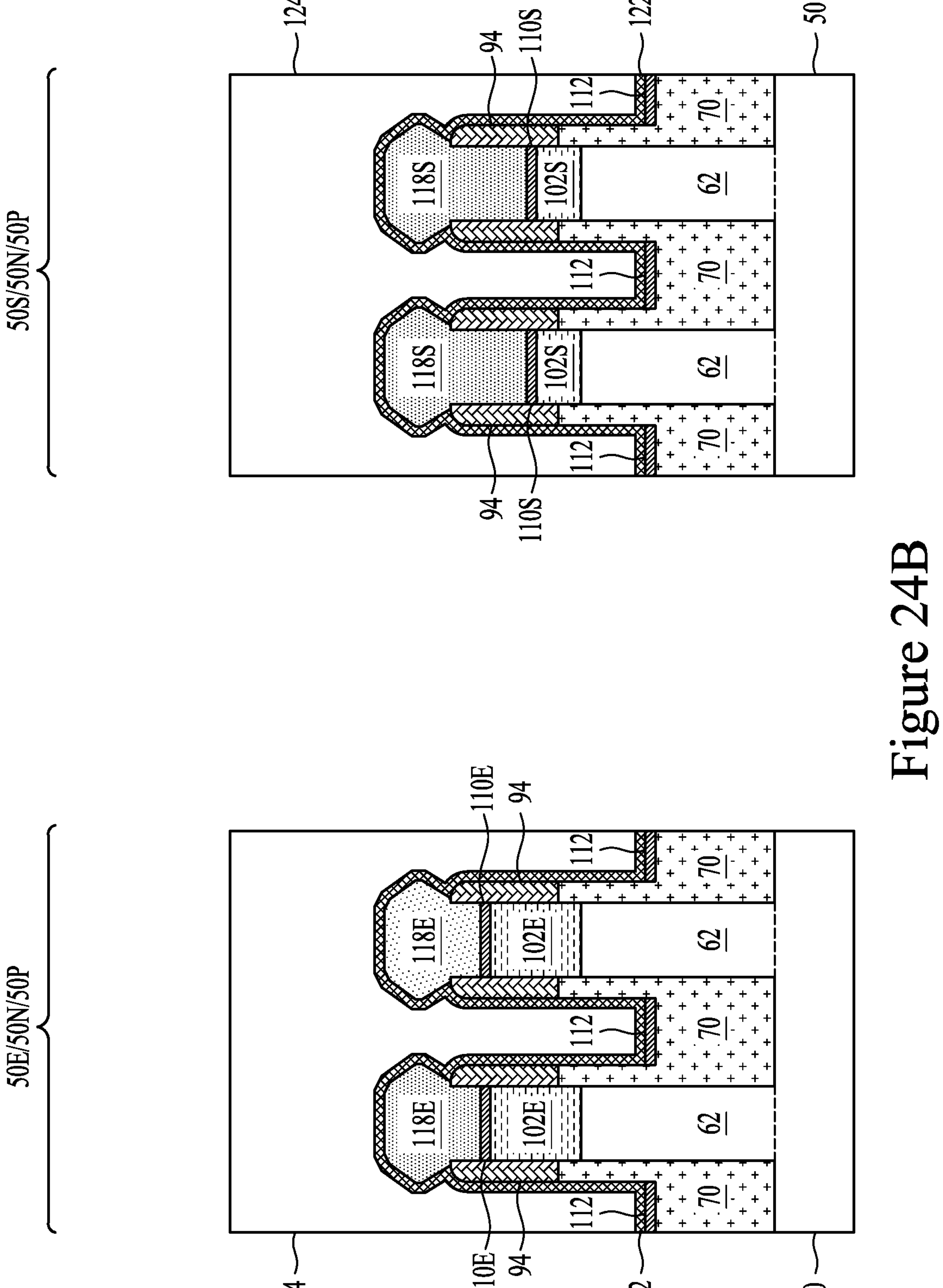
Figure 24C:
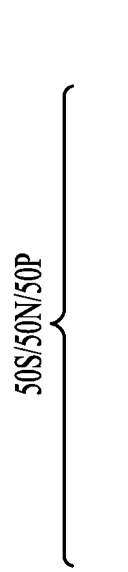
Figure 24C:
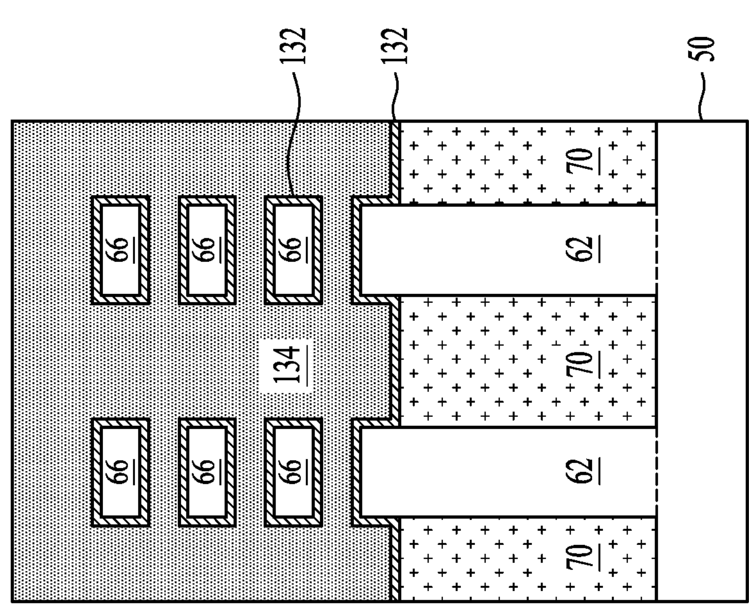
Figure 24C:
Figure 24C:
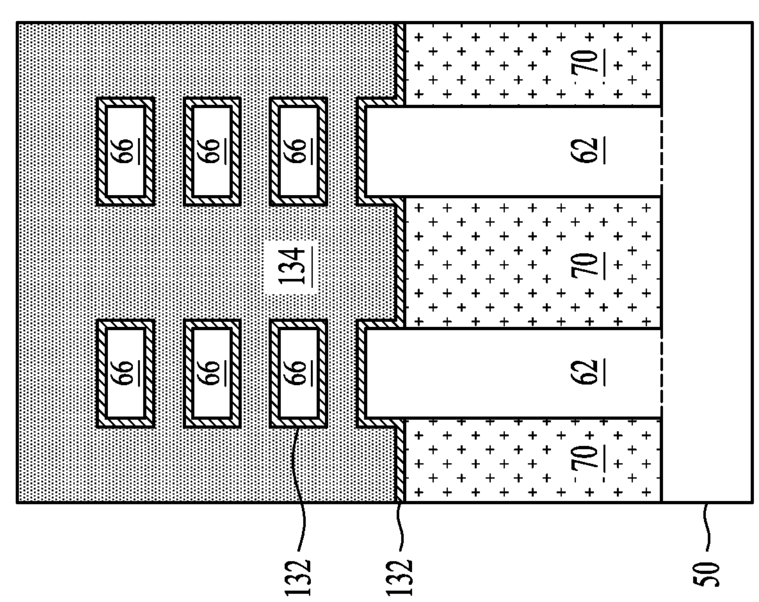

In FIGS. 24A-24C, gate dielectrics 132 and gate electrodes 134 are formed for replacement gates. Each respective pair of a gate dielectric 132 and a gate electrode 134 may be collectively referred to as a "gate structure." Each gate structure is wrapped around a channel region of a nanostructure 66, such that the gate structure extends along sidewalls, a bottom surface, and a top surface of the nanostructure 66. Some of the gate structures also extend along sidewalls and/or a top surface of a fin 62.

The gate dielectrics 132 include one or more gate dielectric layer(s) disposed on the sidewalls and/or the top surfaces of the fins 62; on the top surfaces, the sidewalls, and the bottom surfaces of the channel regions of the nanostructures 66; on the sidewalls of the inner spacers 98 adjacent the epitaxial source/drain regions 118; and on the sidewalls of the gate spacers 92. The gate dielectrics 132 may be formed of an oxide such as silicon oxide or a metal oxide, a silicate such as a metal silicate, combinations thereof, multi-layers thereof, or the like. Additionally or alternatively, the gate dielectrics 132 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 132 may be formed by molecular-beam deposition (MBD), ALD, PECVD, or the like. Although single-layered gate dielectrics 132 are illustrated, the gate dielectrics 132 may include any number of interfacial layers and any number of main layers. For example, the gate dielectrics 132 may include an interfacial layer and an overlying high-k dielectric layer.

The gate electrodes 134 include one or more gate electrode layer(s) disposed over the gate dielectrics 132. The gate electrodes 134 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 134 are illustrated, the gate electrodes 134 may include any number of work function tuning layers, any number of barrier layers, any number of glue layers, and a fill material.

As an example to form the gate structures, one or more gate dielectric layer(s) may be deposited in the recesses 126 and the openings 128. The gate dielectric layer(s) may also be deposited on the top surfaces of the first ILD 124, the CESL 122, and the gate spacers 92. Subsequently, one or more gate electrode layer(s) may be deposited on the gate dielectric layer(s), and in the remaining portions of the recesses 126 and the openings 128. A removal process may then be performed to remove the excess portions of the gate dielectric layer(s) and the gate electrode layer(s), which excess portions are over the top surfaces of the first ILD 124, the CESL 122, and the gate spacers 92. In some embodiments, a planarization process such as a chemical mechanical polish (CMP), an etch-back process, combinations thereof, or the like may be utilized. The gate dielectric layer(s), after the removal process, have portions left in the recesses 126 and the openings 128 (thus forming the gate dielectrics 132). The gate electrode layer(s), after the removal process, have portions left in the recesses 126 and the openings 128 (thus forming the gate electrodes 134). When a planarization process is utilized, the top surfaces of the gate spacers 92, the CESL 122, the first ILD 124, the gate dielectrics 132, and the gate electrodes 134 are coplanar (within process variations).

Figure 25A:
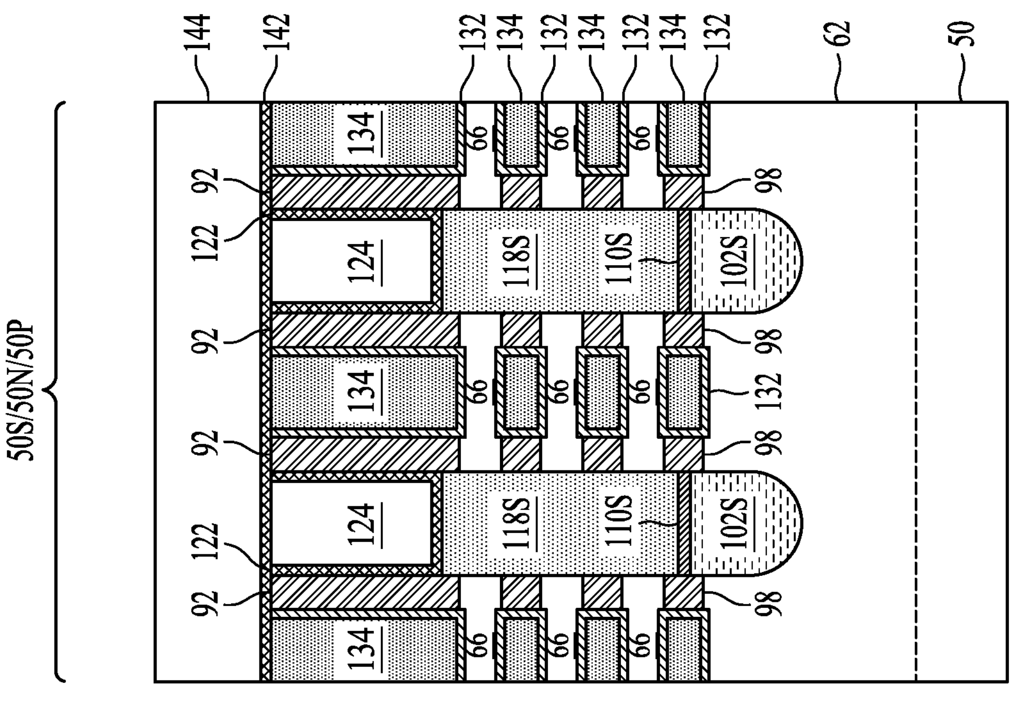
Figure 25A:
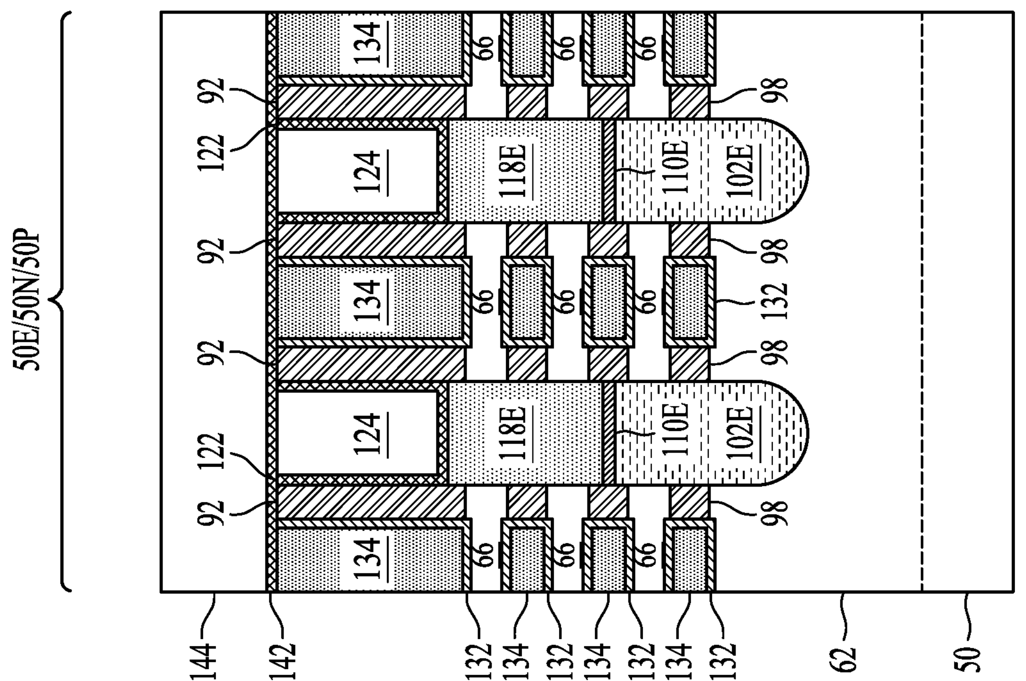
Figure 25B:
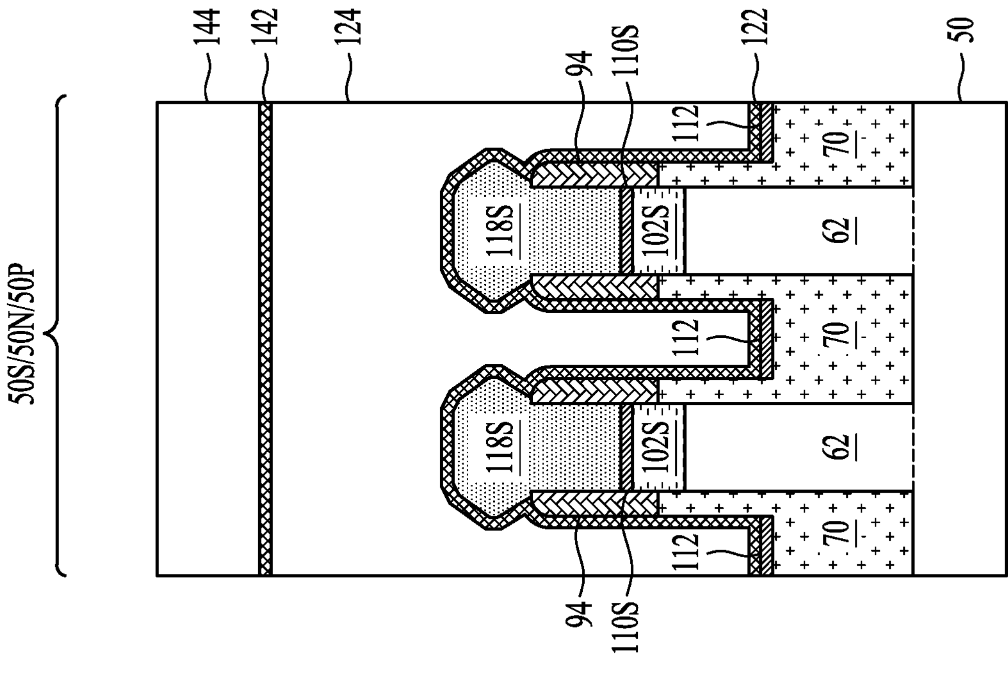
Figure 25B:
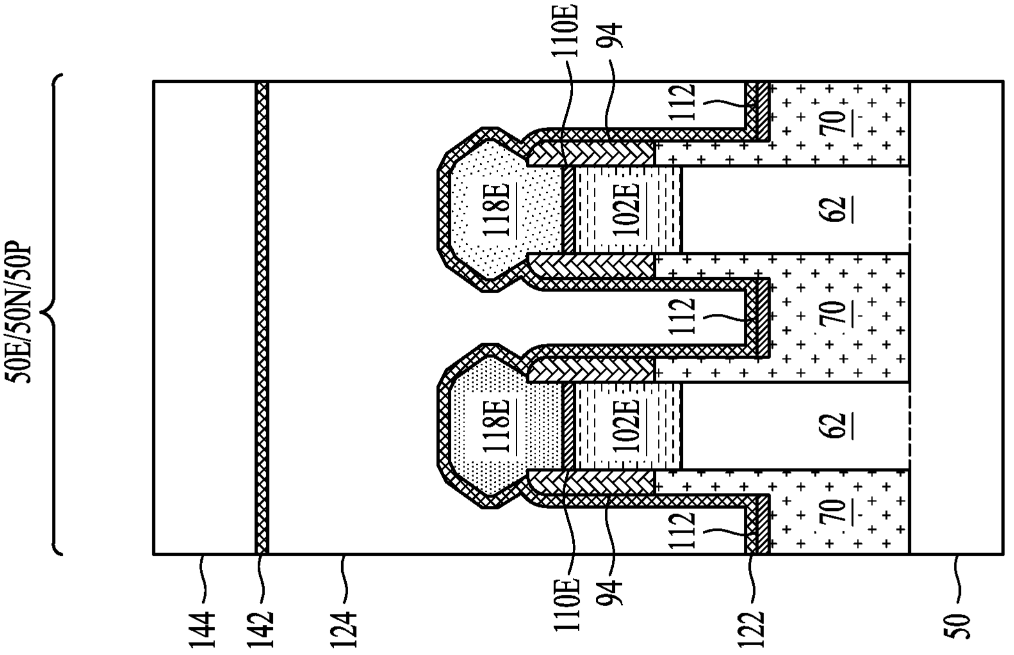

In FIGS. 25A-25C, a second ILD 144 is deposited over the gate spacers 92, the CESL 122, the first ILD 124, the gate dielectrics 132, and the gate electrodes 134. In some embodiments, the second ILD 144 is a flowable film formed by a flowable CVD method. In some embodiments, the second ILD 144 is formed of a dielectric material such as PSG, BSG, BPSG, USG, or the like, which may be formed by any suitable deposition process, such as CVD, PECVD, or the like.

In some embodiments, an etch stop layer (ESL) 142 is formed between the second ILD 144 and the gate spacers 92, the CESL 122, the first ILD 124, the gate dielectrics 132, and the gate electrodes 134. The ESL 142 may be formed of a dielectric material having a high etching selectivity from the etching of the second ILD 144, such as silicon nitride, silicon oxide, silicon oxynitride, or the like, which may be formed by any suitable deposition process, such as CVD, ALD, or the like.

Figure 26A:
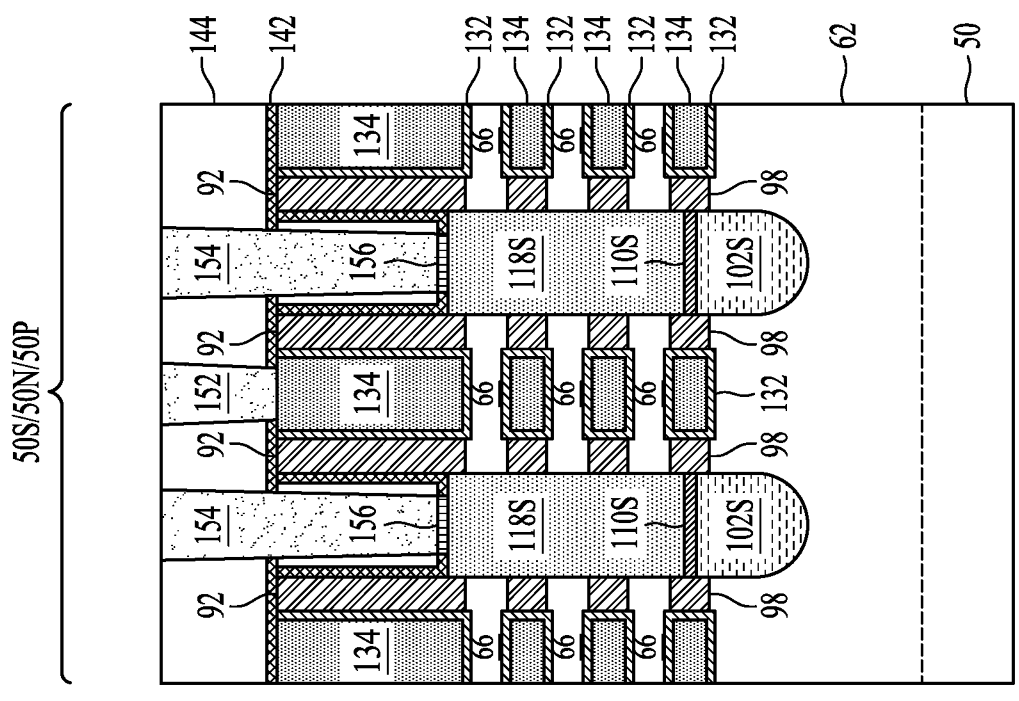
Figure 26A:
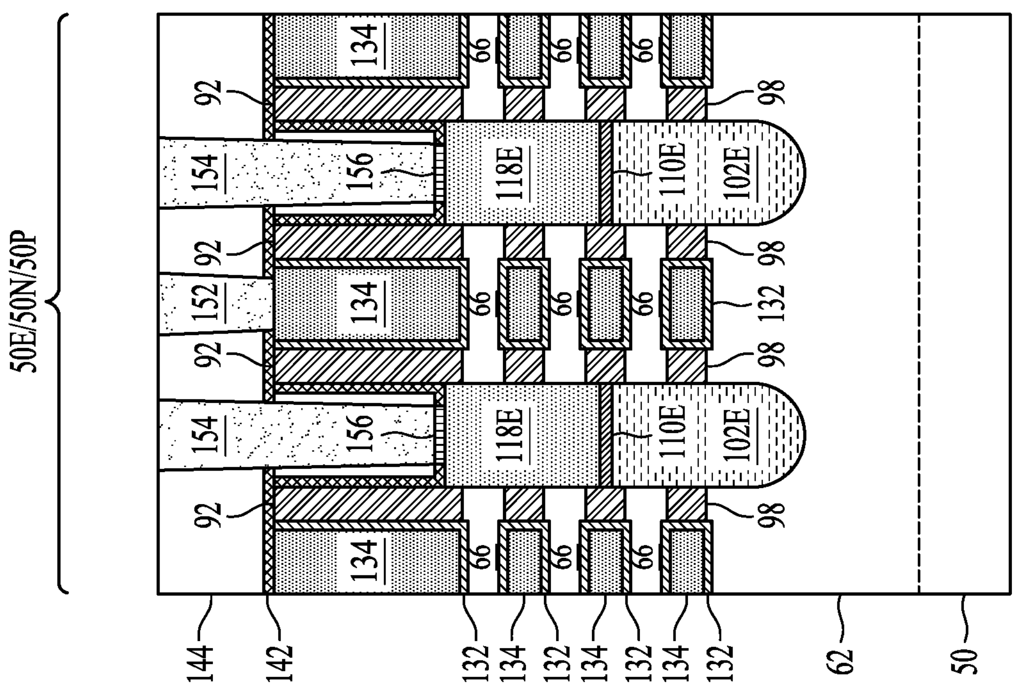
Figure 26B:
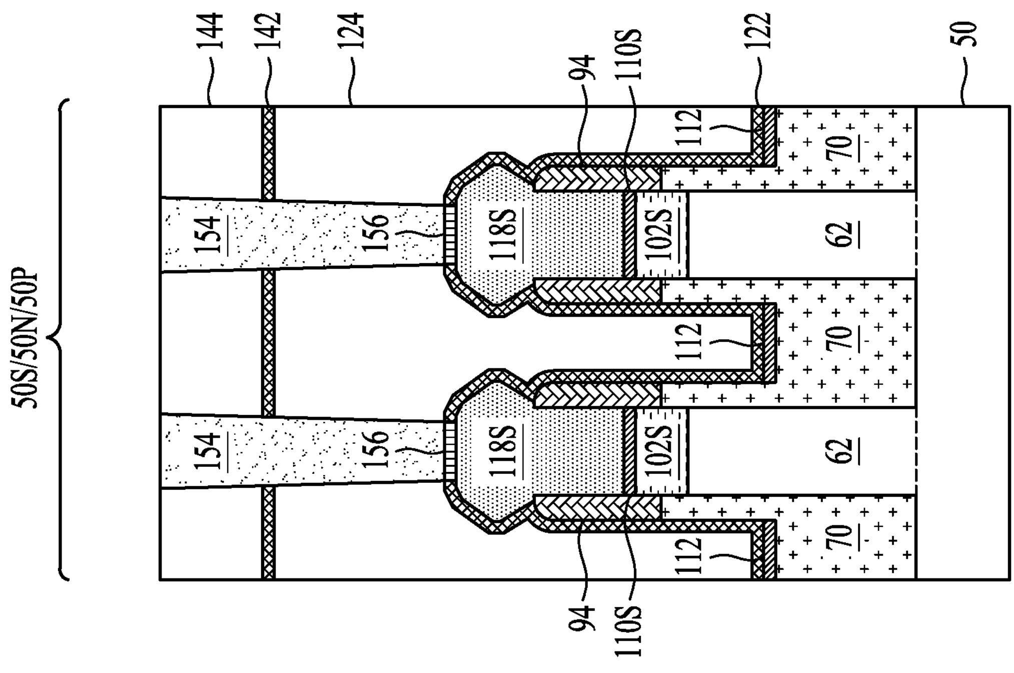
Figure 26C:
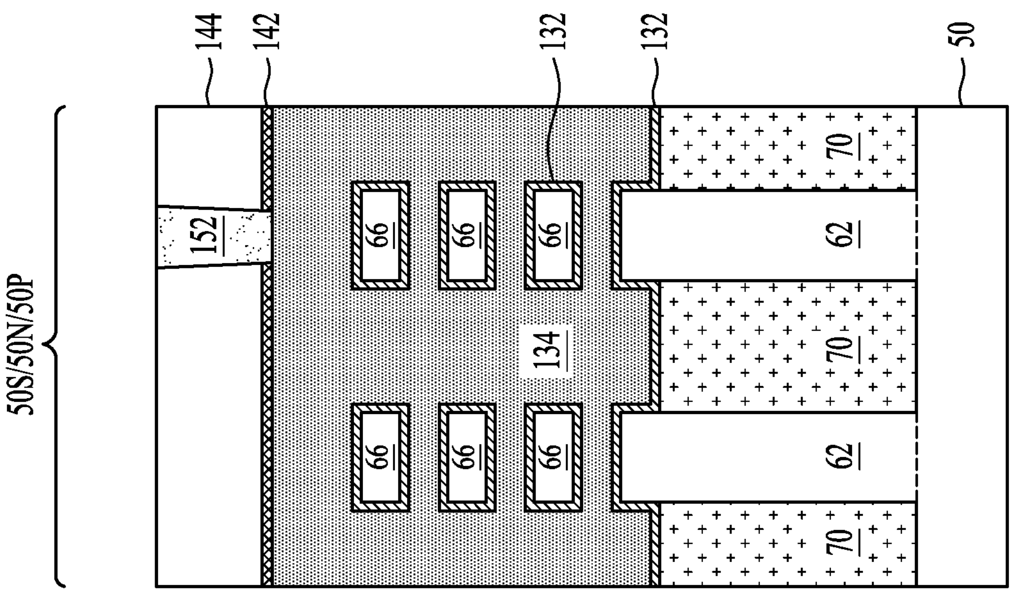
Figure 26C:
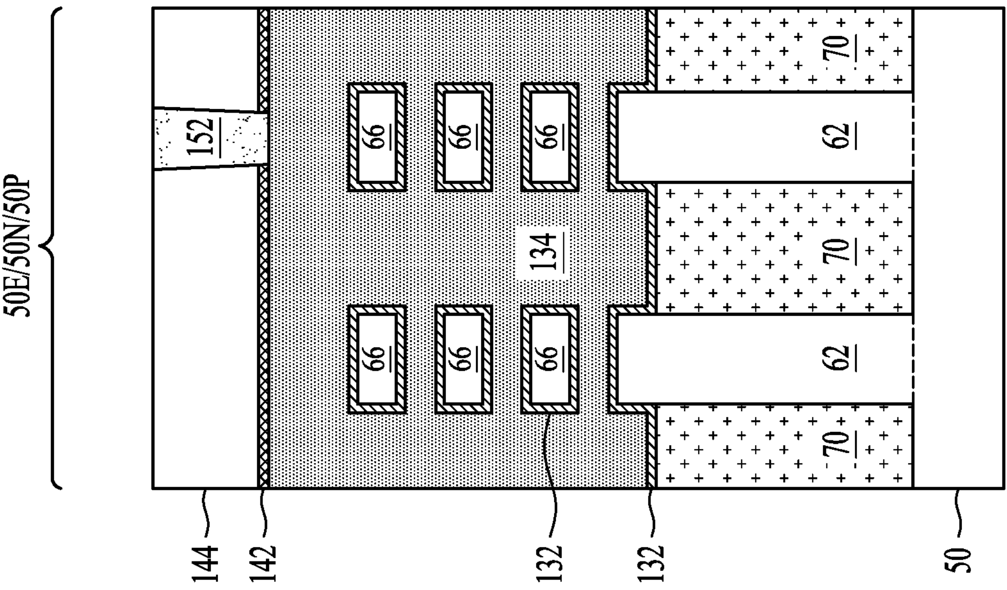

In FIGS. 26A-26C, gate contacts 152 and source/drain contacts 154 are formed to contact, respectively, the gate electrodes 134 and the epitaxial source/drain regions 118. The gate contacts 152 may be physically and electrically coupled to the gate electrodes 134. The source/drain contacts 154 may be physically and electrically coupled to the epitaxial source/drain regions 118.

As an example to form the gate contacts 152 and the source/drain contacts 154, openings for the gate contacts 152 are formed through the second ILD 144 and the ESL 142, and openings for the source/drain contacts 154 are formed through the second ILD 144, the ESL 142, the first ILD 124, and the CESL 122. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 144. The remaining liner and conductive material form the gate contacts 152 and the source/drain contacts 154 in the openings. The gate contacts 152 and the source/drain contacts 154 may be formed in distinct processes, or may be formed in the same process. Although shown as being formed in the same cross-sections, it should be appreciated that each of the gate contacts 152 and the source/drain contacts 154 may be formed in different cross-sections, which may avoid shorting of the contacts.

Optionally, metal-semiconductor alloy regions 156 are formed at the interfaces between the epitaxial source/drain regions 118 and the source/drain contacts 154. The metal-semiconductor alloy regions 156 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 156 can be formed before the material(s) of the source/drain contacts 154 by depositing a metal in the openings for the source/drain contacts 154 and then performing a thermal annealing process. The metal can be any metal capable of reacting with the semiconductor materials (e.g., silicon, silicon carbide, silicon germanium, germanium, etc.) of the epitaxial source/drain regions 118 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal annealing process, a cleaning process, such as a wet clean, may be performed to remove any residual metal from the openings for the source/drain contacts 154, such as from surfaces of the metal-semiconductor alloy regions 156. The material(s) of the source/drain contacts 154 can then be formed on the metal-semiconductor alloy regions 156.

Embodiments may achieve advantages. Forming the semiconductor layers 102E to a greater height than the semiconductor layers 102S allows the epitaxial source/drain regions 118E to have a lesser height than the epitaxial source/drain regions 118S. As such, the devices formed in the high-speed region 50S have a different quantity of channel regions than the devices formed in the high-efficiency region 50E. The devices in the different regions have different effective work functions, which may be advantageous for balancing performance and efficiency. Because the effective work functions of the devices may be controlled based on the height of the epitaxial source/drain regions 118, the nanostructures 66 of the devices may have the same dimensions. Accordingly, pattern loading effects may be avoided during processing, which can improve the manufacturing yield of the resulting devices.

Figure 27A:
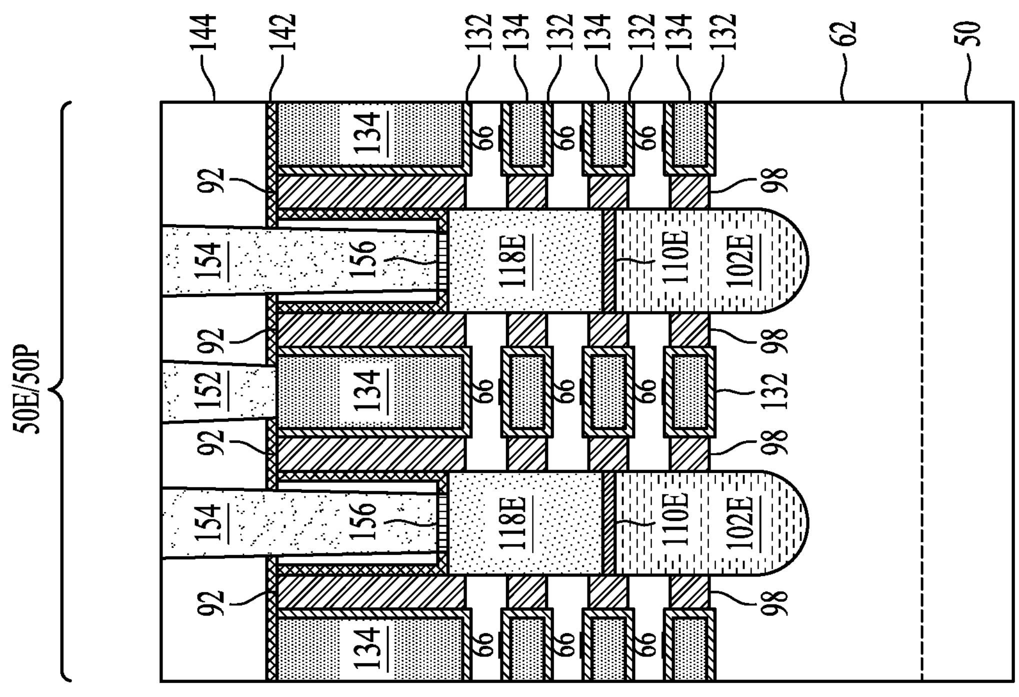
FIGS. 27A-27C are views of nanostructure-FETs, in accordance with some embodiments.
Figure 27A:
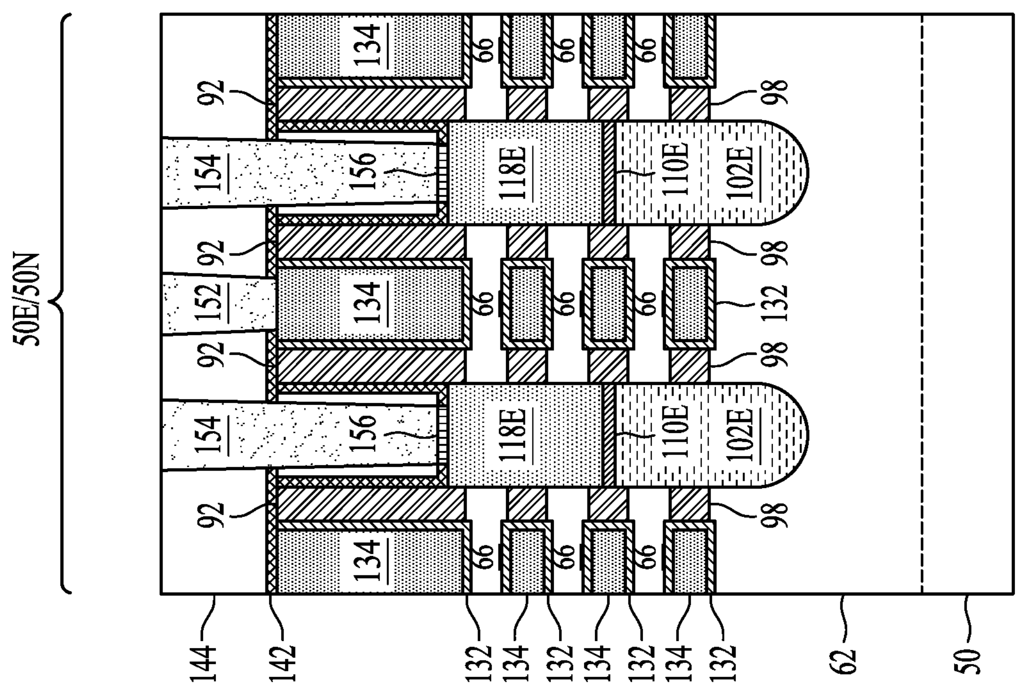
Figure 27B:
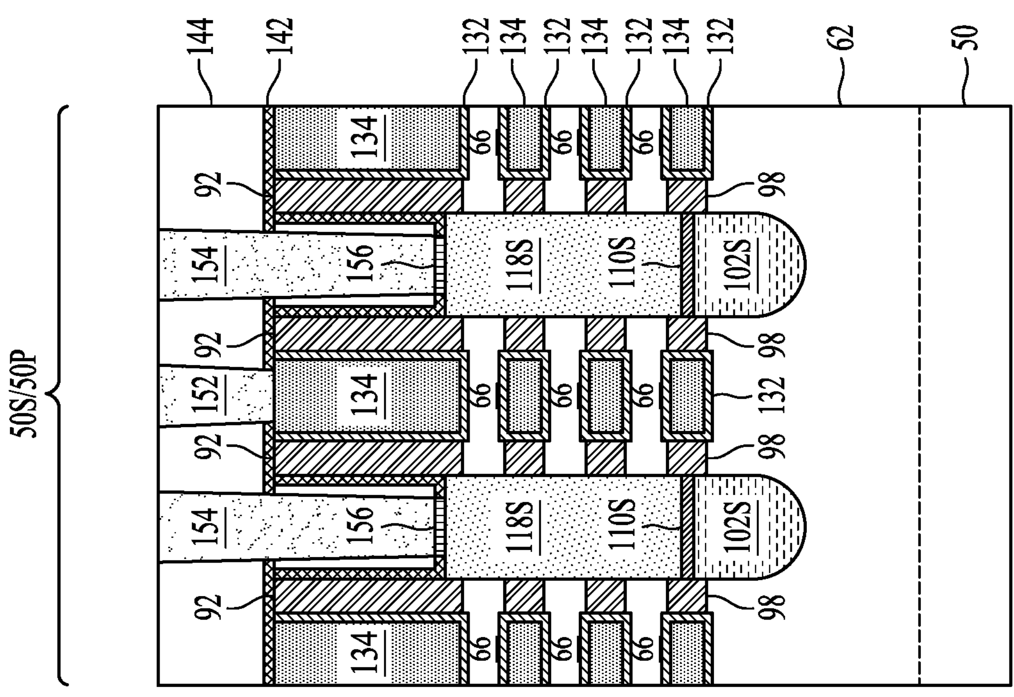
Figure 27B:
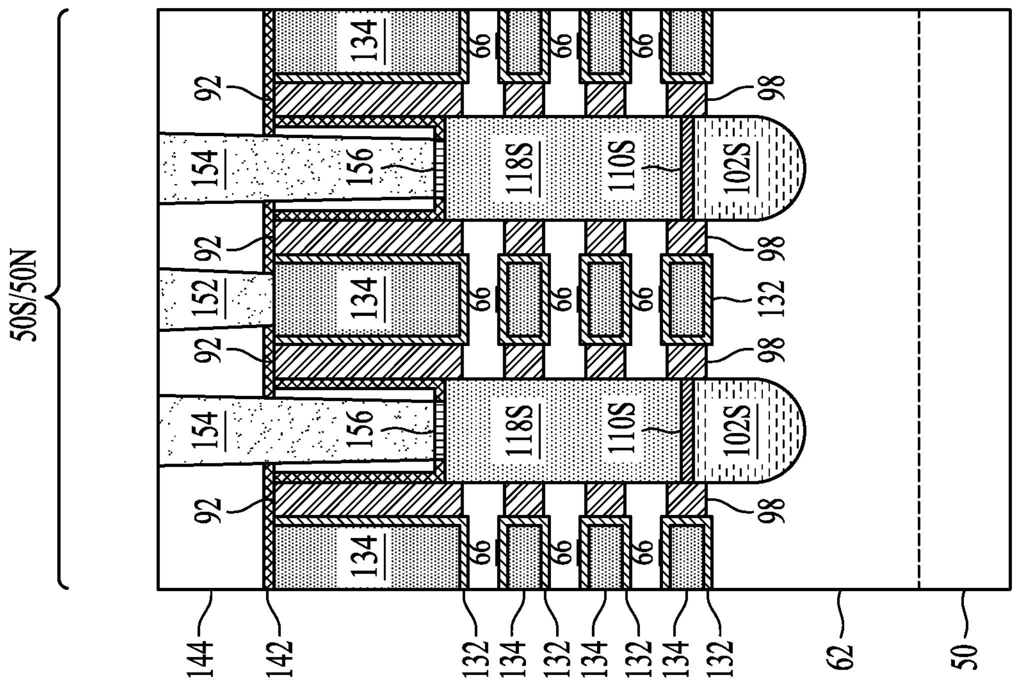
Figure 27C:
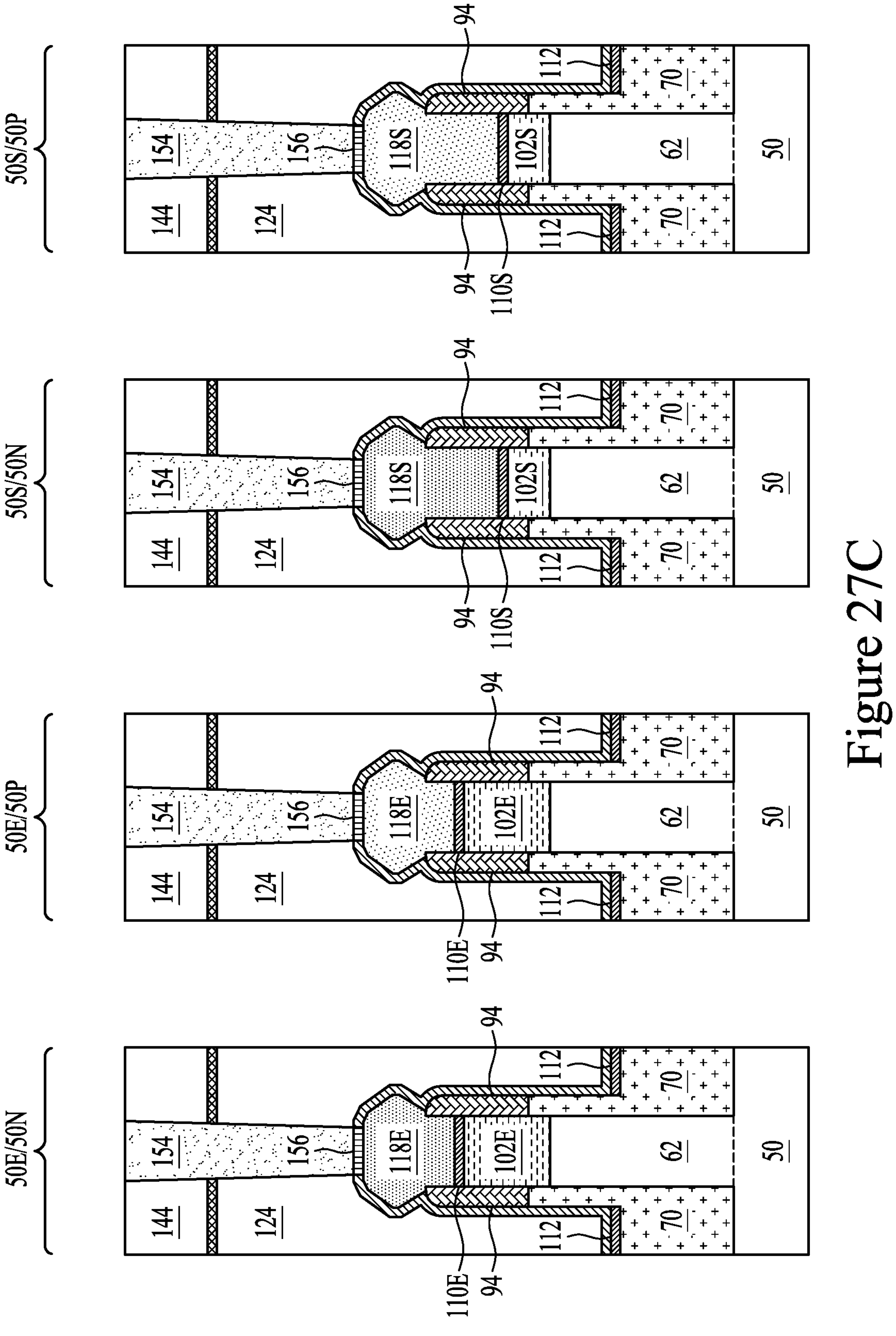

FIGS. 27A-27C are views of nanostructure-FETs, in accordance with some embodiments. FIGS. 27A-27C are additional views of the nanostructure-FETs of FIGS. 26A-26C. FIG. 27A illustrates cross-sectional views of the high-efficiency region 50E along a similar cross-section as reference cross-section A-A' in FIG. 1. FIG. 27B illustrates cross-sectional views of the high-speed region 50S along a similar cross-section as reference cross-section A-A' in FIG. 1. FIG. 27C illustrates cross-sectional views of the high-efficiency region 50E and the high-speed region 50S along a similar cross-section as reference cross-section B-B' in FIG. 1.

Figure 28A:
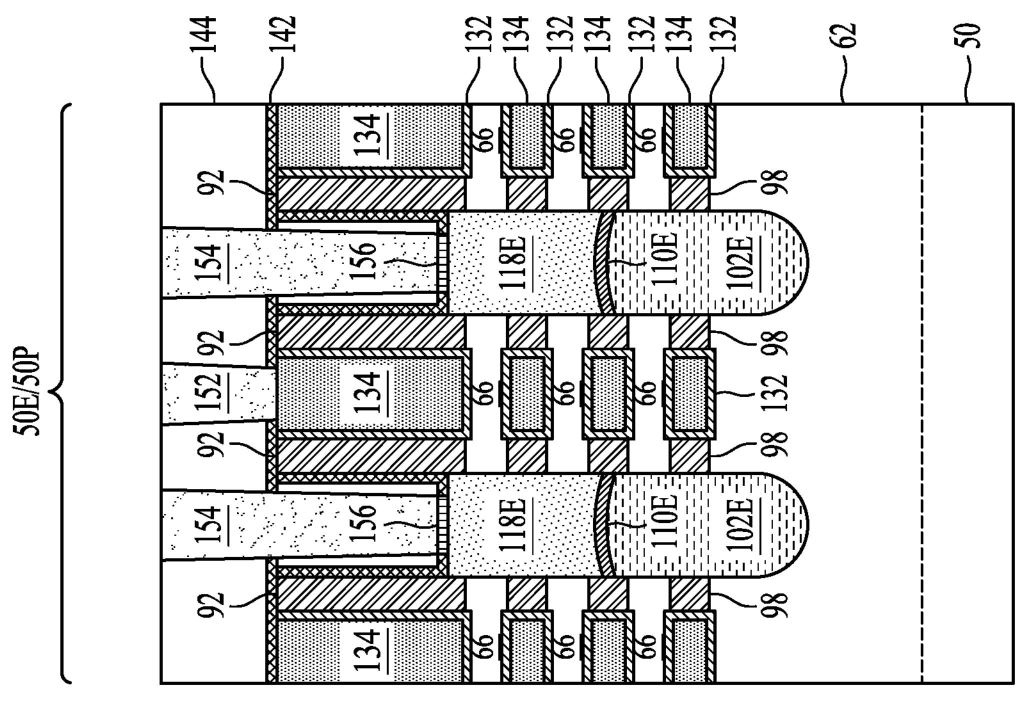
FIGS. 28A-28C are views of nanostructure-FETs, in accordance with some embodiments.
Figure 28A:
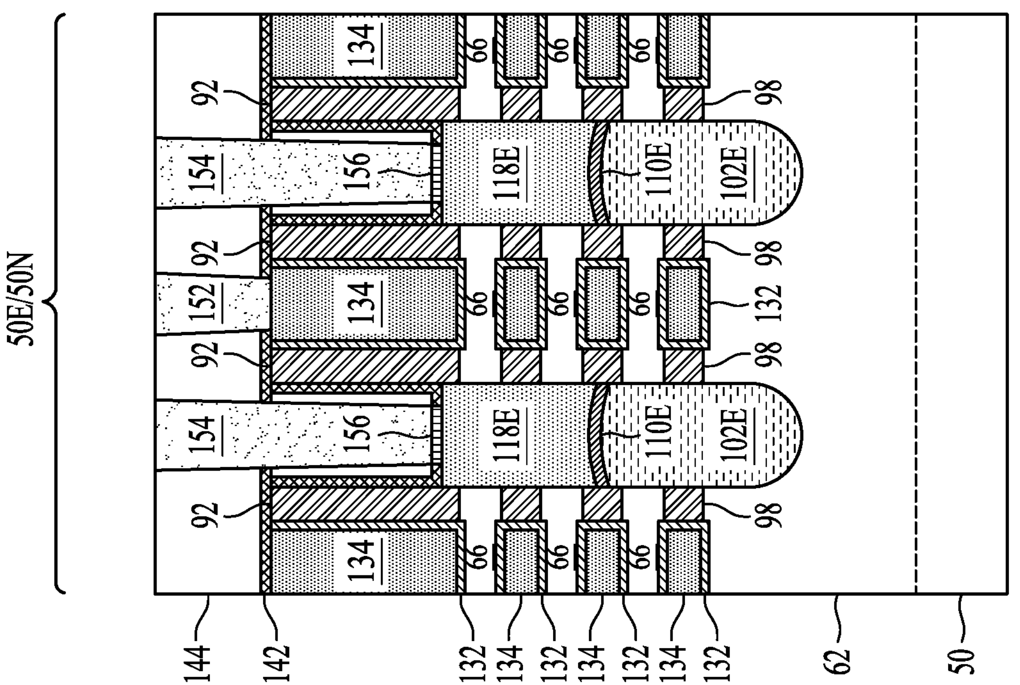
Figure 28B:
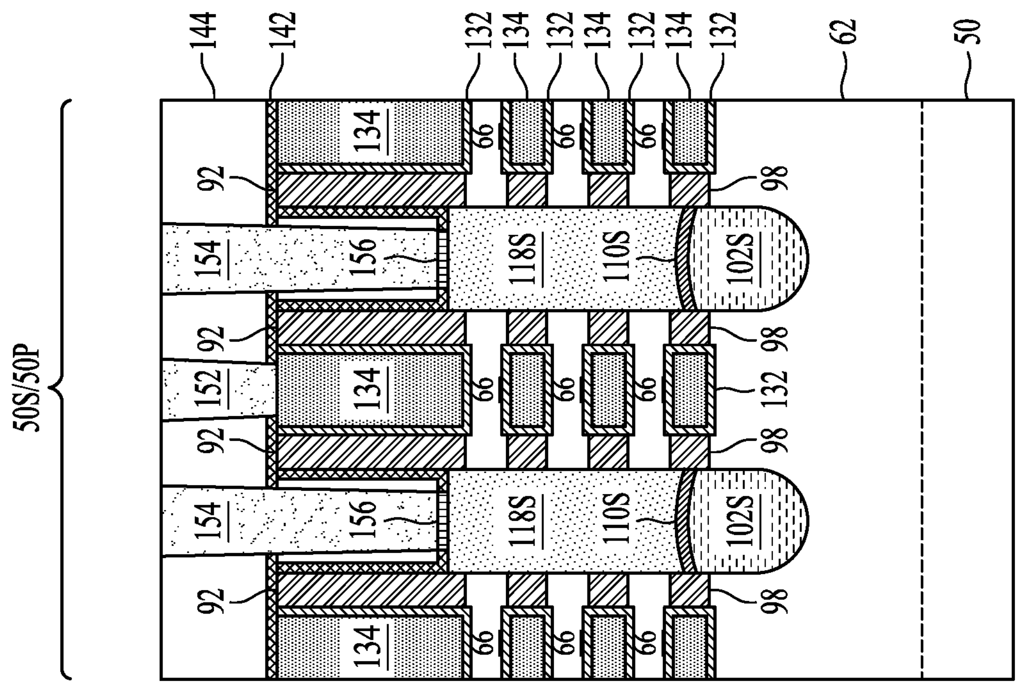
Figure 28B:
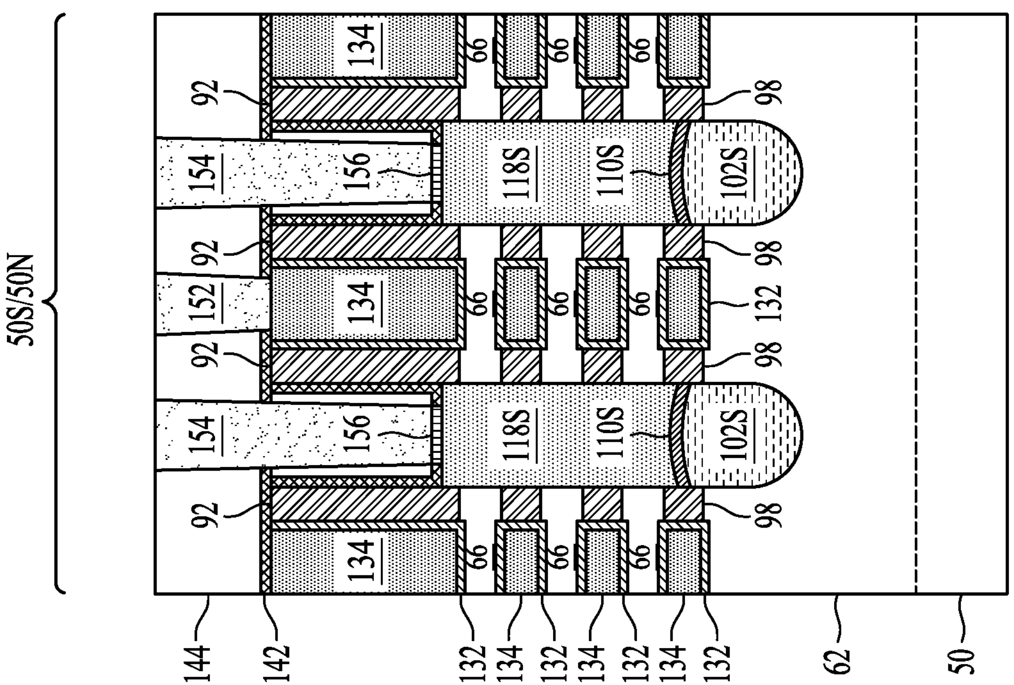
Figure 28C:
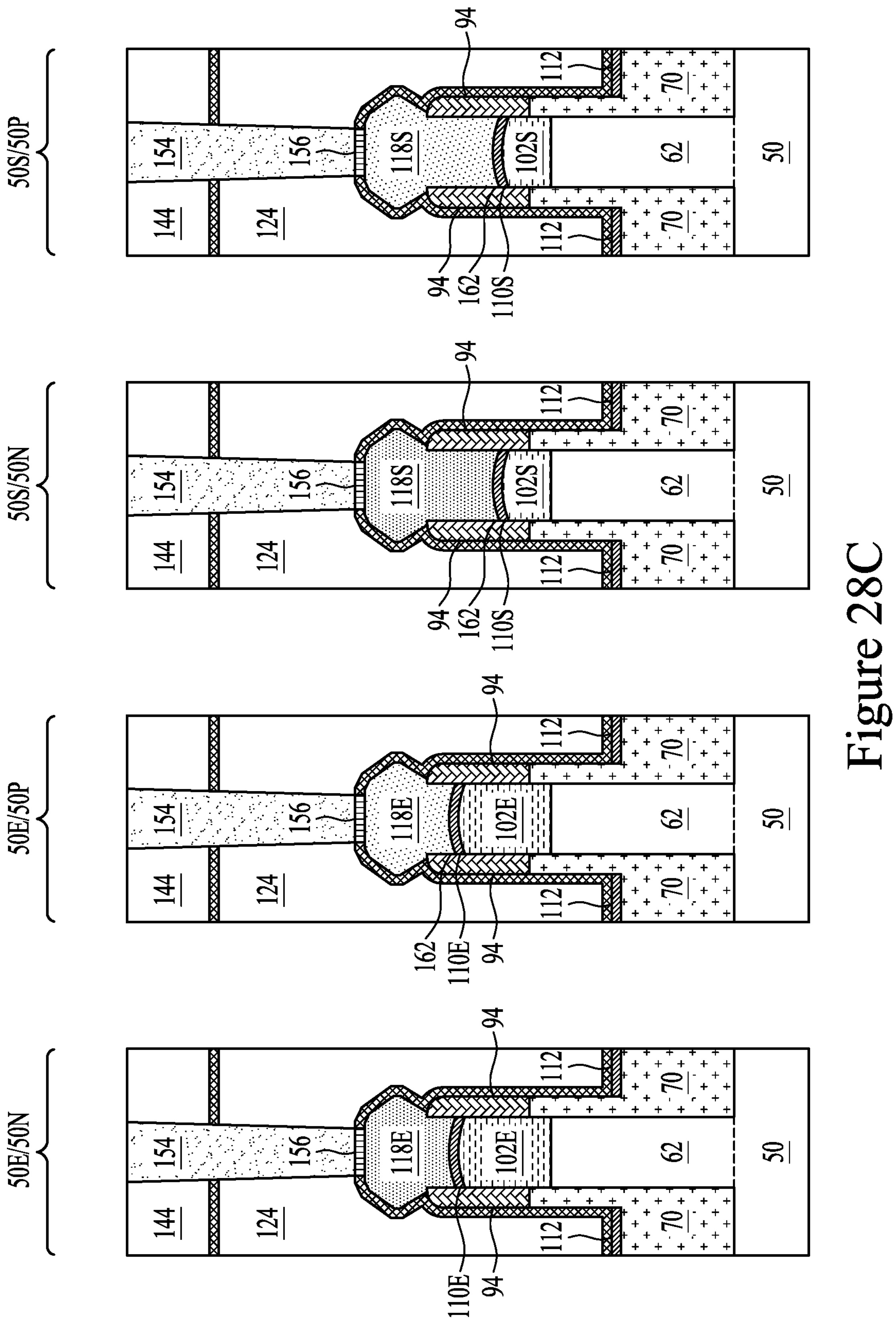

FIGS. 28A-28C are views of nanostructure-FETs, in accordance with some embodiments. This embodiment is similar to the embodiment of FIGS. 27A-27C, except the top surfaces of the semiconductor layers 102 are convex top surfaces. As a result, the epitaxial source/drain regions 118 have concave bottom surfaces.

Figure 29A:
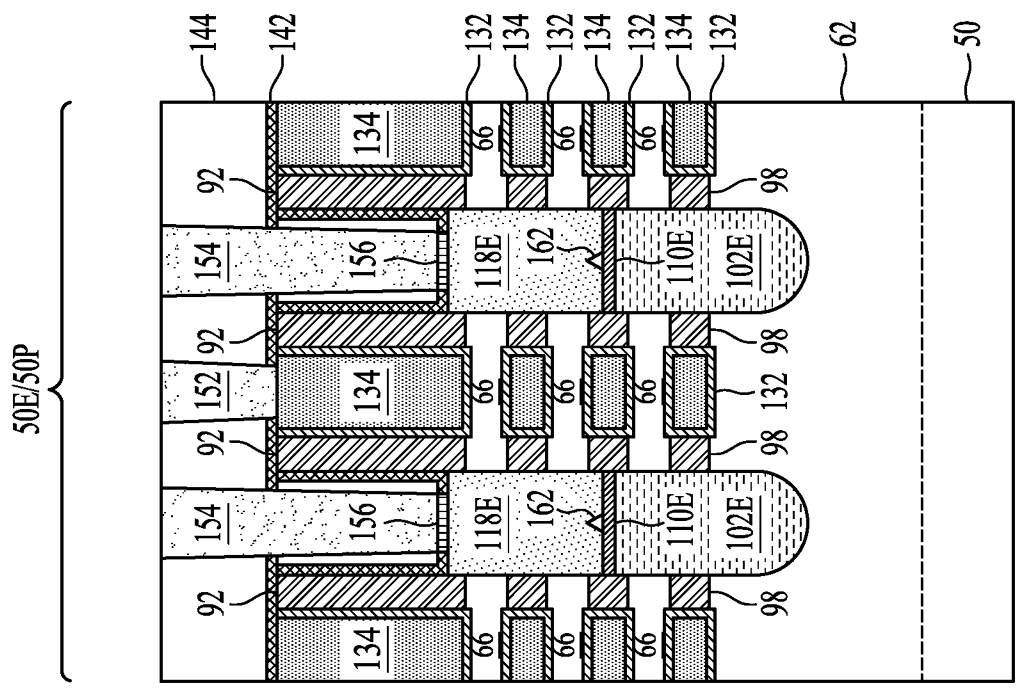
FIGS. 29A-29C are views of nanostructure-FETs, in accordance with some embodiments.
Figure 29A:
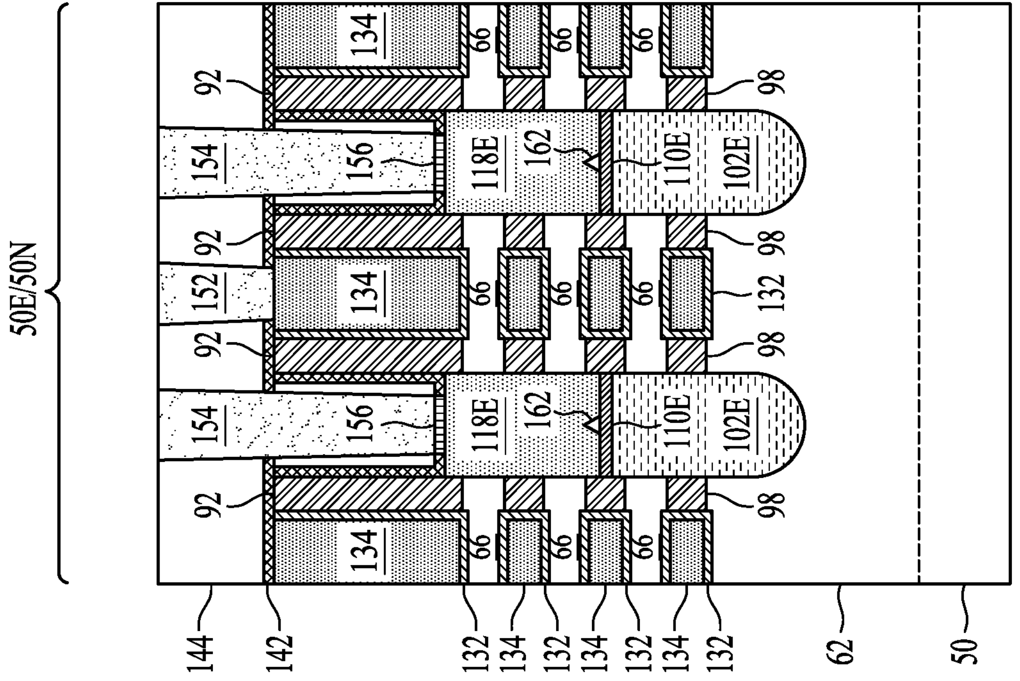
Figure 29B:
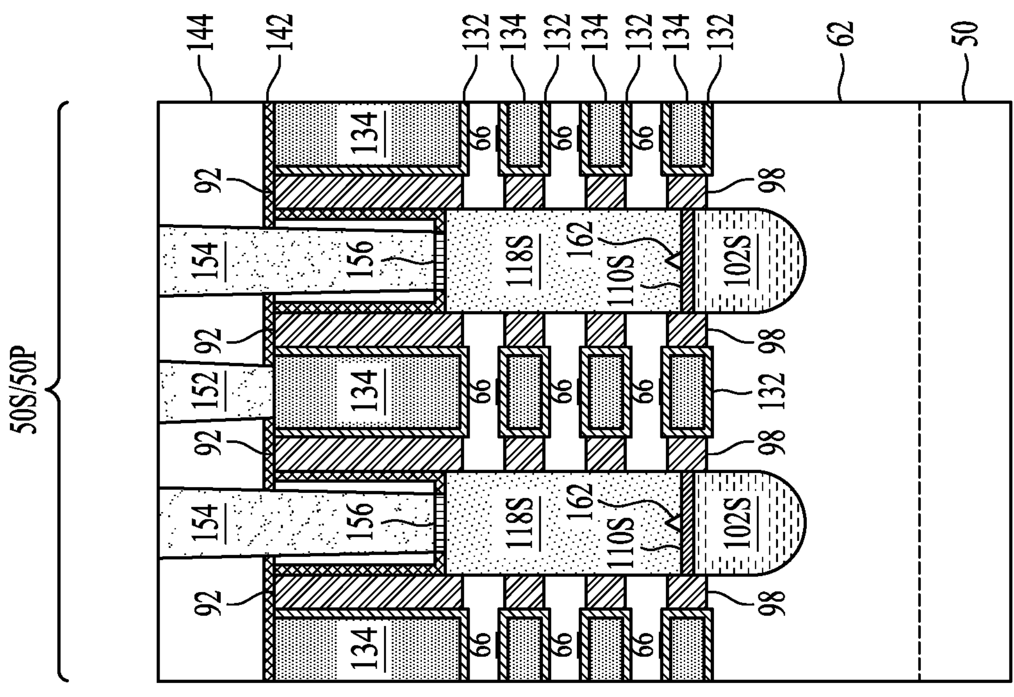
Figure 29B:
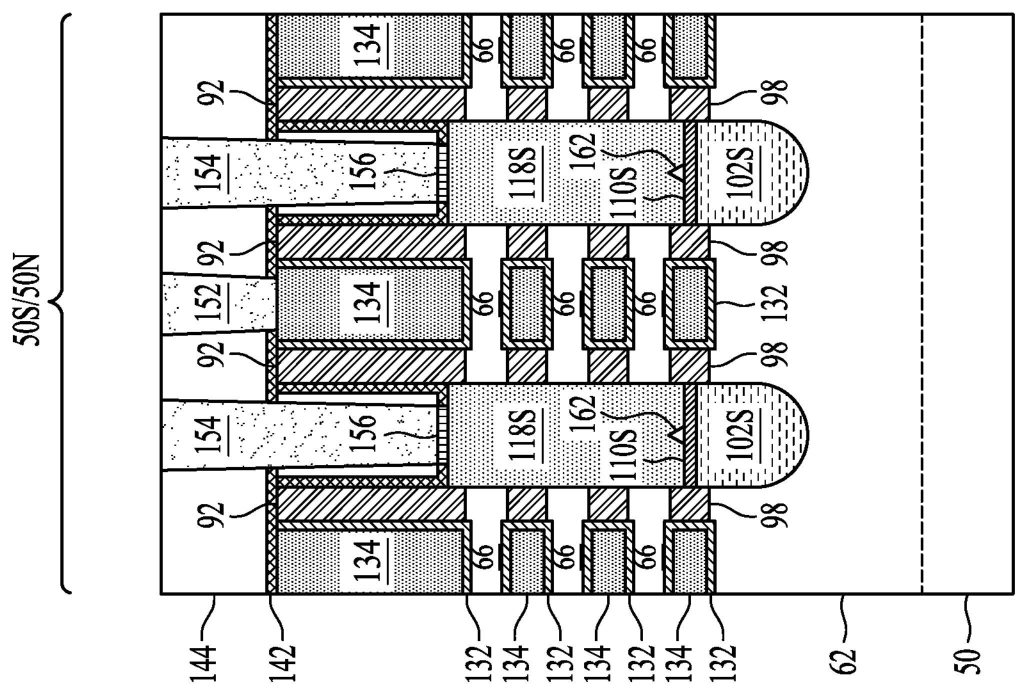
Figure 29C:
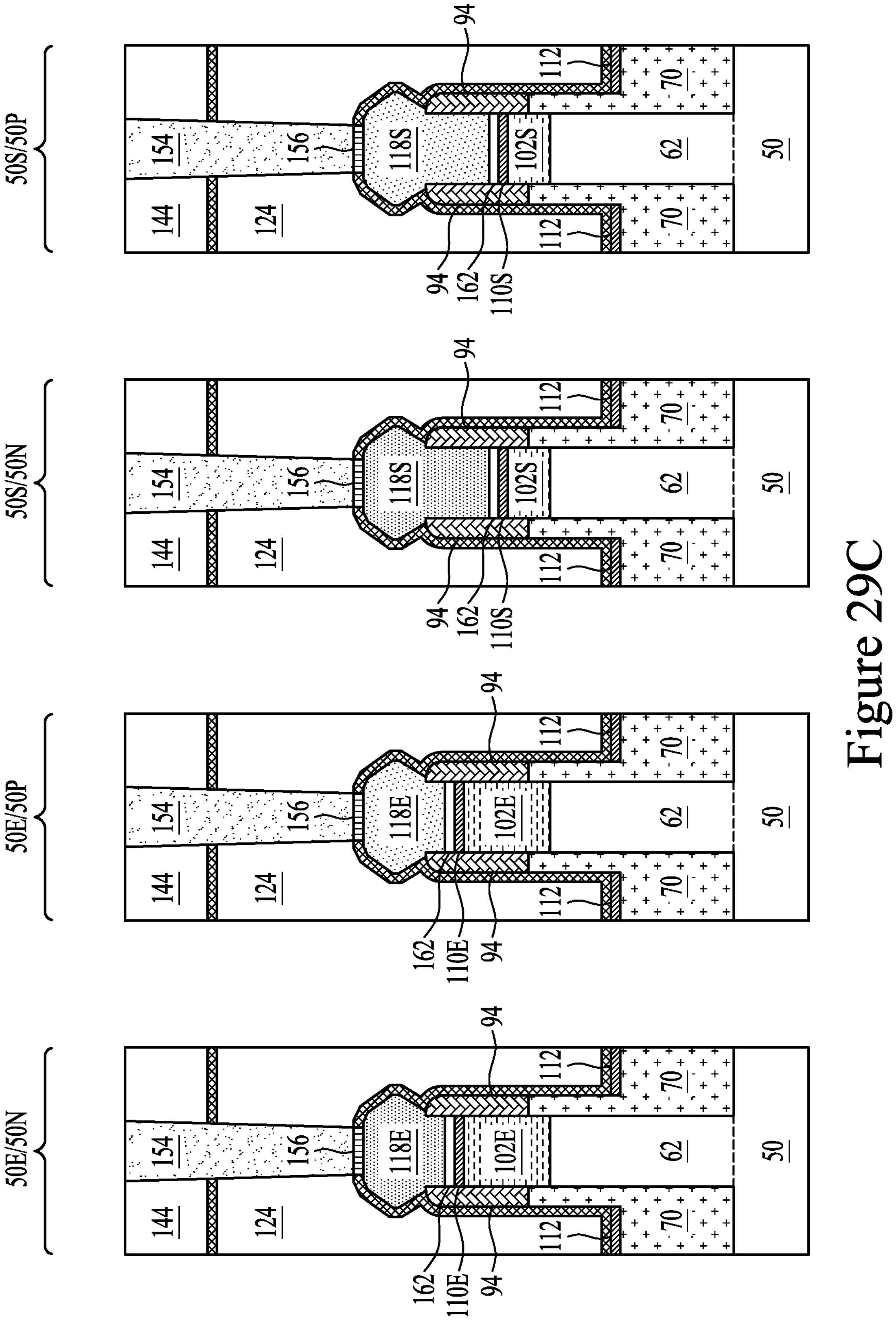

FIGS. 29A-29C are views of nanostructure-FETs, in accordance with some embodiments. This embodiment is similar to the embodiment of FIGS. 27A-27C, except voids 162 are formed beneath the epitaxial source/drain regions 118. As a result, portions of the top surfaces of the bottom spacers 110 are exposed to the voids 162. Although not separately illustrated, it should be appreciated that the top surfaces of the semiconductor layers 102 in this embodiment may also be convex top surfaces.

Figure 30A:
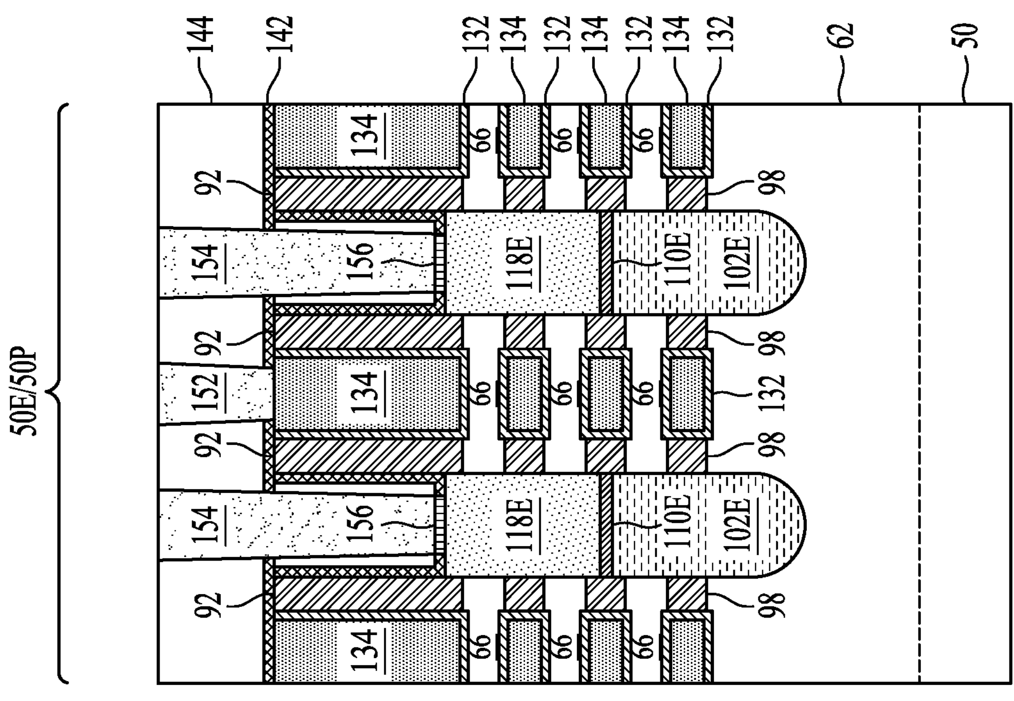
FIGS. 30A-30C are views of nanostructure-FETs, in accordance with some embodiments.
Figure 30A:
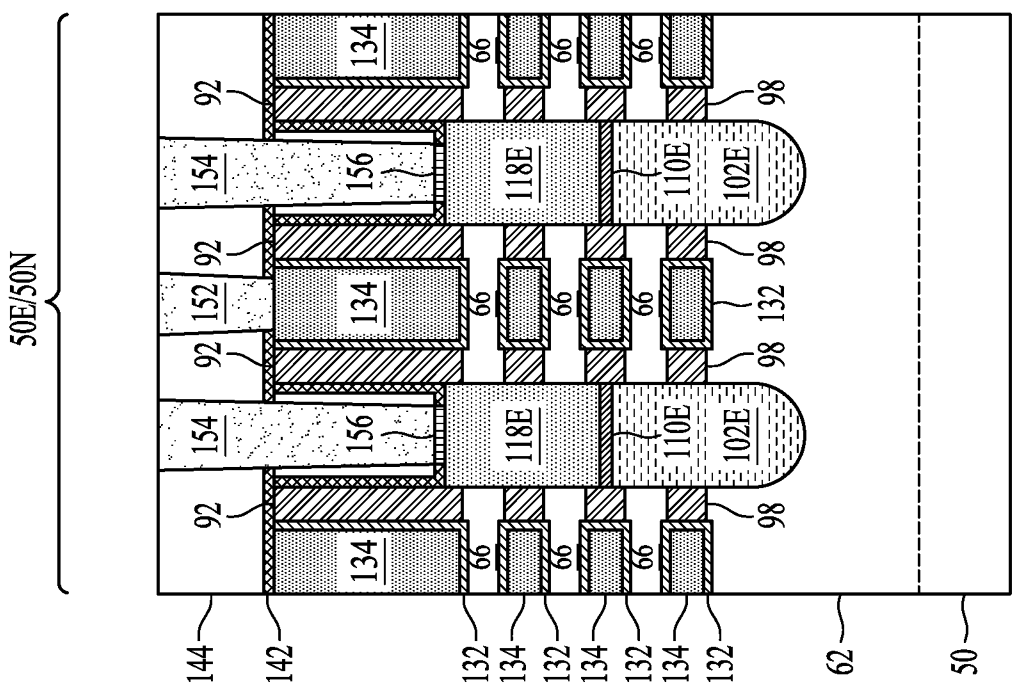
Figure 30B:
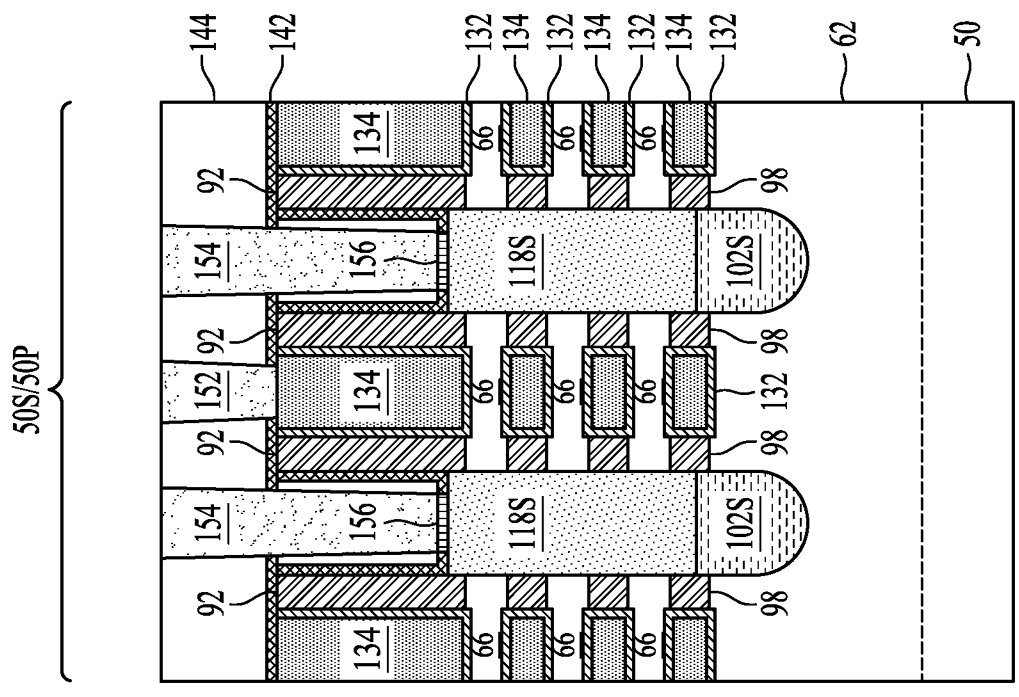
Figure 30B:
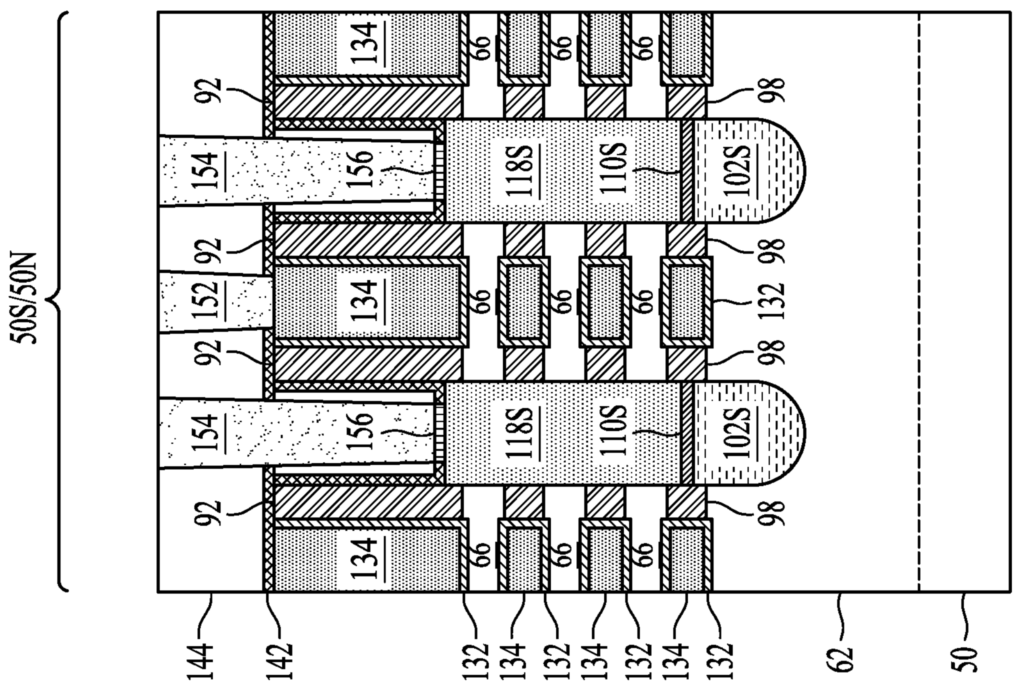
Figure 30C:
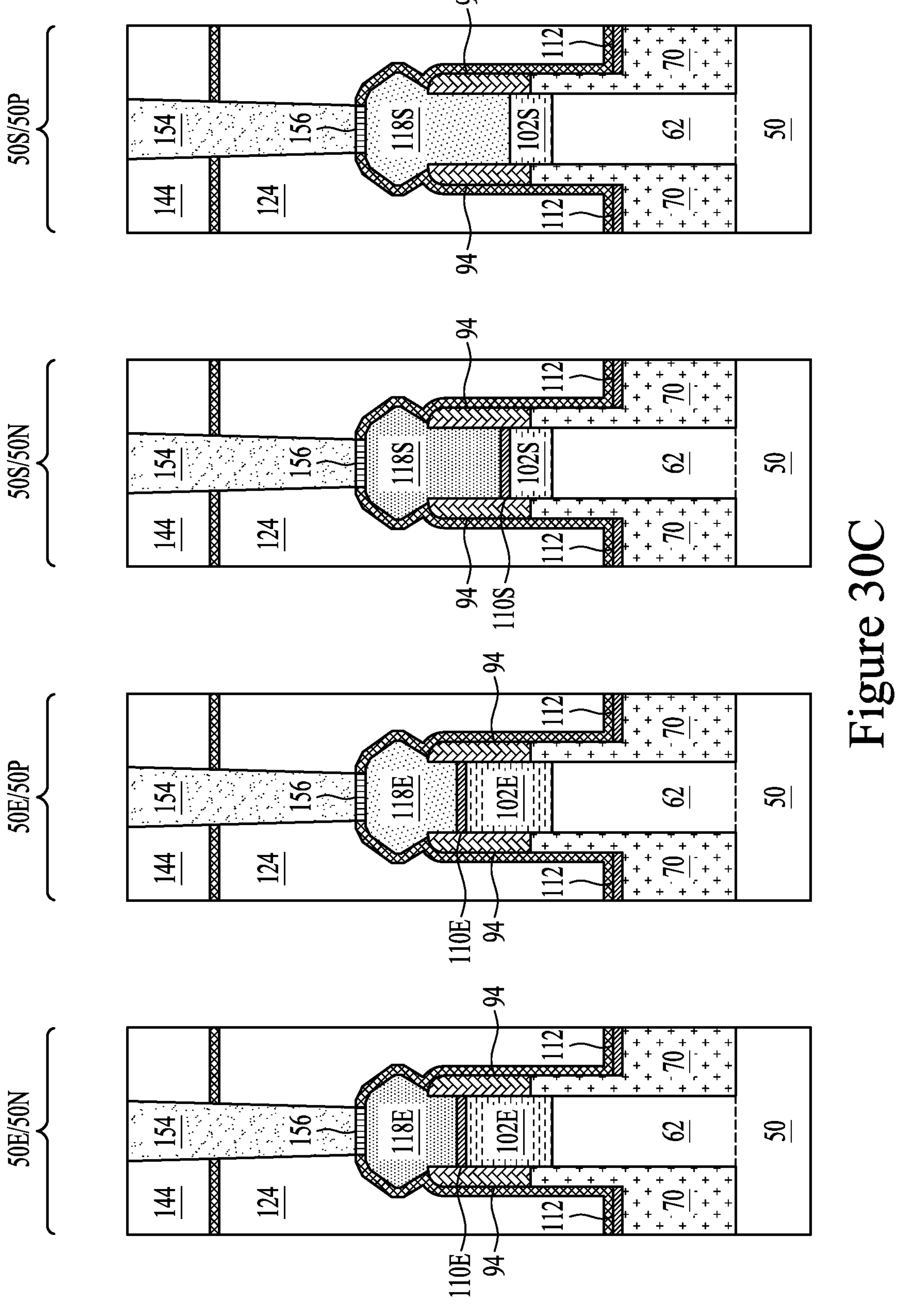

FIGS. 30A-30C are views of nanostructure-FETs, in accordance with some embodiments. This embodiment is similar to the embodiment of FIGS. 27A-27C, except the bottom spacers 110 are omitted from beneath the p-type epitaxial source/drain regions 118S. The bottom spacers 110 may be formed in other regions besides the high-speed region 50S in the p-type region. The bottom spacers 110 may be omitted from the desired regions by masking those regions during the process of forming the bottom spacers 110. The p-type epitaxial source/drain regions 118S may be grown from the semiconductor layers 102S (in addition to from the nanostructures 66). Although not separately illustrated, it should be appreciated that the top surfaces of the semiconductor layers 102 in this embodiment may also be convex top surfaces.

Figure 31A:
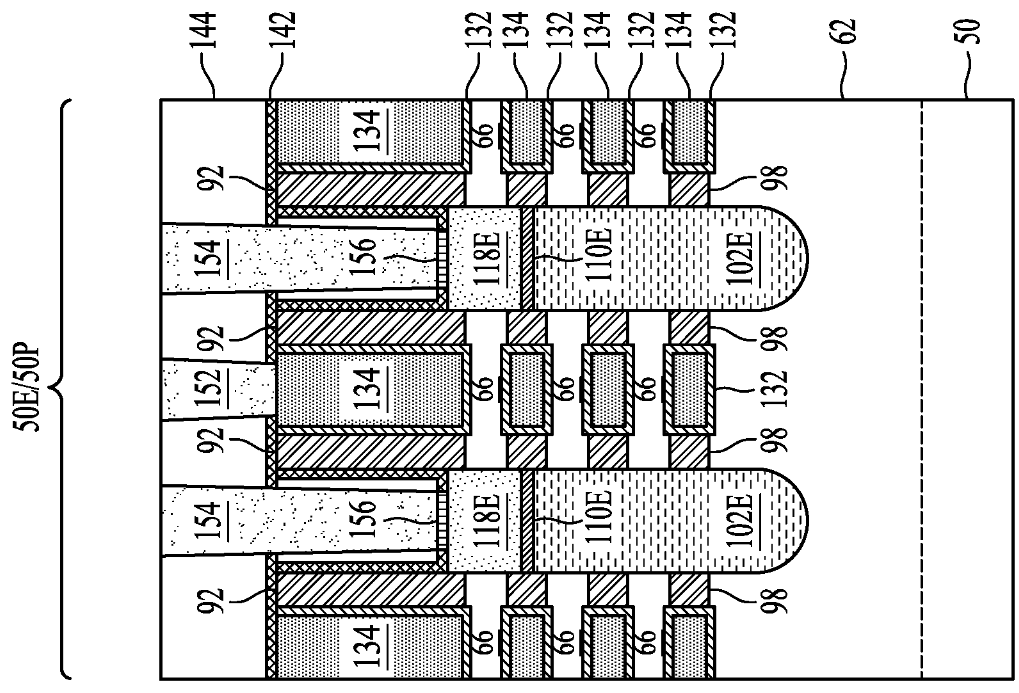
FIGS. 31A-31C are views of nanostructure-FETs, in accordance with some embodiments.
Figure 31A:
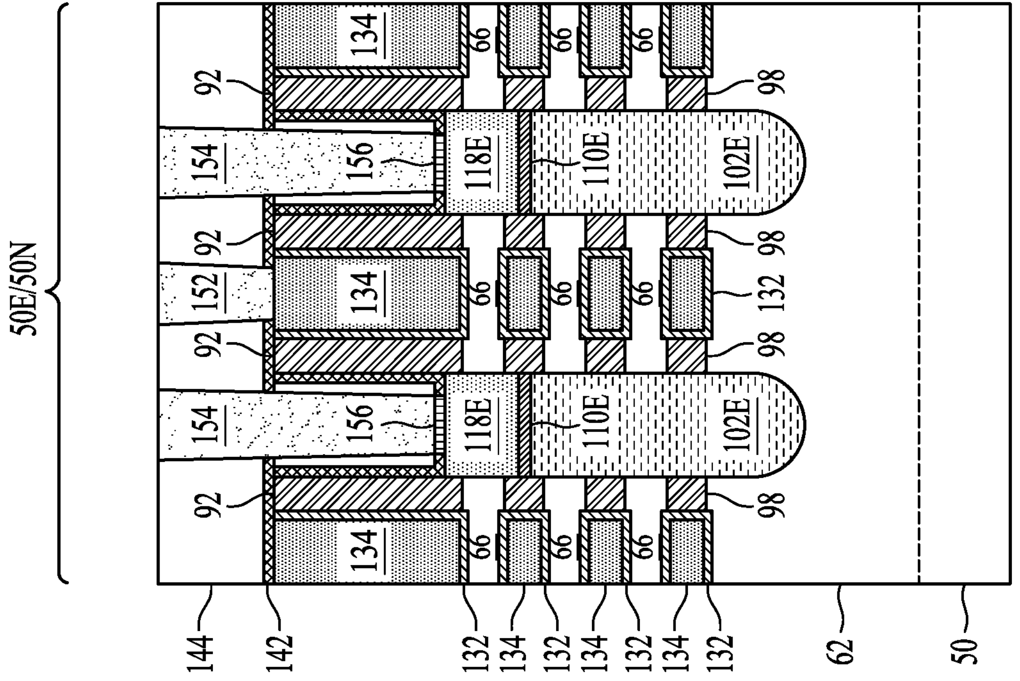
Figure 31B:
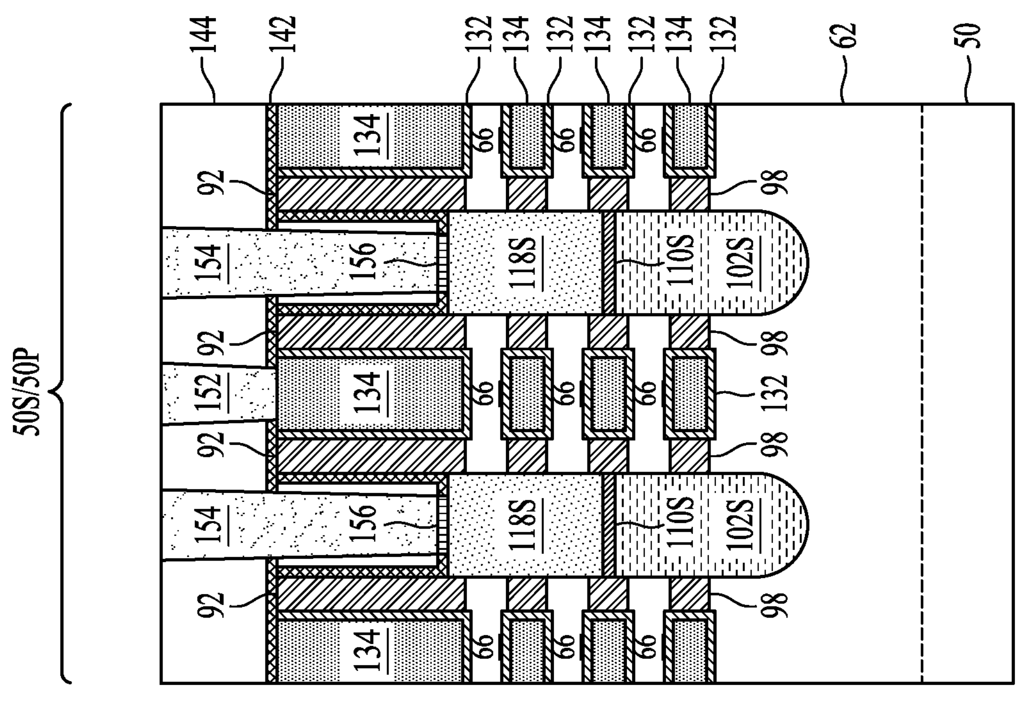
Figure 31B:
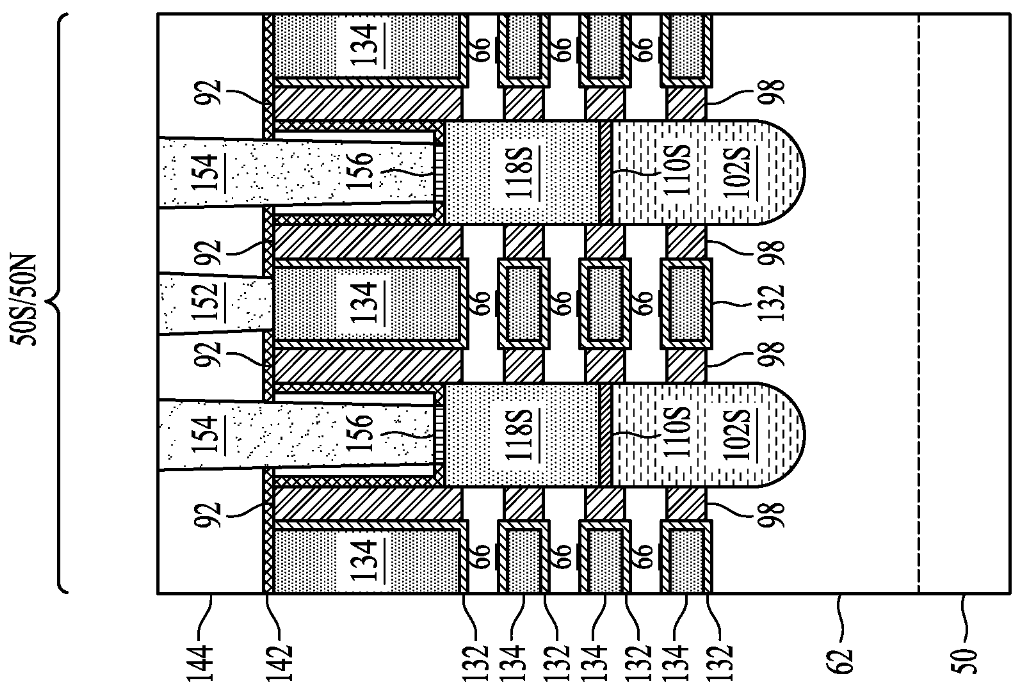
Figure 31C:
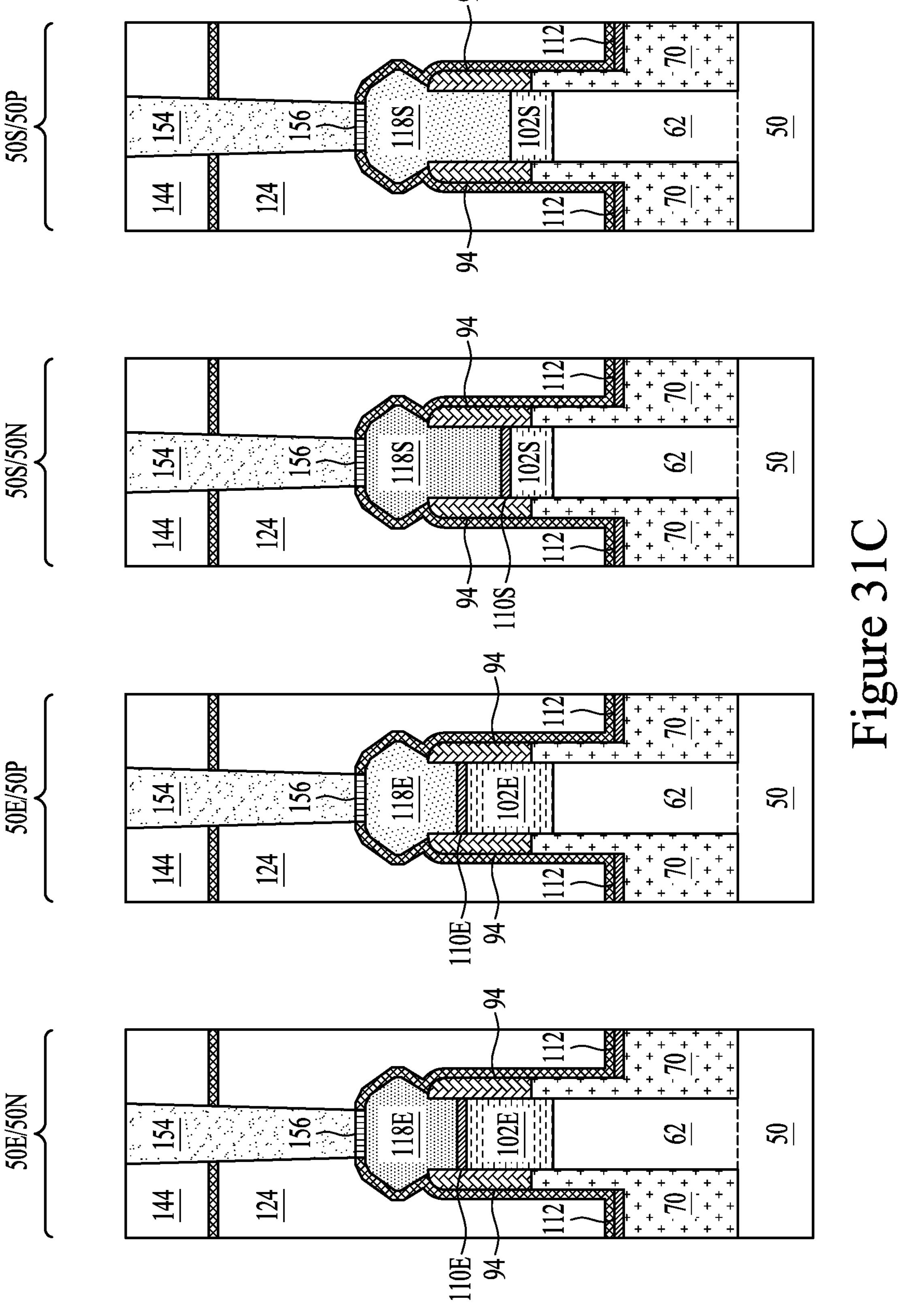

FIGS. 31A-31C are views of nanostructure-FETs, in accordance with some embodiments. This embodiment is similar to the embodiment of FIGS. 27A-27C, except the semiconductor layers 102S are also on the sidewalls of some of the nanostructures 66. The semiconductor layers 102S are formed on the sidewalls of some of the nanostructures 66 by forming semiconductor layers 102S to a greater height than in the embodiment of FIGS. 27A-27C. The semiconductor layers 102E still have a greater height than the semiconductor layers 102S, such that the epitaxial source/drain regions 118S contact the sidewalls of a greater quantity of nanostructures 66 than the epitaxial source/drain regions 118E. The semiconductor layers 102E contact a first subset of nanostructures 66 and the semiconductor layers 102S contact a second subset of nanostructures 66. Although not separately illustrated, it should be appreciated that the top surfaces of the semiconductor layers 102 in this embodiment may also be convex top surfaces.

In an embodiment, a device includes: first nanostructures; a first source/drain region adjacent the first nanostructures, a top surface of the first source/drain region extending above a top surface of the first nanostructures, the first source/drain region contacting a first quantity of the first nano structures; second nanostructures, the second nanostructures having the same dimensions as the first nanostructures; and a second source/drain region adjacent the second nanostructures, a top surface of the second source/drain region extending above a top surface of the second nanostructures, the second source/drain region contacting a second quantity of the second nanostructures, the second quantity of the second nanostructures being greater than the first quantity of the first nanostructures. In some embodiments of the device, the first source/drain region has a first height, the second source/drain region has a second height, and the second height is greater than the first height. In some embodiments of the device, the first source/drain region contacts a subset of the first nanostructures and the second source/drain region contacts each of the second nanostructures. In some embodiments of the device, the first source/drain region contacts a first subset of the first nanostructures and the second source/drain region contacts a second subset of the second nanostructures. In some embodiments, the device further includes: a first undoped semiconductor layer beneath the first source/drain region; and a second undoped semiconductor layer beneath the second source/drain region. In some embodiments of the device, the first undoped semiconductor layer has a first height, the second undoped semiconductor layer has a second height, and the first height is greater than the second height. In some embodiments of the device, the first undoped semiconductor layer contacts a subset of the first nanostructures and the second undoped semiconductor layer does not contact the second nanostructures. In some embodiments of the device, the first undoped semiconductor layer contacts a first subset of the first nanostructures and the second undoped semiconductor layer contacts a second subset of the second nano structures.

In an embodiment, a device includes: first nanostructures; a first undoped semiconductor layer contacting a first dummy region of the first nanostructures; a first spacer on the first undoped semiconductor layer; a first source/drain region on the first spacer, the first source/drain region contacting a first channel region of the first nanostructures; and a first gate structure wrapped around the first channel region and the first dummy region of the first nanostructures. In some embodiments of the device, the first undoped semiconductor layer has a convex top surface. In some embodiments of the device, the first undoped semiconductor layer has a flat top surface. In some embodiments, the device further includes: second nanostructures, the second nanostructures having the same dimensions as the first nanostructures; a second undoped semiconductor layer adjacent the second nanostructures, the second undoped semiconductor layer having a smaller height than the first undoped semiconductor layer; a second spacer on the second undoped semiconductor layer; a second source/drain region on the second spacer, the second source/drain region contacting a second channel region of the second nanostructures; and a second gate structure wrapped around the second channel region of the second nanostructures.

In an embodiment, a method includes: patterning a first source/drain recess and a second source/drain recess in first nanostructures and second nanostructures, respectively, the first nanostructures having the same dimensions as the second nanostructures; growing a first semiconductor layer and a second semiconductor layer in the first source/drain recess and the second source/drain recess, respectively; increasing a first height of the first semiconductor layer as compared to a second height of the second semiconductor layer; and growing a first source/drain region and a second source/drain region over the first semiconductor layer and the second semiconductor layer, respectively. In some embodiments of the method, the first source/drain region and the second source/drain region are grown with a faster lateral growth rate than the first semiconductor layer and the second semiconductor layer. In some embodiments of the method, the first source/drain region and the second source/drain region are grown with a slower bottom-up growth rate than the first semiconductor layer and the second semiconductor layer. In some embodiments, the method further includes: forming a first spacer and a second spacer on the first semiconductor layer and the second semiconductor layer, respectively, the first source/drain region and the second source/drain region formed on the first spacer and the second spacer, respectively. In some embodiments, the method further includes: forming a first spacer on the first semiconductor layer, the first source/drain region grown on the first spacer, the second source/drain region grown from the second semiconductor layer. In some embodiments of the method, growing the first semiconductor layer and the second semiconductor layer includes growing a semiconductor material, and increasing the first height of the first semiconductor layer includes: forming a mask covering the second semiconductor layer, the mask exposing the first semiconductor layer; growing more of the semiconductor material from the first semiconductor layer while the second semiconductor layer is covered by the mask; and removing the mask from the second semiconductor layer. In some embodiments of the method, the semiconductor material is undoped silicon. In some embodiments of the method, the semiconductor material is undoped silicon germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

patterning a first source/drain recess and a second source/drain recess in first nanostructures and second nanostructures, respectively, the first nanostructures having the same dimensions as the second nanostructures;

growing a first semiconductor layer and a second semiconductor layer in the first source/drain recess and the second source/drain recess, respectively, wherein growing the first semiconductor layer and the second semiconductor layer comprises growing a semiconductor material by performing an epitaxial growth process;

increasing a first height of the first semiconductor layer as compared to a second height of the second semiconductor layer, wherein increasing the first height of the first semiconductor layer comprises:

forming a mask covering the second semiconductor layer, the mask exposing the first semiconductor layer;

growing more of the semiconductor material from the first semiconductor layer by repeating the epitaxial growth process while the second semiconductor layer is covered by the mask; and removing the mask from the second semiconductor layer; and growing a first source/drain region and a second source/drain region over the first semiconductor layer and the second semiconductor layer, respectively.

2. The method of claim 1, wherein the first source/drain region and the second source/drain region are grown with a faster lateral growth rate than the first semiconductor layer and the second semiconductor layer.

3. The method of claim 1, wherein the first source/drain region and the second source/drain region are grown with a slower bottom-up growth rate than the first semiconductor layer and the second semiconductor layer.

4. The method of claim 1, further comprising:

forming a first spacer and a second spacer on the first semiconductor layer and the second semiconductor layer, respectively, the first source/drain region and the second source/drain region formed on the first spacer and the second spacer, respectively.

5. The method of claim 1, further comprising:

forming a first spacer on the first semiconductor layer, the first source/drain region grown on the first spacer, the second source/drain region grown from the second semiconductor layer.

6. The method of claim 1, wherein the semiconductor material is undoped silicon.

7. The method of claim 1, wherein the semiconductor material is undoped silicon germanium.

8. A method comprising:

forming first nanostructures and second nanostructures;

forming a first recess and a second recess adjacent to, respectively, the first nanostructures and the second nanostructures;

growing a first undoped semiconductor layer and a second undoped semiconductor layer in, respectively, the first recess and the second recess;

forming a first spacer and a second spacer on, respectively, the first undoped semiconductor layer and the second undoped semiconductor layer;

after forming the first spacer and the second spacer, growing a first source/drain region over the first spacer and adjacent to the first nanostructures, a top surface of the first source/drain region extending above a top surface of the first nanostructures, the first source/drain region contacting a first quantity of the first nanostructures; and after forming the first spacer and the second spacer, growing a second source/drain region over the second spacer and adjacent to the second nanostructures, a top surface of the second source/drain region extending above a top surface of the second nanostructures, the second source/drain region contacting a second quantity of the second nanostructures, the second quantity of the second nanostructures being greater than the first quantity of the first nanostructures.

9. The method of claim 8, wherein the first source/drain region is grown to a first height, the second source/drain region is grown to a second height, and the second height is greater than the first height.

10. The method of claim 8, wherein the first source/drain region contacts a subset of the first nanostructures and the second source/drain region contacts each of the second nanostructures.

11. The method of claim 8, wherein the first source/drain region contacts a first subset of the first nanostructures and the second source/drain region contacts a second subset of the second nanostructures.

12. The method of claim 8, wherein the first undoped semiconductor layer is grown to a first height, the second undoped semiconductor layer is grown to a second height, and the first height is greater than the second height.

13. The method of claim 8, wherein the first undoped semiconductor layer contacts a subset of the first nanostructures and the second undoped semiconductor layer does not contact the second nanostructures.

14. A method comprising:

patterning a source/drain recess adjacent to a plurality of nanostructures;

growing a first semiconductor layer in the source/drain recess;

increasing a height of the first semiconductor layer until the first semiconductor layer covers first sidewalls of a first subset of the nanostructures;

forming a dielectric spacer on the first semiconductor layer;

after forming the dielectric spacer, growing an epitaxial source/drain region over the dielectric spacer, the epitaxial source/drain region covering second sidewalls of a second subset of the nanostructures;

forming an inter-layer dielectric over the epitaxial source/drain region; and forming a source/drain contact through the inter-layer dielectric, the source/drain contact physically and electrically coupled to the epitaxial source/drain region.

15. The method of claim 14, wherein the second subset of the nanostructures includes more nanostructures than the first subset of the nanostructures.

16. The method of claim 14, wherein growing the first semiconductor layer comprises growing with a faster bottom-up growth rate than a lateral growth rate, and wherein growing the epitaxial source/drain region comprises growing with a faster lateral growth rate than a bottom-up growth rate.

17. The method of claim 14, wherein increasing the height of the first semiconductor layer comprises:

forming a mask covering a second semiconductor layer in a second source/drain recess;

growing additional semiconductor material of the first semiconductor layer while the second semiconductor layer is covered by the mask; and removing the mask from the second semiconductor layer.

18. The method of claim 14, wherein growing the first semiconductor layer comprises growing undoped silicon or undoped silicon germanium.

19. The method of claim 14, wherein the inter-layer dielectric is different from the dielectric spacer.

20. The method of claim 14, wherein forming the dielectric spacer comprises:

depositing a dielectric material; and etching the dielectric material to remove vertical portions of the dielectric material.

* * * * *